(12) United States Patent
Huang et al.

(10) Patent No.: US 12,408,406 B2
(45) Date of Patent: Sep. 2, 2025

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Lin-Yu Huang, Hsinchu (TW); Po-Chin Chang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 605 days.

(21) Appl. No.: 17/864,372

(22) Filed: Jul. 13, 2022

(65) Prior Publication Data
US 2024/0021673 A1    Jan. 18, 2024

(51) Int. Cl.
| H10D 64/23 | (2025.01) |
| H01L 23/522 | (2006.01) |
| H01L 23/528 | (2006.01) |
| H10D 30/01 | (2025.01) |
| H10D 30/67 | (2025.01) |
| H10D 62/10 | (2025.01) |
| H10D 62/13 | (2025.01) |

(52) U.S. Cl.
CPC ....... *H10D 64/254* (2025.01); *H01L 23/5226* (2013.01); *H01L 23/5283* (2013.01); *H10D 30/0198* (2025.01); *H10D 30/6735* (2025.01); *H10D 62/121* (2025.01); *H10D 62/151* (2025.01)

(58) Field of Classification Search
CPC .. H10D 64/254; H10D 62/121; H10D 62/151; H10D 30/6735; H10D 30/0198
See application file for complete search history.

(56) References Cited

U.S. PATENT DOCUMENTS

| 6,069,073 | A | * | 5/2000 | Kim ................. H01L 21/76856 |
| | | | | 438/643 |
| 9,209,247 | B2 | | 12/2015 | Colinge et al. |
| 9,236,267 | B2 | | 1/2016 | De et al. |
| 9,412,817 | B2 | | 8/2016 | Yang et al. |
| 9,412,828 | B2 | | 8/2016 | Ching et al. |
| 9,472,618 | B2 | | 10/2016 | Oxland |
| 9,502,265 | B1 | | 11/2016 | Jiang et al. |
| 9,520,482 | B1 | | 12/2016 | Chang et al. |
| 9,536,738 | B2 | | 1/2017 | Huang et al. |

(Continued)

*Primary Examiner* — Peter M Albrecht
(74) *Attorney, Agent, or Firm* — JCIPRNET

(57) ABSTRACT

A semiconductor device includes two source/drain features, a gate structure, a first contact plug, a second contact plug, a conductive line, and a nitride capping layer. The two source/drain features are laterally arranged to each other. The one or more channel layers connects the two source/drain features. The gate structure engages the one or more channel layers and interposes the two source/drain features. The first contact plug extends from above a first source/drain feature of the two source/drain features to the first source/drain feature. The second contact plug extends from below a second source/drain feature of the two source/drain features to the second source/drain feature. The conductive line is disposed underneath the second contact plug and electrically coupled to the second contact plug. The nitride capping layer is disposed between the second contact plug and the conductive line.

20 Claims, 46 Drawing Sheets

(56) References Cited

U.S. PATENT DOCUMENTS

| | | |
|---|---|---|
| 9,576,814 B2 | 2/2017 | Wu et al. |
| 9,608,116 B2 | 3/2017 | Ching et al. |
| 2022/0037192 A1* | 2/2022 | Yu .................. H01L 21/7682 |
| 2023/0290844 A1* | 9/2023 | Guler ................ H10D 64/256 |

* cited by examiner

SEMICONDUCTOR DEVICE AND MANUFACTURING METHOD THEREOF

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. However, such scaling has also introduced increased complexity to the semiconductor manufacturing process. Thus, the realization of continued advances in ICs and devices calls for similar advances in semiconductor manufacturing processes and technology.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
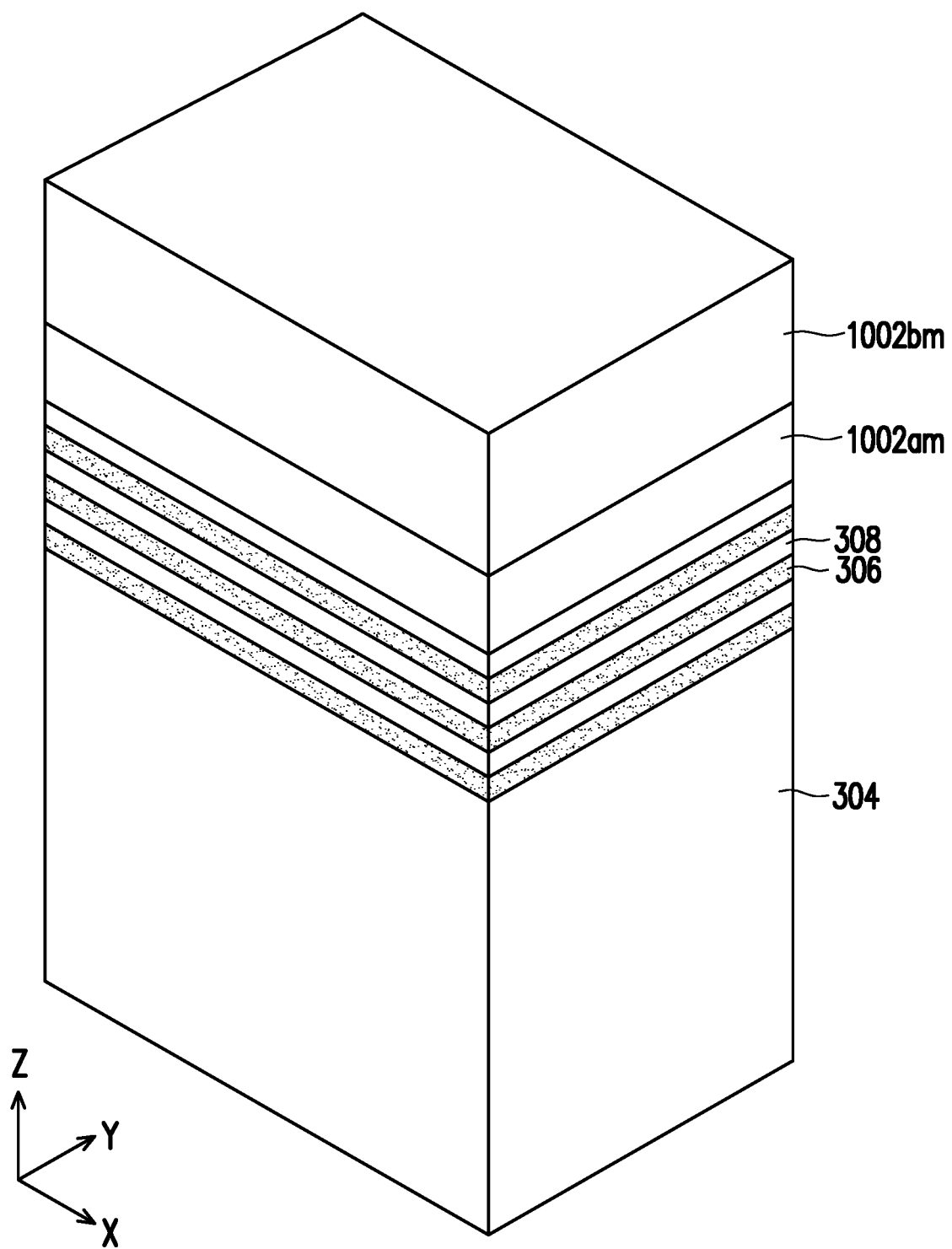
FIGS. 1-5, 6A, 7A, 8A, 9A, 10-11, 12A, 13A, 14A, 15A, 16-26, and 27A are schematic three-dimensional views of various stages in a manufacturing method of a semiconductor device in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

It should be appreciated that the following embodiment(s) of the disclosure provides applicable concepts that can be embodied in a wide variety of specific contexts. The specific embodiment(s) discussed herein is merely illustrative and is related to a semiconductor device including a capping layer of nitride between a conductive via(s) and a conductive feature(s) in a backside interconnect, and is not intended to limit the scope of the disclosure. In accordance with some embodiments, the semiconductor device includes a substrate with devices, a frontside interconnect over the substrate and electrically coupled to the devices through a first via(s), and a backside interconnect over the substrate and electrically coupled to the devices through a second via(s), where the substrate is disposed between the frontside interconnect and the backside interconnect, and a nitride capping layer is disposed between a conductive trace/line/wire of the backside interconnect and the second via(s). In the case, a diffusion (e.g., metal atoms) from the second via(s) to the conductive trace/line/wire of the backside interconnect or from the conductive trace/line/wire of the backside interconnect to the second via(s) can be avoided, thus the reliability of the semiconductor device is enhanced, thereby ensuring the performance of the semiconductor device. Sometimes, such diffusion is also referred to as "miscible".

In accordance with some embodiments, the semiconductor device is or includes a portion of a nanostructure transistor device. The semiconductor device may include a fin field-effect transistor (finFET) device, which may include a thin (vertical) fin of silicon body on a substrate, and a gate is wrapped around the fin (i.e. the channel region) providing excellent control from three sides of the channel region. The nanostructure transistor device may include a gate-all-around (GAA) transistor device or a nanowire transistor, which may include a gate structure wrapping around the perimeter of one or more nanostructures (i.e. channel regions) for improved control of channel current flow. In some embodiments, the semiconductor device is formed on bulk silicon substrates. Still, the semiconductor device may be formed on a silicon-on-insulator (SOI) substrate, a germanium-on-insulator (GOI) substrate, a silicon germanium substrate, or a Group III-V semiconductor substrate. Also, in accordance with some embodiments, the silicon substrate may include other conductive layers or other semiconductor elements, such as transistors, diodes or the like. The embodiments are not limited in this context. The semiconductor device may be included in microprocessors, memories, and/or other integrated circuits (IC). Accordingly, it is understood that additional processes may be provided before, during, and after the illustrated method, and that some other processes may only be briefly described herein. Also, the structures illustrated in the drawings are simplified for a better understanding of the concepts of the present disclosure. For example, although the figures illustrate the structure of the semiconductor device, it is understood the semiconductor device may be part of an IC that further includes a number of other devices such as resistors, capacitors, inductors, fuses, etc.

Figure 27A:
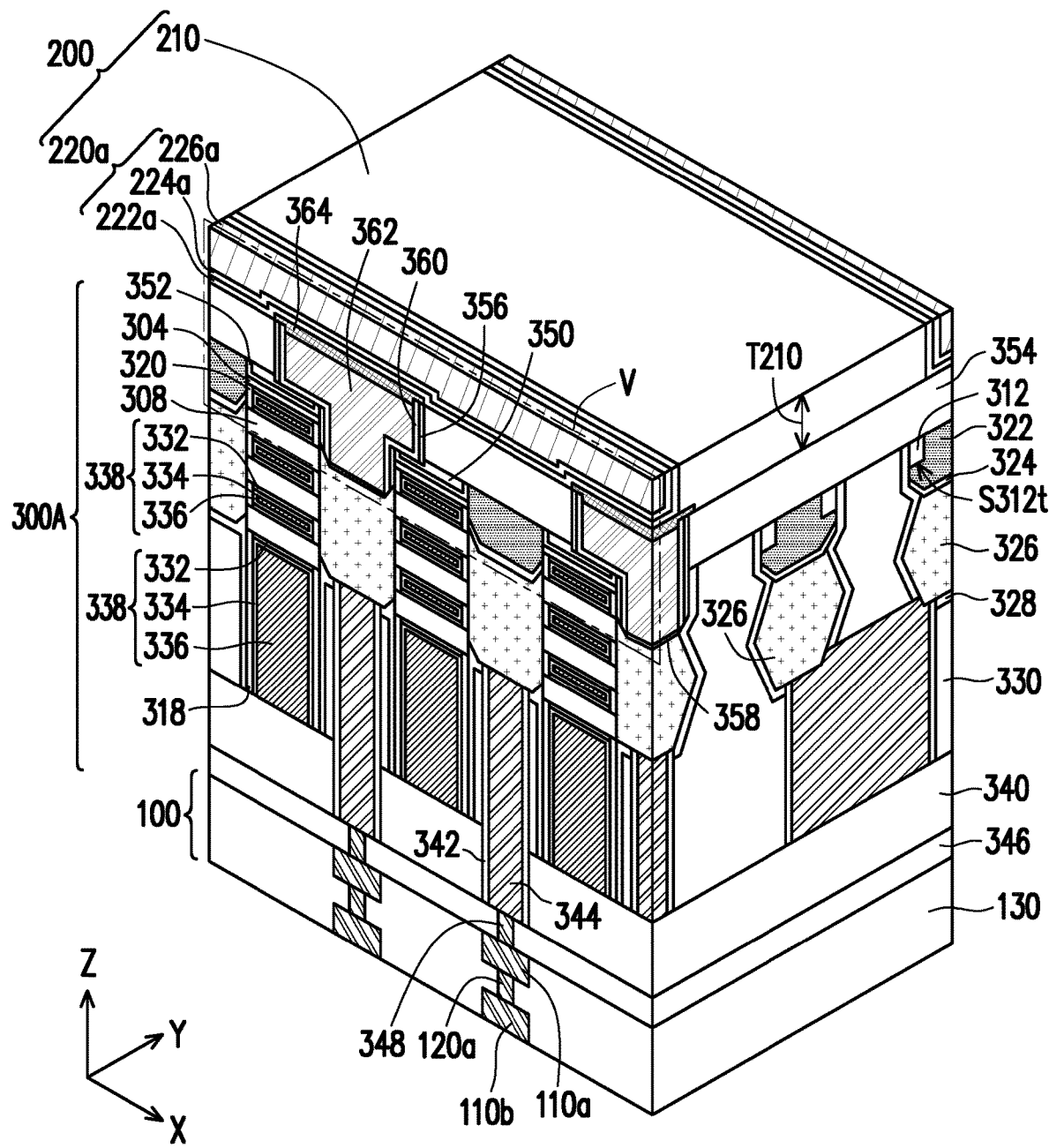
Figure 27B:
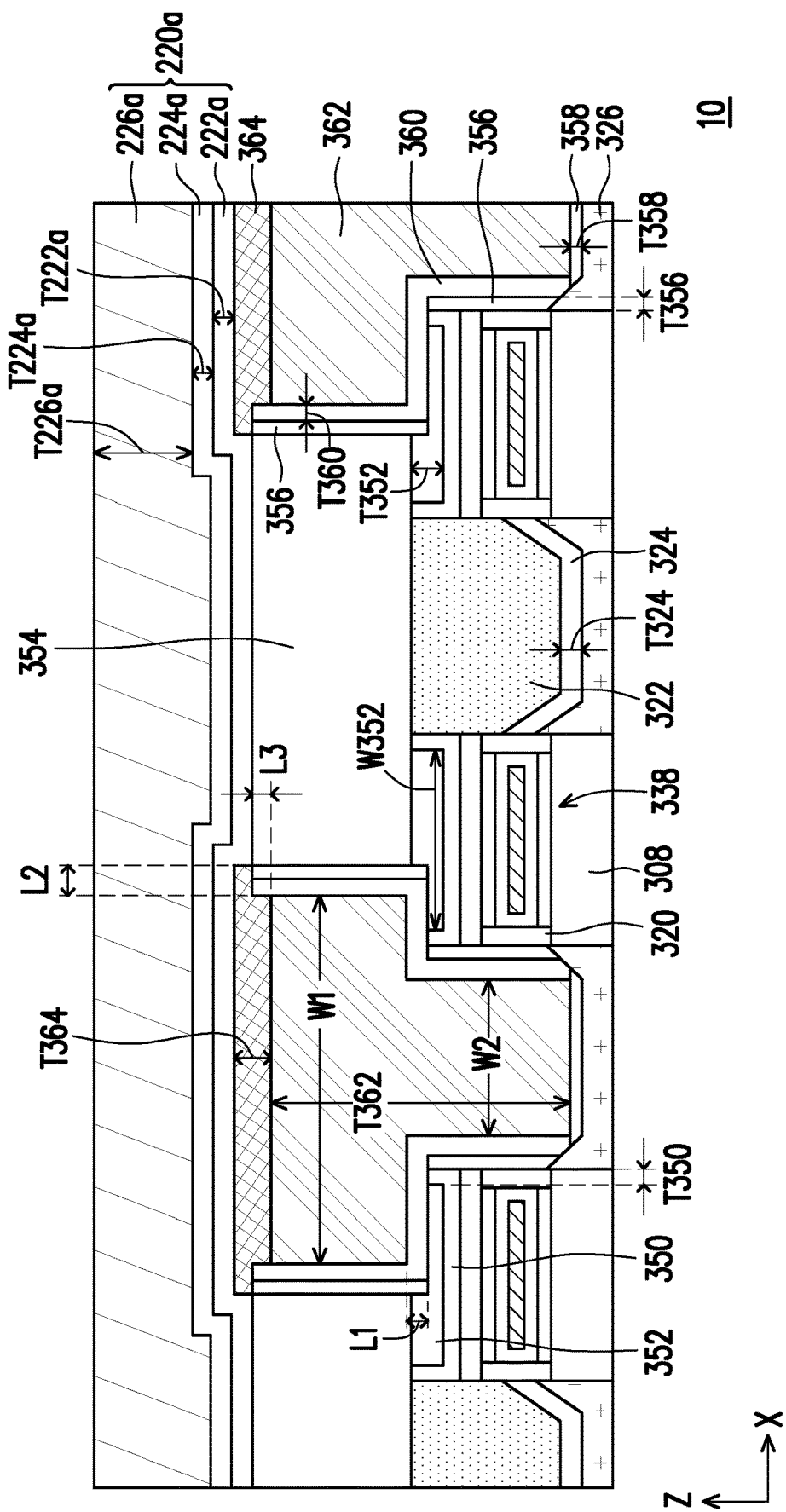
FIG. 27B is a schematic, enlarged cross-sectional view of a portion of the semiconductor device outlined in a dashed box V as shown in FIG. 27A.
Figure 28A:
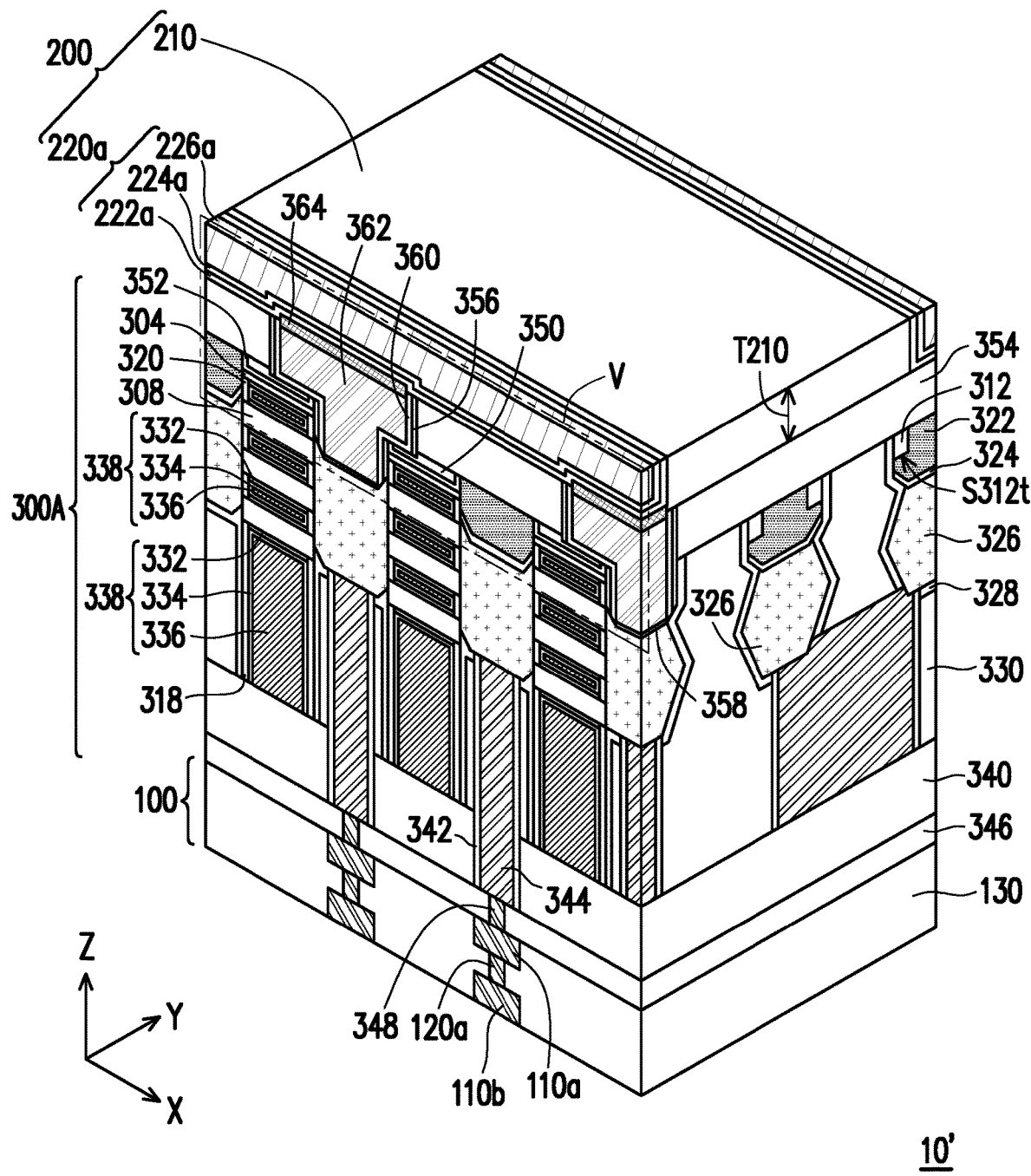
FIG. 28A is a schematic three-dimensional view of a semiconductor device in accordance with some embodiments of the disclosure.
Figure 28B:
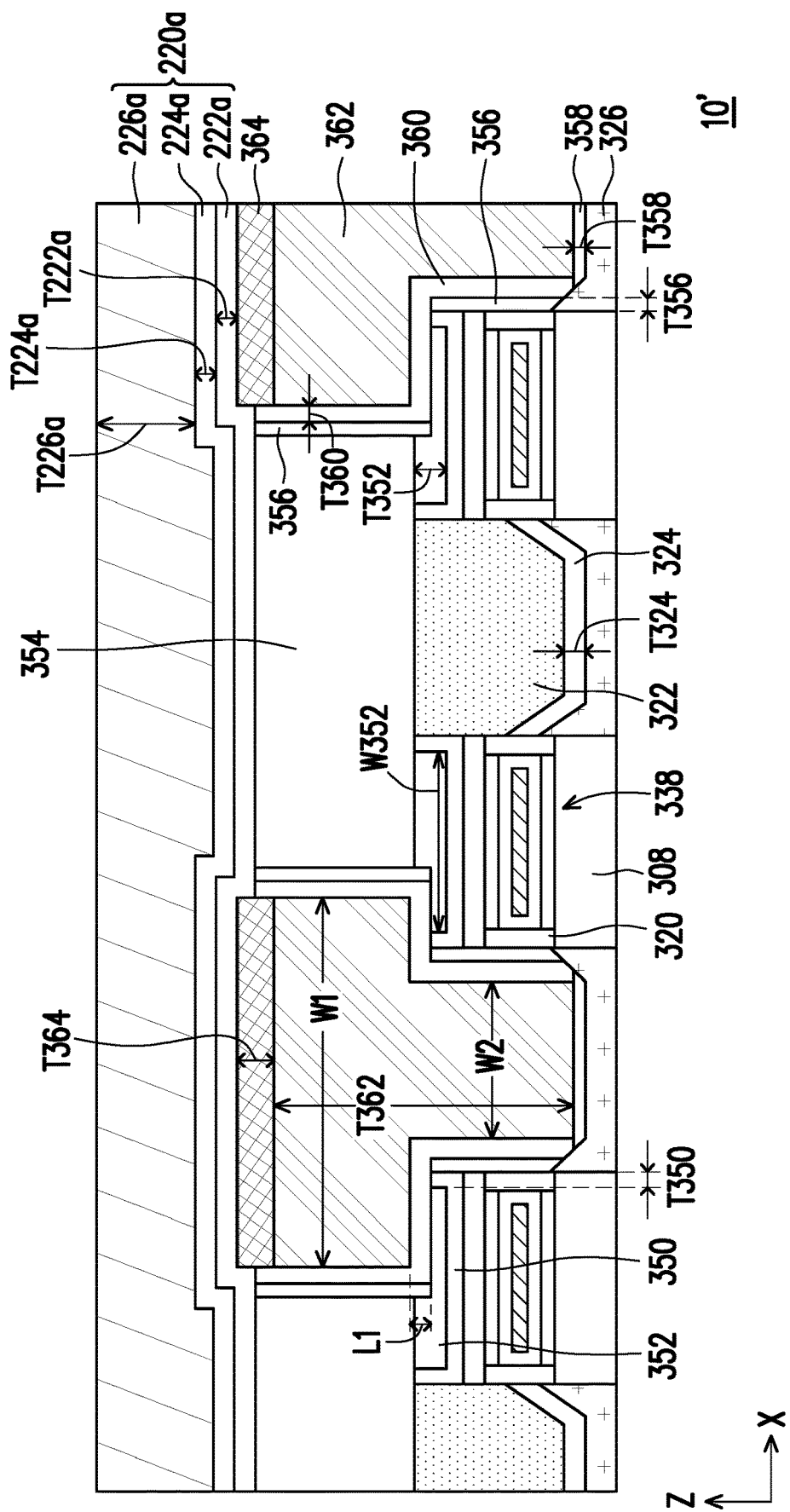
FIG. 28B is a schematic, enlarged cross-sectional view of a portion of the semiconductor device outlined in a dashed box V as shown in FIG. 28A.

FIGS. 1-5, 6A, 7A, 8A, 9A, 10-11, 12A, 13A, 14A, 15A, 16-26, and 27A are schematic three-dimensional views of various stages in a manufacturing method of a semiconductor device 10 in accordance with some embodiments of the disclosure. FIGS. 6B, 7B, 8B, 9B, 12B, 13B, 14B, and 15B are schematic, enlarged cross-sectional views of a portion of the semiconductor device 10 outlined in a dashed box W shown in FIGS. 6A, 7A, 8A, 9A, 12A, 13A, 14A, and 15A, respectively. FIG. 27B is a schematic, enlarged cross-sectional view of a portion of the semiconductor device 10 outlined in a dashed box V as shown in FIG. 27A. FIG. 28A is a schematic three-dimensional view of a semiconductor device 10' in accordance with some embodiments of the disclosure. FIG. 28B is a schematic, enlarged cross-sectional view of a portion of the semiconductor device 10' outlined in a dashed box V as shown in FIG. 28A. In embodiments, the manufacturing method is part of a wafer level packaging process. It is to be noted that the process steps described herein cover a portion of the manufacturing processes used to fabricate the semiconductor device involving a capping layer of nitride between a conductive via(s) and a conductive feature(s) in a backside interconnect. The embodiments are intended to provide further explanations but are not used to limit the scope of the disclosure. In the disclosure, it should be appreciated that the illustration of components throughout all figures is schematic and is not in scale. The elements similar to or substantially the same as the elements described previously will use the same reference numbers, and certain details or descriptions (e.g., the materials, formation processes, positioning configurations, electrical connections, etc.) of the same elements would not be repeated. For clarity of illustrations, in the drawings are illustrated the orthogonal axes (X, Y and Z) of the Cartesian coordinate system according to which the views are oriented; however, the disclosure is not specifically limited thereto.

Referring to FIG. 1, in some embodiments, a stack of first and second semiconductor layers (306 and 308) may be formed on a semiconductor substrate 304. In some embodiments, the semiconductor substrate 304 includes a crystalline silicon substrate or a bulk silicon substrate (e.g., wafer). In some embodiments, the semiconductor substrate 304 is made of a suitable elemental semiconductor (e.g., germanium), a suitable compound semiconductor (e.g., gallium arsenide, silicon carbide, indium arsenide, or indium phosphide), a suitable alloy semiconductor (e.g., silicon germanium carbide, gallium arsenic phosphide, or gallium indium phosphide), and/or the like. In some embodiments, the semiconductor substrate 304 includes a SOI substrate. The semiconductor substrate 304 may include various doped regions (not individually shown) doped with p-type or n-type dopants, where the doped regions may be configured for an n-type FET, or alternatively, configured for a p-type FET.

The first semiconductor layers 306 and the second semiconductor layers 308 may be alternately stacked upon one another (e.g., along a direction Z) to form a stacking structure over the semiconductor substrate 304. The first semiconductor layers 306 may be considered sacrificial layers in the sense that they are removed in the subsequent process. In some embodiments, the bottommost one of the first semiconductor layers 306 is formed on the semiconductor substrate 304, with the remaining second and first semiconductor layers (308 and 304) alternately stacked on top. However, either the first semiconductor layer 306 or the second semiconductor layer 308 may be the bottommost layer (or the layer most proximate from the semiconductor substrate 304), and either the first semiconductor layer 306 or the second semiconductor layer 308 may be the topmost layer (or the layer most distanced to the semiconductor substrate 304). The disclosure is not limited by the number of stacked semiconductor layers. A thickness (not labeled) of the respective first semiconductor layer 306 measured along the direction Z may be in a range of about 4 nm to about 12 nm. A thickness (not labeled) of the respective second semiconductor layer 308 measured along the direction Z may be in a range of about 6 nm to about 15 nm. Although other values of the thicknesses of the first and second semiconductor layers 306 and 308 are possible depending on product and process requirements.

The first semiconductor layers 306 and the second semiconductor layers 308 may have different materials (or compositions) that may provide for different oxidation rates and/or different etch selectivity between the layers. For example, the second semiconductor layers 308 are formed of the same material as the semiconductor substrate 304, while the first semiconductor layers 304 may be formed of a different material which may be selectively removed with respect to the material of the semiconductor substrate 304 and the second semiconductor layers 308. In some embodiments, the material of the first semiconductor layers 306 includes silicon germanium (SiGe). For example, germanium (Ge) may include about 15% to 35% of the first semiconductor layers 306 of SiGe in molar ratio. In some embodiments, the second semiconductor layers 308 include silicon (Si), where each of the second semiconductor layers 308 may be undoped or substantially dopant-free. A method for forming the first and second semiconductor layers 306 and 308 may include epitaxial processes. The second semiconductor layers 308 may be considered as semiconductor channel layers or channel regions. That is, the second semiconductor layers 308 may be referred to as channels of the semiconductor device 10. However, the disclosure is not limited thereto, and other suitable material, or other combinations of materials for which selective etching is possible are contemplated within the scope of the disclosure.

Continued on FIG. 1, for example, a hard mask material 1002am and a hard mask material 1002bm are subsequently formed on the stacking structure. For example, the hard mask material 1002am is stacked on the stacking structure, and the hard mask material 1002bm is stacked on the hard mask material 1002am. The hard mask material 1002am and the hard mask material 1002bm are individually extended along a X-Y plane to cover up the stacking structure. The hard mask material 1002am and the hard mask material 1002bm may be made of different insulating materials. For instance, materials of the hard mask material 1002am and the hard mask material 1002bm may be selected from a group consisting of silicon oxide, silicon nitride, silicon oxynitride and the like. A method for forming the hard mask material 1002am and the hard mask material 1002bm may include one or more deposition processes, such as chemical vapor deposition (CVD) process or the like.

Figure 2:
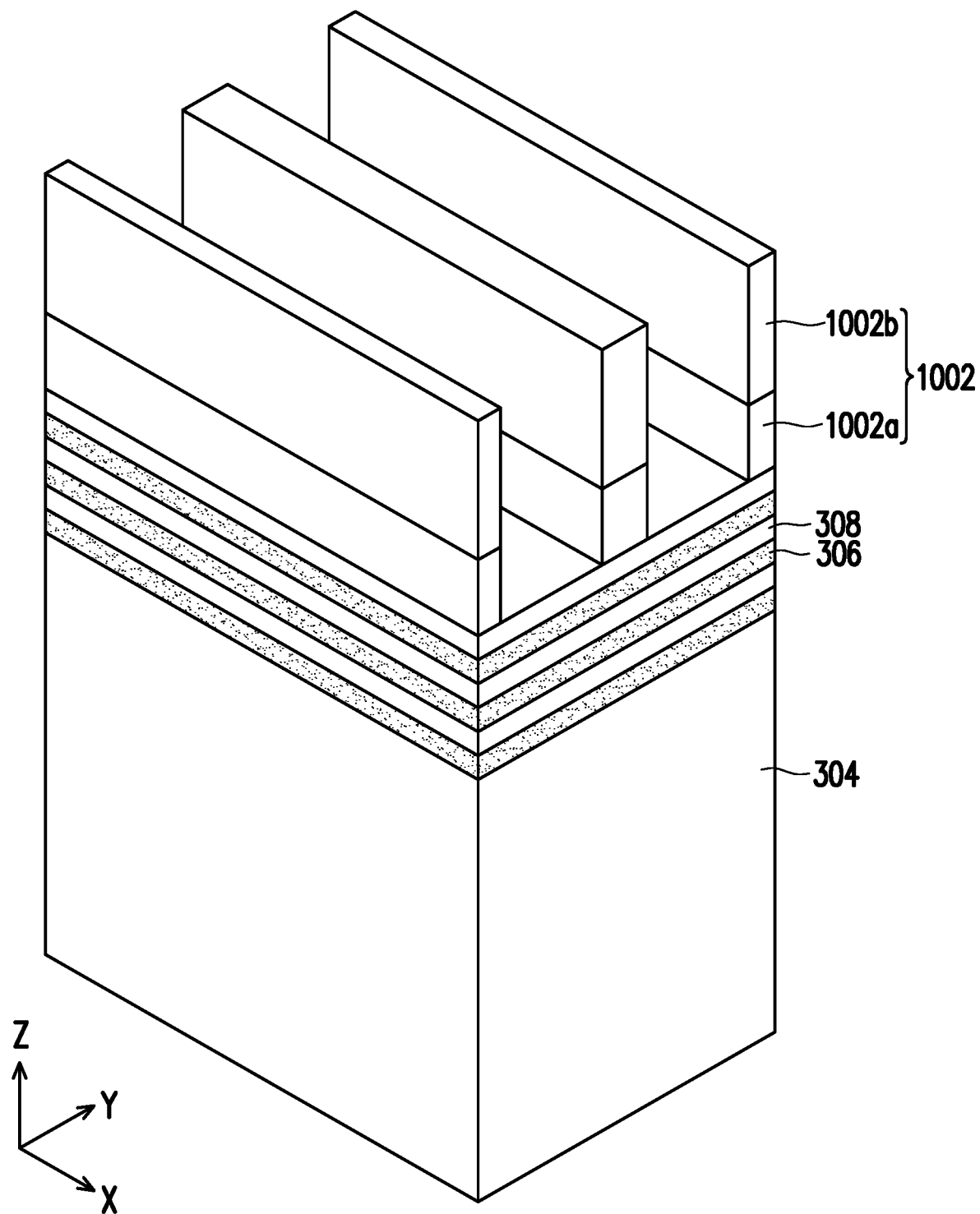

Referring to FIG. 2, in some embodiments, the hard mask material 1002am and the hard mask material 1002bm are patterned to form a plurality of hard mask structures 1002 over the stacking structure. In addition, in some embodiments, each hard mask structure 1002 includes a hard mask layer 1002a and a hard mask layer 1002b formed over the hard mask layer 1002a. In some embodiments, the hard mask structures 1002 are arranged along a direction Y, and are extending along a direction X. A method for forming of hard mask structures 1002 may include a self-aligned multiple patterning process (e.g., a self-aligned double patterning (SADP) process or a self-aligned quadruple patterning (SAQP) process). However, the disclosure is not limited thereto; alternatively, the hard mask structures 1002 each may be a single layer structure or include a structure having more than one sublayer by adjusting the number of hard mask materials formed over the stacking structure. The hard mask structures 1002 may be referred to as hard masks or hard mask patterns.

Figure 3:
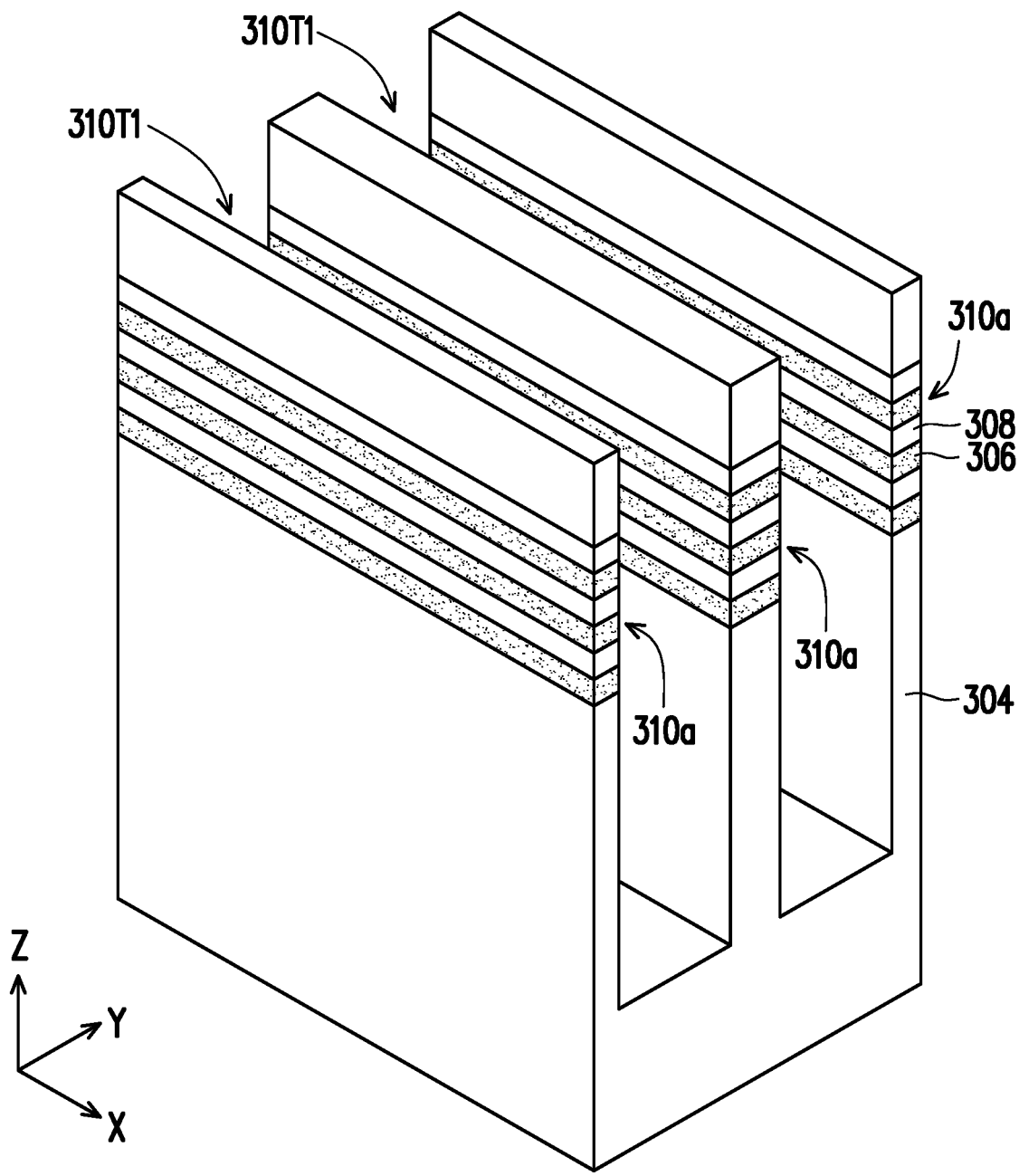

Referring to FIG. 2 and FIG. 3, in some embodiments, a portion of the stack of first and second semiconductor layers (306 and 308) and a portion of the semiconductor substrate 304 may be removed to form first trenches (or openings) 310T1, thereby defining a fin structure 310a between two adjacent first trenches 310T1. The first trenches 310T1 may arranged along the direction Y and continuously extend along the direction X. For example, the critical dimension (or the width measured along the direction Y, not labeled) of the respective first trench 310T1 is in a range of about 25 nm to about 80 nm. The critical dimension (or the width measured along the direction Y, not labeled) of the fin structures 310a may be in a range of about 5 nm to about 40 nm, depending on the N-type fin or the P-type fin. For example, the critical dimension of the N-type fin may be in a range of about 20 nm to about 40 nm, and the critical dimension of the P-type fin may be in a range of about 5 nm to about 20 nm. Although other values of the critical dimensions are possible depending on various device regions. It should be noted that the disclosure is not limited by the numbers of fin structures 310a depicted in FIG. 3, which may be adjusted according to the requirements of the circuit design. When multiple fin structures 310a are formed, the first trenches 310T1 may be disposed between any adjacent ones of the fin structures 310a.

The fin structures 310a may be formed by patterning portions of the stack of first and second semiconductor layers (306 and 308) and the semiconductor substrate 304. A method for patterning the stacking structure to form the fin structures 310a may include an etching process, such as an anisotropic etching process. The etching process may be stopped when a top portion of the semiconductor substrate 304 may be removed during the etching process as shown in FIG. 3, or be stopped when an illustrated top surface of the semiconductor substrate 304 may be exposed. For example, the hard mask structures 1002 are disposed over the topmost one of the second semiconductor layers 308 (also called the top semiconductor layer 308 herein). The hard mask structures 1002 are used as shadow masks to pattern exposed portions of the stack of first and second semiconductor layers (306 and 308) and the semiconductor substrate 304. In those embodiments where the hard mask structures 1002 are arranged along the direction Y and extending along the direction X, the formed fin structures 310a are also arranged along the direction Y and extending along the direction X. The fin structures 310a may be formed by etching trenches (310T1) in the stack of first and second semiconductor layers (306 and 308) and the semiconductor substrate 304. In some embodiments, the first trenches 310T1 may be parallel strips (when viewed from the top) elongated along the direction X and distributed along the direction Y.

The hard mask structures 1002 may be optionally removed after forming the fin structures 310a. In some embodiments, the hard mask layers 1002b of the hard mask structures 1002 are removed during the etching process (as shown in FIG. 3), and the hard mask layers 1002a of the hard mask structures 1002 are then removed after forming the fin structures 310a (see FIG. 4) to expose surfaces S310t (e.g., illustrated top surfaces of topmost one of the second semiconductor layers 308) of the fin structures 310a. However, the disclosure is not limited thereto; alternatively, the hard mask structures 1002 may be removed during the subsequently-performed etching process.

Figure 4:
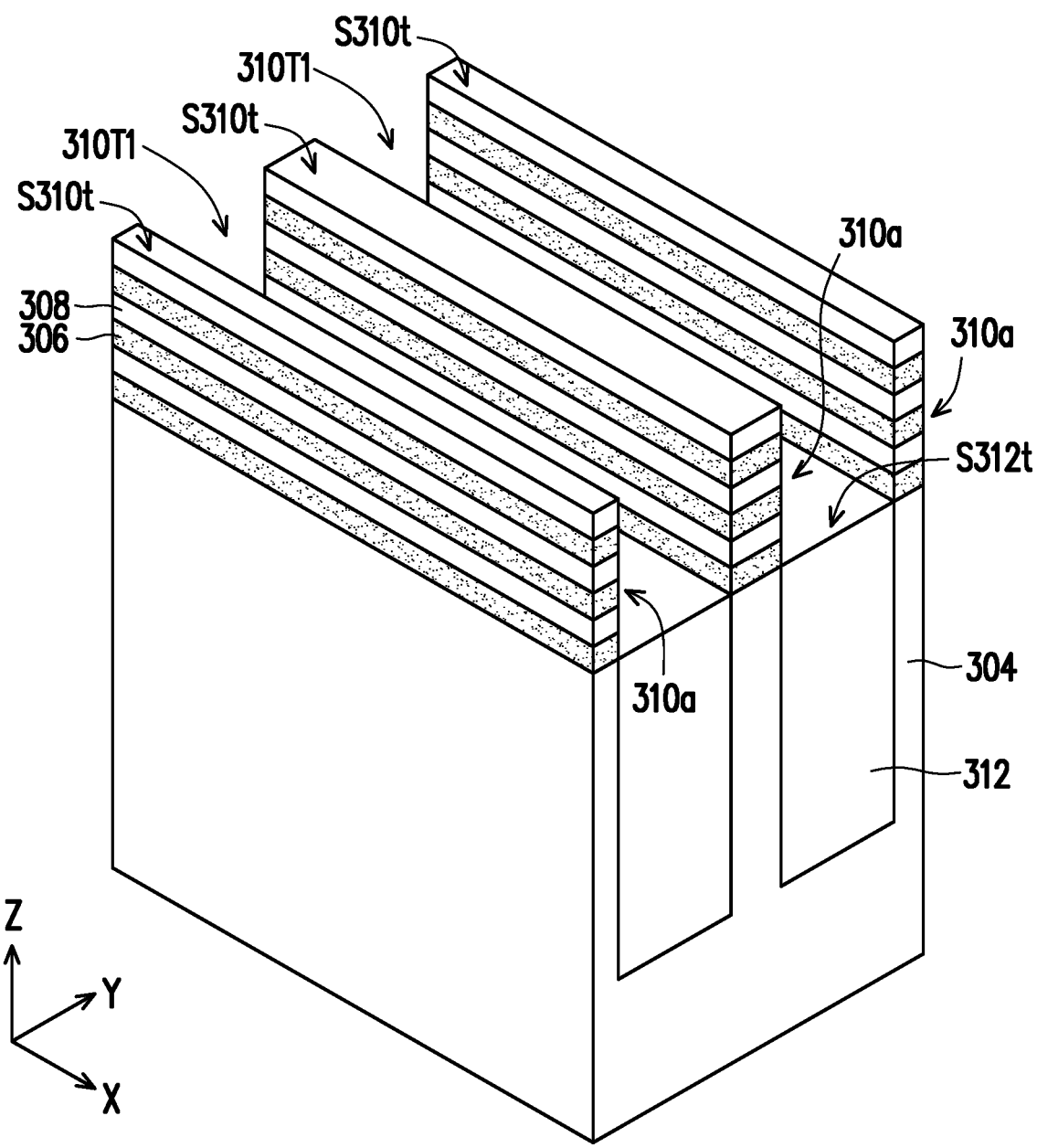

Referring to FIG. 4, in some embodiments, a plurality of isolation structures 312 (sometimes referred to as shallow trench isolation (STI) structures) may be formed in lower portions of the first trenches 310T1. For example, the isolation structures 312 extend at opposing sides of a lower portion of the semiconductor substrate 304. In some embodiments where multiple fin structures 310a are provided, each of the isolation structures 312 is disposed between adjacent ones of the fin structures 310a and covers respectively a sidewall of a lower portion of the respective fin structure 310a. The isolation structures 312 may be formed of an insulation material (e.g., an oxide, a Si-based oxide (e.g., SiOC, SiOCN, or the like), a nitride, the like, any other suitable material, or combinations thereof) which may electrically isolate neighboring fin structures 310a from each other.

In some embodiments, the isolation structures 312 are formed by initially depositing a layer of insulation material (not shown) in the respective first trench 310T1 and recessing the layer of insulation material using an acceptable etching process, such as one that is selective to the material of the isolation structures 312. For example, a dry etching process is performed to form the isolation structures 312 having a relatively smooth top surfaces S312t. In alternative embodiments, a wet etching process is used. Or alternatively, a dry etching process and wet etching process are both used. The isolation structures 312 may be recessed to where illustrated top surfaces S312t of the isolation structures 312 are substantially coplanar to (e.g., leveled with) the illustrated top surface (not labeled) of the semiconductor substrate 304, and the fin structures 310a protrudes from the neighboring isolation structures 312. The illustrated top surfaces S312t of the isolation structures 312 may be a flat surface, a curved (e.g., convex or concave) surface, or combinations thereof, depending on the etching process. Alternatively, the isolation structures 312 may be recessed to where illustrated top surfaces S312t of the isolation structures 312 are below the illustrated top surface of the semiconductor substrate 304, and the fin structures 310a protrudes from the neighboring isolation structures 312.

Figure 5:
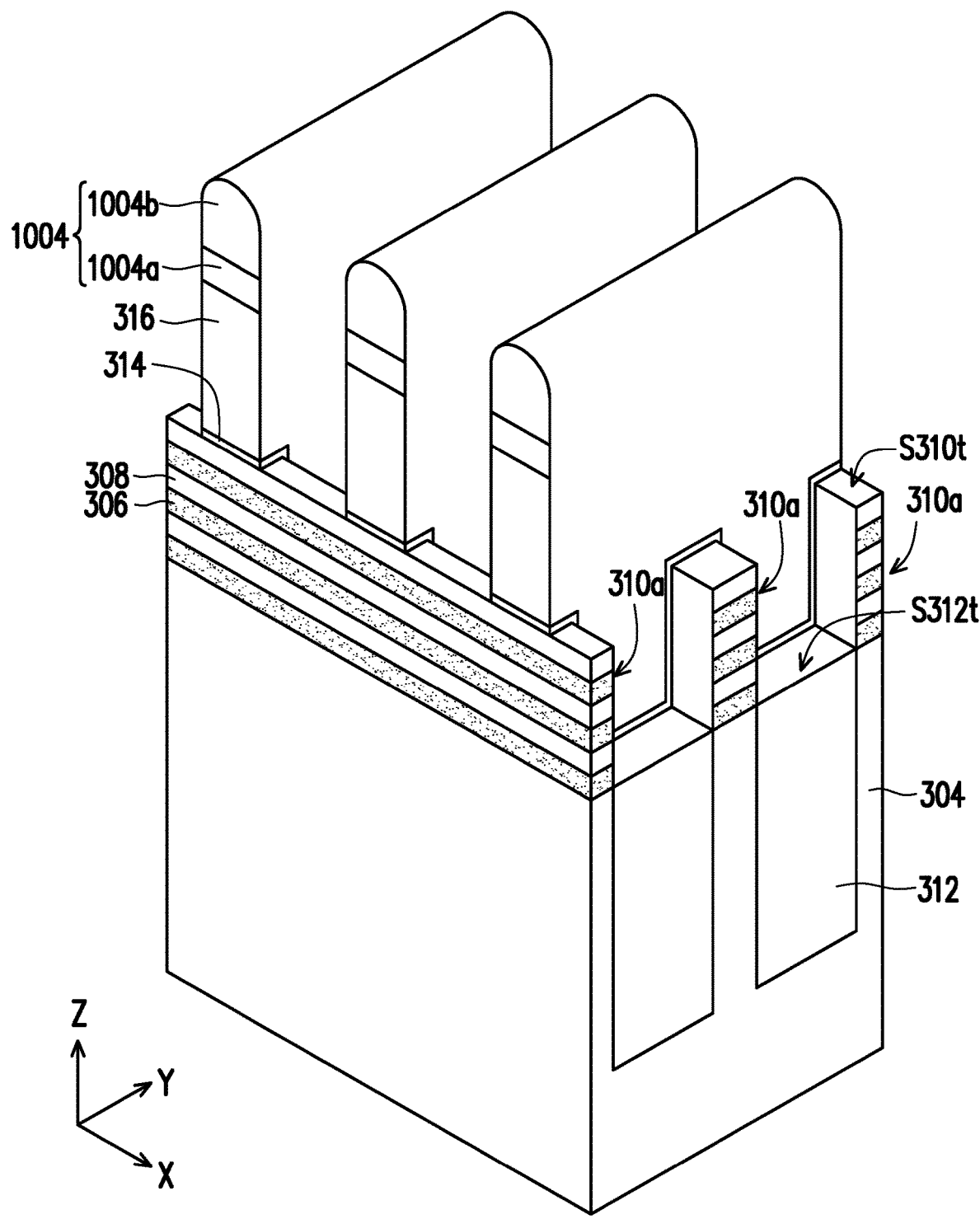

Referring to FIG. 5, in some embodiments, sacrificial gate structures are formed on the semiconductor substrate 304. An extending direction of the sacrificial gate structures is intersected with an extending direction of the fin structures 310a, and the sacrificial gate structures cover portions of the fin structures 310a that are overlapped with the sacrificial gate structures. In those embodiments where the fin structures 310a are arranged along the direction Y and extending along the direction X, the sacrificial gate structures may be arranged along the direction X and extend along the direction Y. The sacrificial gate structures may be referred to as dummy gate structures. In some embodiments, each sacrificial gate structure includes a dummy gate dielectric layer 314 and a dummy gate electrode 316. The dummy gate dielectric layer 314 is conformally formed on the semiconductor substrate 304 and the fin structures 310a, whereas the dummy gate electrode 316 covers the dummy gate dielectric layer 314, and are formed to a height greater than a height of the fin structures 310a. In some embodiments, each sacrificial gate structure further includes a capping structure 1004 lying on the dummy gate electrode 316. The capping structure 1004 may include a capping layer 1004a and a capping layer 1004b lying above the capping layer 1004a. In some embodiments, the capping layer 1004b has rounded top corners.

Materials of the dummy gate dielectric layer 314, the capping layer 1004a and the capping layer 1004b may respectively include silicon oxide, silicon nitride, silicon oxynitride, the like or combinations thereof, whereas a material of the dummy gate electrode 316 may include polysilicon. In addition, methods for forming the dummy gate dielectric layer 314, the capping layers 1004a, 1004b and the dummy gate electrode 316 may respectively include a deposition process, such as a CVD process or an atomic layer deposition (ALD) process. In each sacrificial gate structure, the dummy gate dielectric layer 314 may be referred to as a dummy gate dielectric strip, a sacrificial gate dielectric layer or a sacrificial gate dielectric strip, the dummy gate electrode 316 may be referred to as dummy gate electrode strip 316, a sacrificial gate electrode 316 or a sacrificial gate electrode strip 316, the capping structure 1004 may be referred to as a patterned mask structure, and the capping layers 1004a, 1004b may be referred to as mask strips or mask patterns.

Figure 6A:
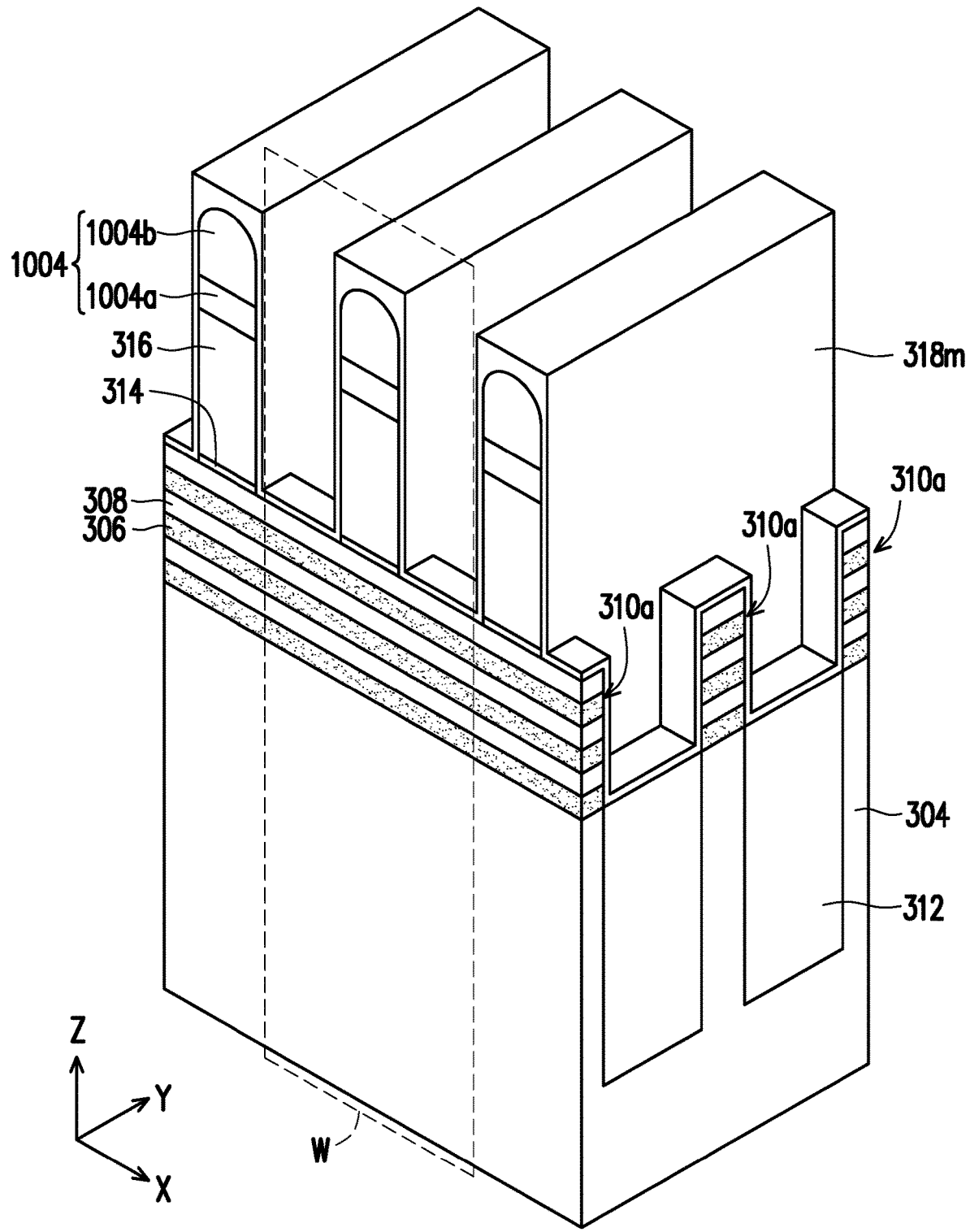
Figure 6B:
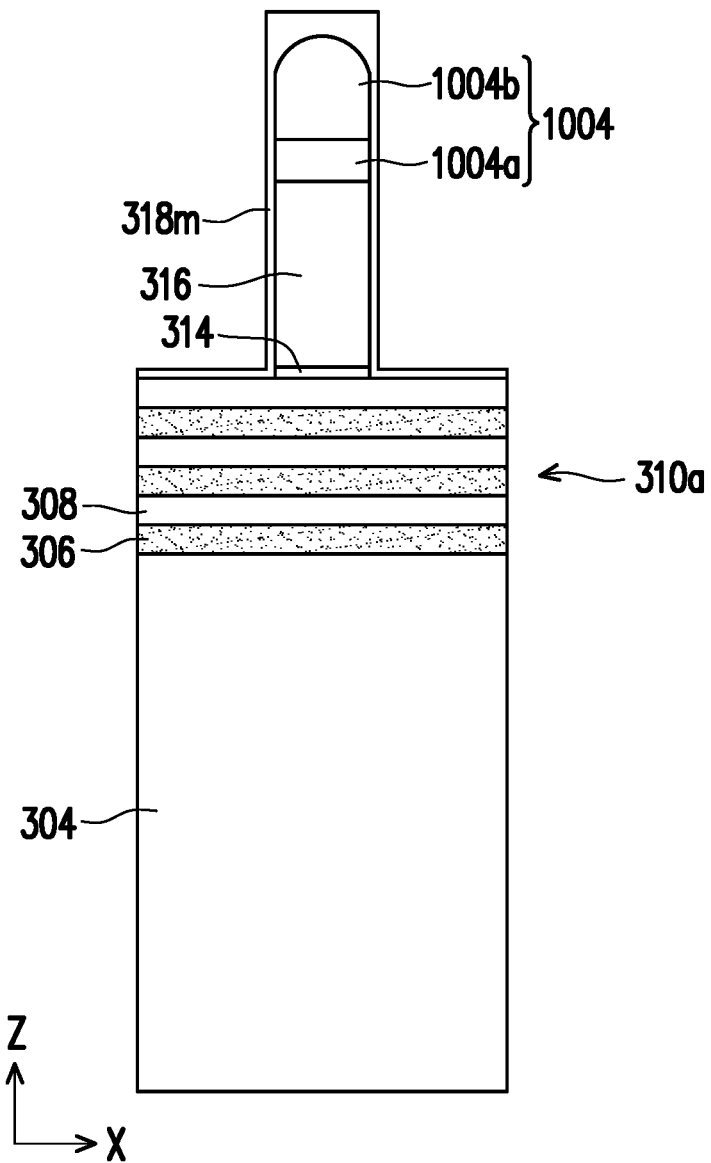
FIGS. 6B, 7B, 8B, 9B, 12B, 13B, 14B, and 15B are schematic, enlarged cross-sectional views of a portion of the semiconductor device outlined in a dashed box W as shown in FIGS. 6A, 7A, 8A, 9A, 12A, 13A, 14A, and 15A, respectively.

Referring to FIG. 6A and FIG. 6B, in some embodiments, a gate spacer layer 318m is formed on the structure depicted in FIG. 5. In some embodiments, the gate spacer layer 318m is globally formed over the structure as shown in FIG. 5. In these embodiments, the semiconductor substrate 304, the fin structures 310a and the sacrificial gate structures (including the dummy gate dielectric layer 314, the dummy gate electrode 316, and the capping structure 1004) may be conformally covered by the gate spacer layer 318m. A material of the gate spacer layer 318m may include silicon oxide, silicon nitride, silicon carbide, silicon oxynitride (SiON), silicon carbide nitride (SiCN), silicon oxycarbide (SiOC), silicon carbide oxynitride (SiOCN), the like or combinations thereof, and a method for forming the gate spacer layer 318m may include a deposition process, such as a CVD process or an ALD process.

Figure 7A:
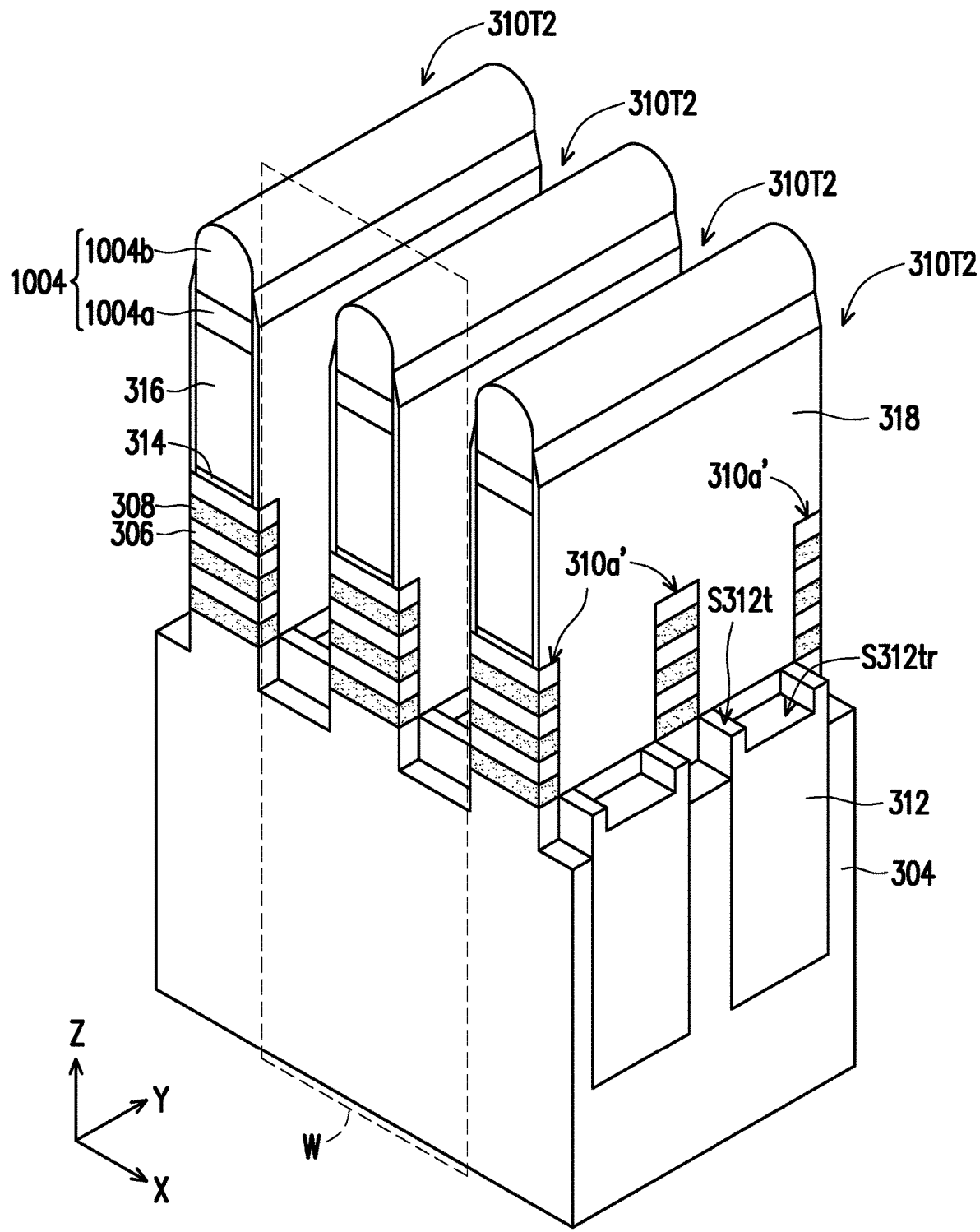
Figure 7B:
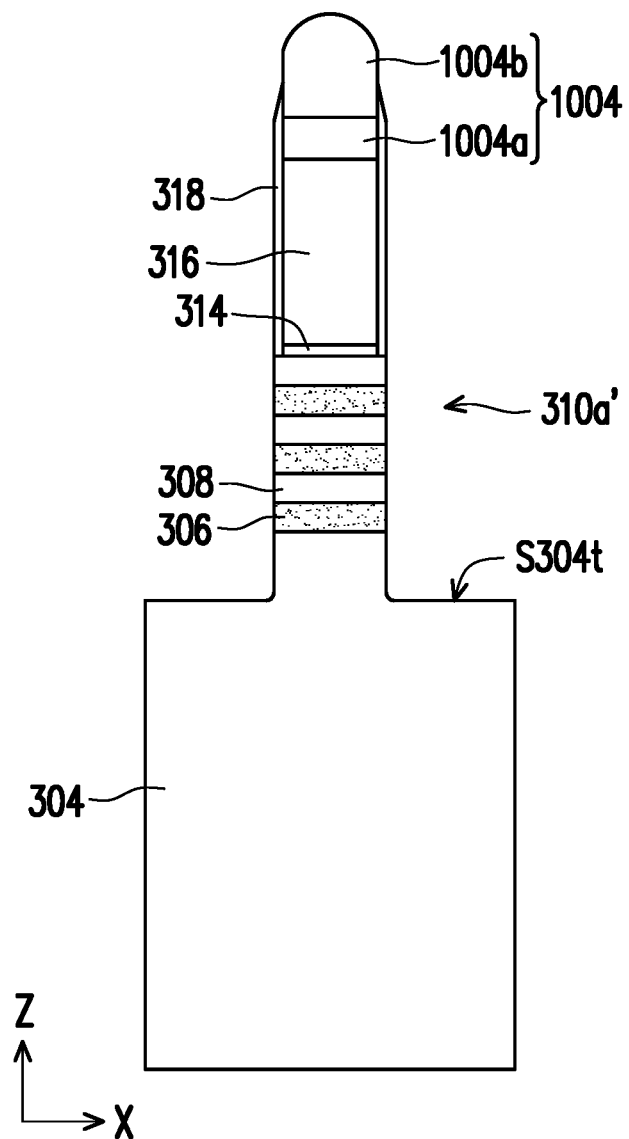

Referring to FIG. 7A and FIG. 7B, in some embodiments, some portions of the fin structures 310a and the gate spacer layer 318m are removed to form second trenches (or openings) 310T2, thereby forming fin structure 310a' and gate spacers 318. As shown in FIG. 7A, one sacrificial gate structure and a respective underlying one fin structure 310a' are located between two adjacent second trenches 310T2, for example. The second trenches 310T2 may arranged along the direction X and continuously extend along the direction Y. For example, the critical dimension (or the width measured along the direction X, not labeled) of the respective second trench 310T2 is in a range of about 25 nm to about 80 nm. The critical dimension (or the width measured along the direction X, not labeled) of the fin structures 310a' may be in a range of about 5 nm to about 40 nm, depending on the N-type fin or the P-type fin. For example, the critical dimension of the N-type fin may be in a range of about 20 nm to about 40 nm, and the critical dimension of the P-type fin may be in a range of about 5 nm to about 20 nm. Although other values of the critical dimensions are possible depending on various device regions. It should be noted that the disclosure is not limited by the numbers of fin structures 310a' depicted in FIG. 7A, which may be adjusted according to the requirements of the circuit design. When multiple fin structures 310a' are formed, the second trenches 310T2 may be disposed between any adjacent ones of the fin structures 310a'. In some embodiments, the first trenches 310T1 and the second trenches 310T2 are spatially communicated to each other.

In some embodiments, portions of the gate spacer layer 318m covering the sidewalls of the sacrificial gate structures are remained, and the rest of the sacrificial gate structures are removed, so to form the gate spacers 318. On the other hand, portions of the fin structures 310a not covered by the sacrificial gate structures 316 of the sacrificial gate structures and the gate spacers 318 are accordingly exposed. Thereafter, the exposed portions of the fin structures 310a are removed, whereas portions of the fin structures 310a covered by the gate spacers 318 and the sacrificial gate structures are remained to form the fin structure 310a'. For example, the sacrificial gate structures and the gate spacers 318 together are used as shadow masks to pattern the exposed portions of the fin structures 310a. In some embodiments, a method for removing these portions of the fin structures 310a and gate spacer layer 318m may include one or more etching processes, such as one or more anisotropic etching processes. The etching process may be stopped when a top portion of the semiconductor substrate 304 may be removed during the etching process(es) as shown in FIG. 7A and FIG. 7B, where illustrated top surfaces S314t of the semiconductor substrate 304 exposed by the second trenches 310T2 is lower than the illustrated top surfaces of the semiconductor substrate 304 within the fin structures 310a. In the case, portions of the isolation structures 312 are removed during the etching process(es), where illustrated top surface S312t of the edges of the isolation structures 312 are above illustrated top surfaces S312tr of portions of the isolation structures 312 surrounding by (e.g., enclosed by) the edges of the isolation structures 312 and illustrated top surface of the semiconductor substrate 304 exposed by the second trenches 310T2. That is, the isolation structures 312 may include a non-planar top surface. Alternatively, the etching process may be stopped at illustrated top surfaces S314t of the semiconductor substrate 304 exposed by the second trenches 310T2 without removing semiconductor substrate 304. That is, in the alternative embodiment, the isolation structures 312 may include a planar top surface. The disclosure is not limited thereto.

In addition, the illustrated top surface of the semiconductor substrate 304 exposed by the second trenches 310T2 may be lower than the illustrated top surfaces S312tr of portions of the isolation structures 312 surrounding by (e.g., enclosed by) the edges of the isolation structures 312, as shown in FIG. 7A. However, the disclosure is not limited thereto, alternatively, the illustrated top surface of the semiconductor substrate 304 exposed by the second trenches 310T2 may be substantially coplanar to (e.g., leveled with) the illustrated top surfaces S312tr of portions of the isolation structures 312 surrounding by (e.g., enclosed by) the edges of the isolation structures 312.

Figure 8A:
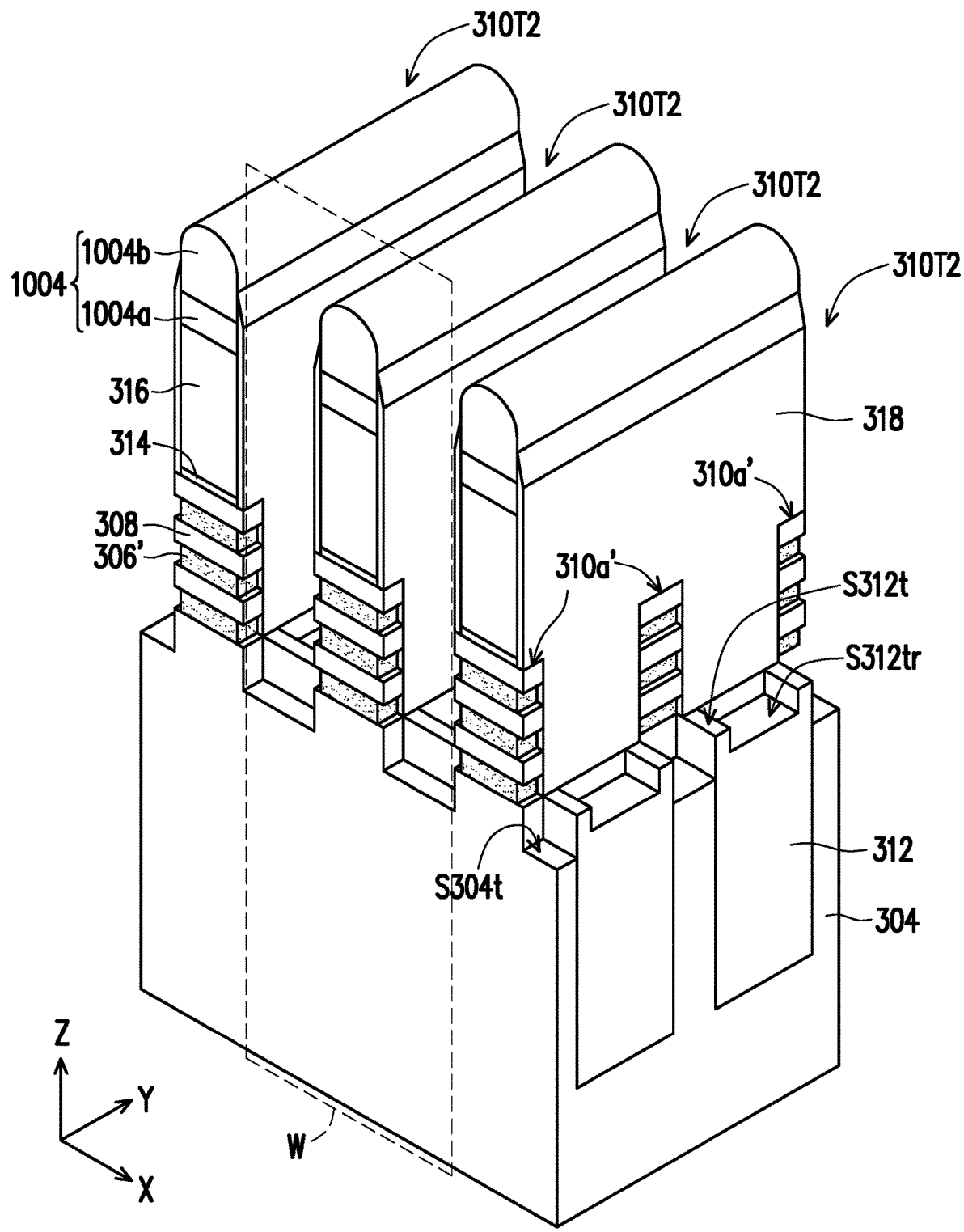
Figure 8B:
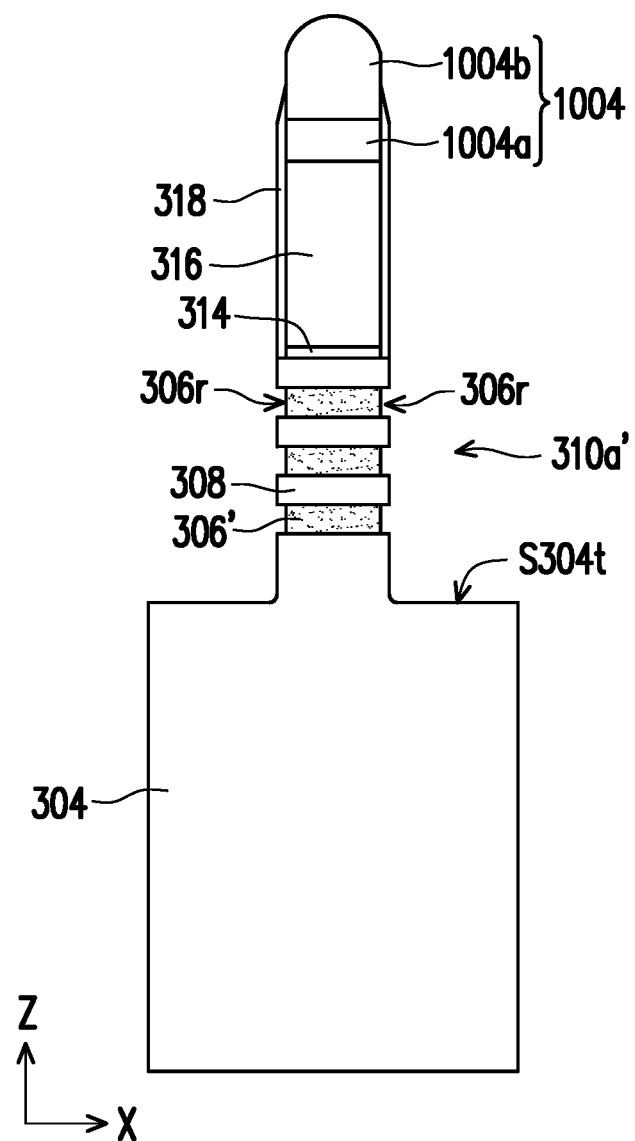

Referring to FIG. 8A and FIG. 8B, in some embodiments, the first semiconductor layers 306 are laterally recessed from the second semiconductor layers 308 and the gate spacers 318 to form first semiconductor layer 306' and a plurality of recesses 306r at opposite sides of the first semiconductor layer 306'. In the case, the recesses 306r are formed at sidewalls of the remained portions of the fin structures 310a'. In some embodiments, the first semiconductor layers 306 are laterally recessed from the second semiconductor layers 308 and the gate spacers 318 by a distance ranging from 0.5 nm to 1 nm. A method for lateral recessing the first semiconductor layers 306 may include an etching process, such as an isotropic etching process. By properly selecting etchants for the etching process and/or by properly selecting the materials of the first semiconductor layers 306 and the second semiconductor layers 308, the first semiconductor layers 306 can be etched without consuming the second semiconductor layers 308 and other components in the current structure. In some embodiments, the recesses 306r, the first trenches 310T1 and the second trenches 310T2 are spatially communicated to each other. The recesses 306r may be referred to as lateral recesses.

Figure 9A:
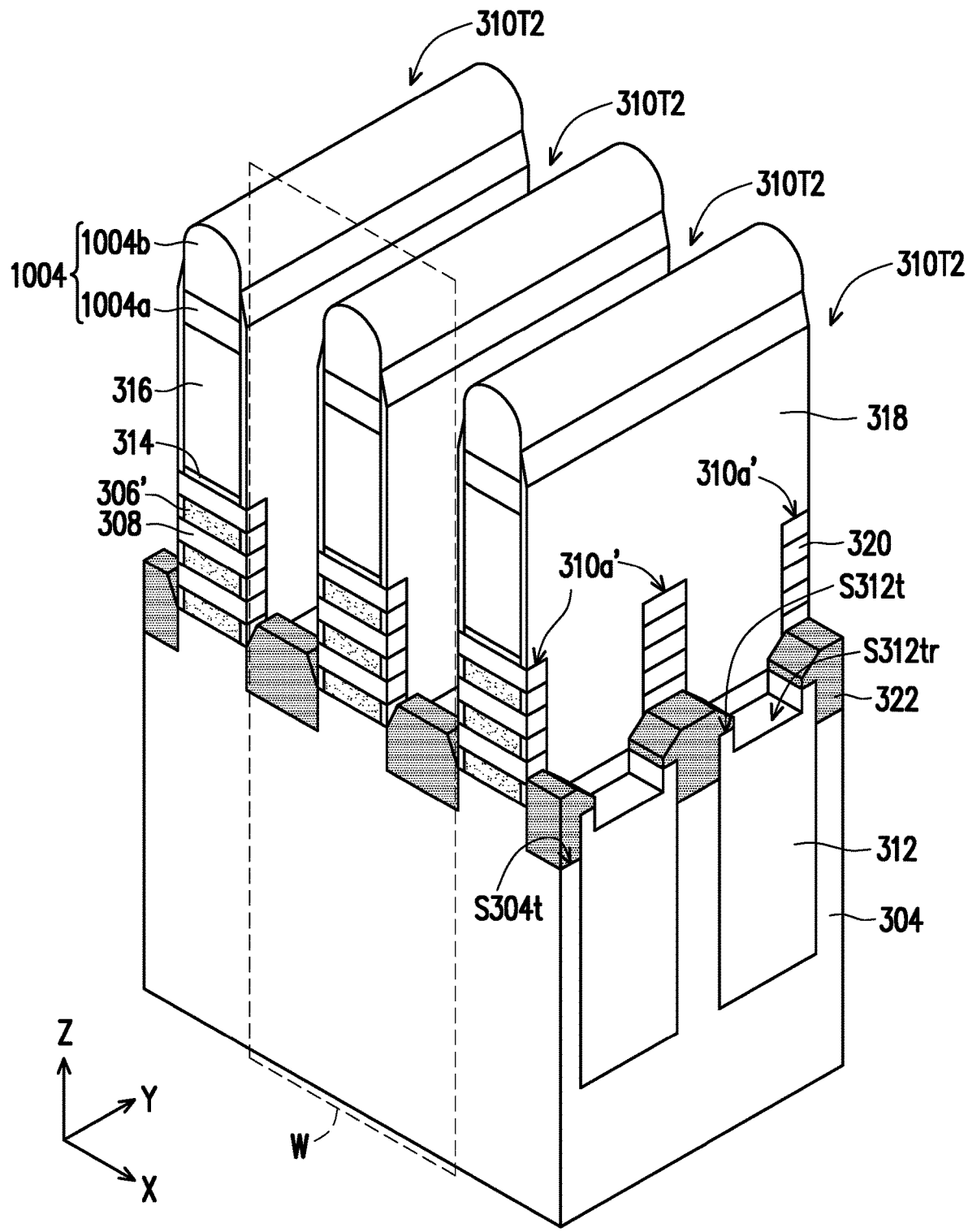
Figure 9B:
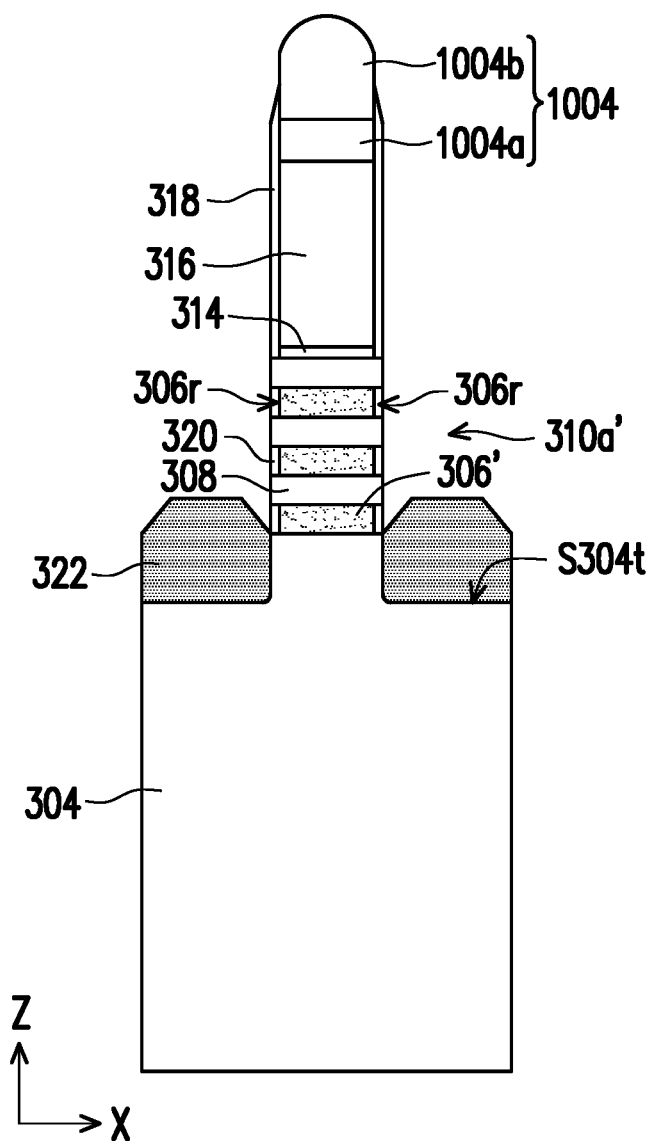

Referring to FIG. 9A and FIG. 9B, in some embodiments, a plurality of inner spacers 320 are formed in the recesses 306r by filling an insulating material in the recesses 306r at the sidewalls of the fin structures 310a'. In some embodiments, exposed sidewalls of the inner spacers 320 are substantially coplanar with sidewalls of the second semiconductor layers 308 and sidewalls of the gate spacers 318. In alternative embodiments, the exposed sidewalls of the inner spacers 320 are dented from the sidewalls of the second semiconductor layers 308 and the sidewalls of the gate spacers 318. A material of the insulating material for forming the inner spacers 320 may include silicon oxide, silicon nitride, silicon carbide, silicon carbide nitride, silicon oxide carbide, silicon carbide oxynitride, or other suitable dielectric materials or combinations thereof. A method for forming the inner spacers 320 may include initially forming a material layer globally covering the structure shown in FIG. 8A and FIG. 8B, and then removing portions of this blanket layer outside the recesses 306r. In this way, the remained portions of this material layer form the inner spacers 320. In some embodiments, the material layer is formed by using a deposition process (e.g., a CVD process or an ALD process), and the portions of the material layer are removed by using an etching process (e.g., an anisotropic etching process). The inner spacers 320 may be formed from the same or different material as the gate spacers 318.

Figure 10:
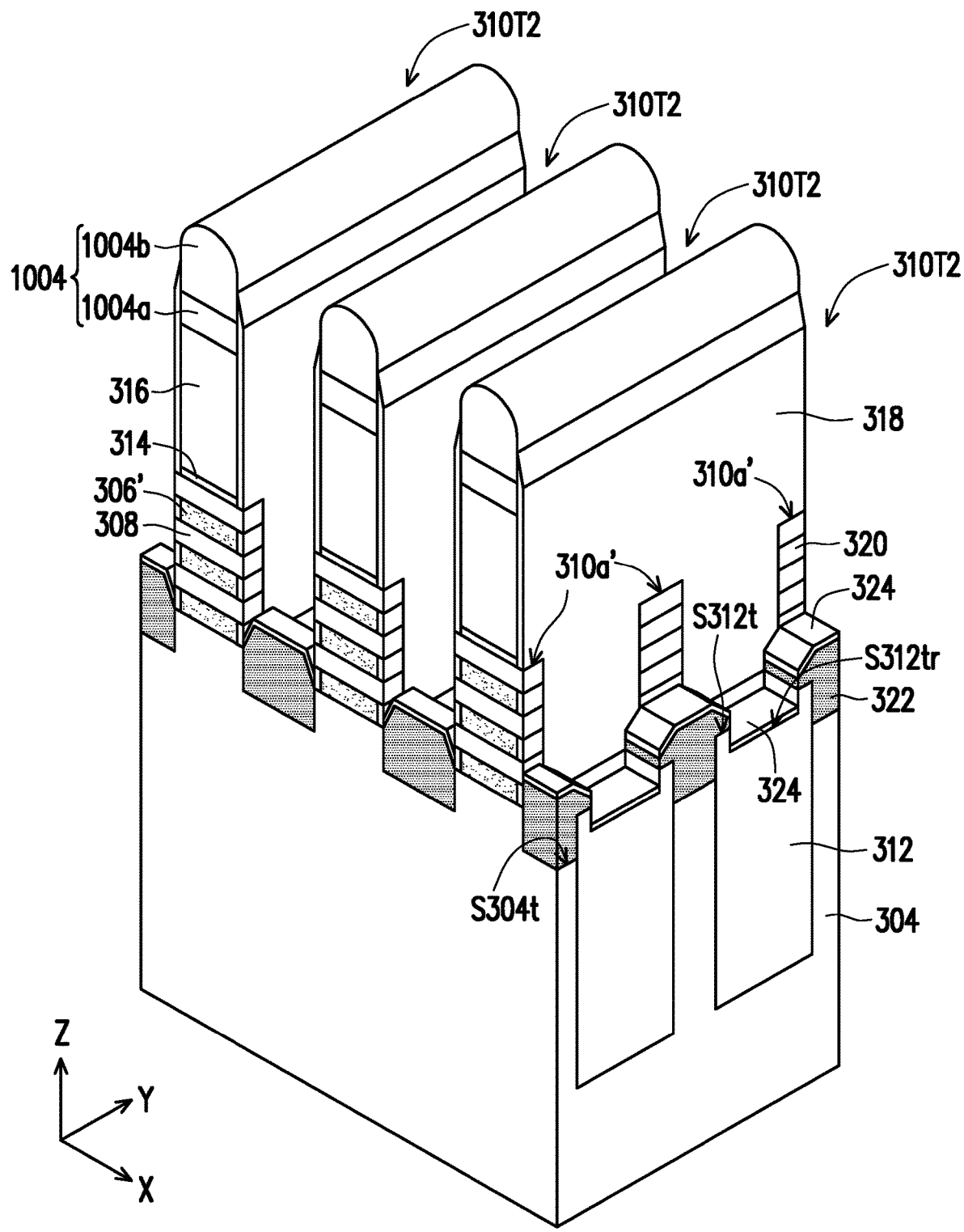

Referring to FIG. 10, in some embodiments, a plurality of first layers 322 are formed over the semiconductor substrate 304 between the lower portion of the fin structures 310a'. In some embodiments, one first layer 322 is disposed between two adjacent isolation structures 312 arranged along the direction Y. On the other hand, each of the fin structures 310a' is disposed between two adjacent first layers 322 along the direction X. For example, as shown in FIG. 10, the first layers 322 are disposed on (e.g., in physical contact with) the illustrated top surface of the semiconductor substrate 304 exposed by the second trenches 310T2 and further extend onto the illustrated top surfaces S312t of the isolation structures 312. In some embodiments, illustrated top surfaces of the first layers 322 are substantially coplanar to (e.g., leveled with) the illustrated top surface of the semiconductor substrate 304 within the fin structures 310a'. Alternatively, the illustrated top surfaces of the first layers 322 may be above the illustrated top surface of the semiconductor substrate 304 within the fin structures 310a'. The first layers 322 may be referred to as a bottom-up epitaxial layers (epi layers) or strained elements. The first layers 322 may include SiGe, which may be epitaxial-grown with a p-type dopant for straining a p-type FET. The p-type dopant includes boron or BF 2, and the strained materials 214 may be epitaxial-grown by LPCVD process with in-situ doping. Alternatively, the first layers 322 may include SiC, which may be epitaxial-grown with an n-type dopant for straining an n-type FET. The n-type dopant includes arsenic and/or phosphorus, and the strained materials 214 may be epitaxial-grown by LPCVD process with in-situ doping.

In some embodiments, the first layers 322 are grown to have substantially identical size. The first layers 322 may be symmetrical to one another, as shown in FIG. 10. However, the disclosure is not limited thereto. Alternatively, the first layers 322 may be grown to have different sizes. In some embodiments, the first layers 322 located at the same side of the fin structures 310a' along the direction X and arranged along the direction Y may be grown to physically spacing away from each other, which may be considered as discrete pieces, as shown in FIG. 10.

Figure 11:
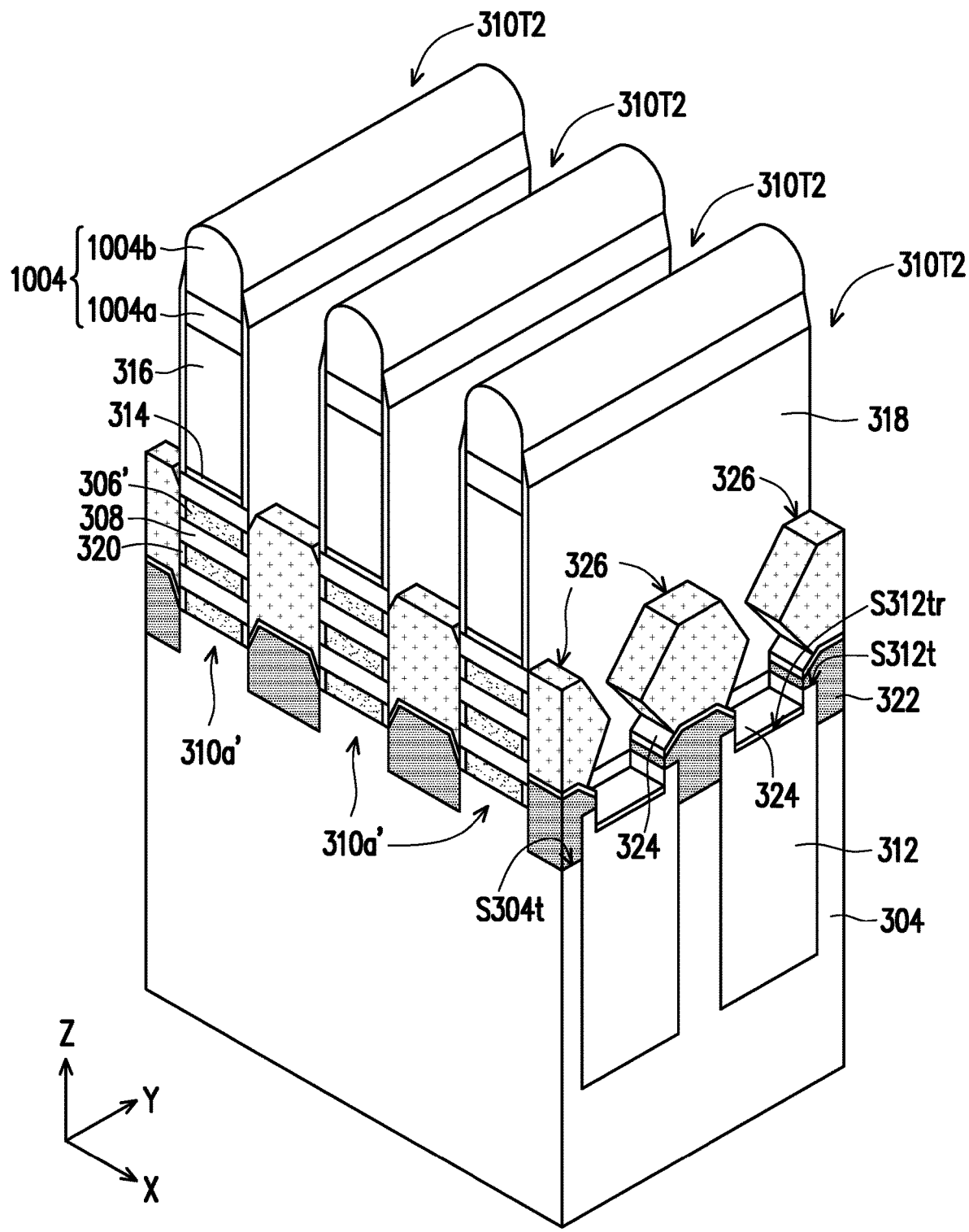

Referring to FIG. 11, in some embodiments, a dielectric layer 324 is formed over the structure depicted in FIG. 10. In some embodiments, the dielectric layer 324 is disposed over the semiconductor substrate 304 to cover (e.g., in physical contact with) the illustrated top surfaces of the first layers 322 and the illustrated top surfaces S312tr of portions of the isolation structures 312 surrounding by (e.g., enclosed by) the edges of the isolation structures 312 exposed by the first layers 322. In the case, sidewalls of the first layers 322, sidewalls of the edges of the isolation structures 312 exposed by the first layers 322, the sidewalls of the fin structures 310a', and the sidewalls of the gate spacers 318 are free of the dielectric layer 324. The dielectric layer 324 may be referred to as a coverage dielectric layer or a buffer layer. A material of the dielectric layer 324 may include SiO, AlO, AlON, ZrO, HfO, TiO, ZrAlO, ZnO, SiN, SiOCN, SiCN, or other suitable dielectric materials or combinations thereof, and a method for forming the dielectric layer 324 may include a deposition process, such as a CVD process or the like. A thickness (T324 in FIG. 27B) of the dielectric layer 324 measured along the direction Z may be in a range of about 1 nm to about 10 nm. Although other value of the thickness of the dielectric layer 324 is possible depending on product and process requirements. Alternatively, the dielectric layer 324 may be optional and can be omitted.

Referring to FIG. 11, in some embodiments, a plurality of source/drain regions 326 are formed over the first layers 322 and on the dielectric layer 324. In some embodiments, the dielectric layer 324 is disposed between (e.g., in physical contact with) the first layers 322 and the source/drain regions 326. The source/drain regions 326 may be coupled to the exposed surfaces of the second semiconductor layers 308 of the fin structures 310a' (along the Y-direction) and the inner spacers 320. The source/drain regions 326 may each include silicon germanium, indium arsenide, indium gallium arsenide, indium antimonide, germanium arsenide, germanium antimonide, indium aluminum phosphide, indium phosphide, any other suitable material, or combinations thereof. The source/drain regions 326 may be formed using an epitaxial layer growth process on the exposed surfaces of each of the second semiconductor layers 308 and the inner spacers 320. The material of the source/drain regions 326 may be doped with a conductive dopant. For example, a strained material is epitaxially grown with an n-type dopant (or a p-type dopant) for straining the source/drain regions 326 in the n-type region (or the p-type region). That is, the strained material is doped with the n-type dopant (or the p-type dopant) to be the source/drain regions 326 of the p-type FET (or the n-type FET). Owing to the dielectric layer 324, a leakage current from silicon to the source/drain regions 326 can be minimized.

In some embodiments, the source/drain regions 326 are grown to have substantially identical size. The source/drain regions 326 may be symmetrical to one another, as shown in FIG. 11. However, the disclosure is not limited thereto. Alternatively, the source/drain regions 326 may be grown to have different sizes. In some embodiments, the source/drain regions 326 located at the same side of the fin structures 310a' along the direction X and arranged along the direction Y may be grown to physically spacing away from each other, which may be considered as discrete pieces, as shown in FIG. 11. Alternatively, the source/drain regions 326 located at the same side of the fin structures 310a' along the direction X and arranged along the direction Y may be grown to physically connected to each other, which may be together considered as an integral piece. The source/drain regions 326 may be coupled to the exposed surfaces of the second semiconductor layers 308 of the fin structures 310a' (along the Y-direction) and the inner spacers 320.

In some embodiments, one first layer 322, a respective one source/drain region 326 overlying thereto, and the dielectric layer 324 (if any) disposed therebetween together may be referred to as an epitaxial structure (not labeled) of the semiconductor device 10. That is, the epitaxial structures is disposed as a multi-layered structure, with different layers having different degrees of doping. In some embodiments, an illustrated bottom surface of the epitaxial structures (including the first layer 322, the source/drain regions 326, and the dielectric layer 324 disposed therebetween) may be lower than the illustrated top surfaces (e.g., S312tr) of the neighboring isolation structures 312. Alternatively, the illustrated bottom surface of the epitaxial structures may be substantially leveled with the illustrated top surfaces (e.g., S312tr) of the neighboring isolation structures 312. Alternatively, the epitaxial structures may be disposed as a single-layered structure. It should be noted that the epitaxial structures may have other types of configurations, while remaining within the scope of the disclosure. The epitaxial structures may be referred to as source/drain structures or source/drain features.

Figure 12A:
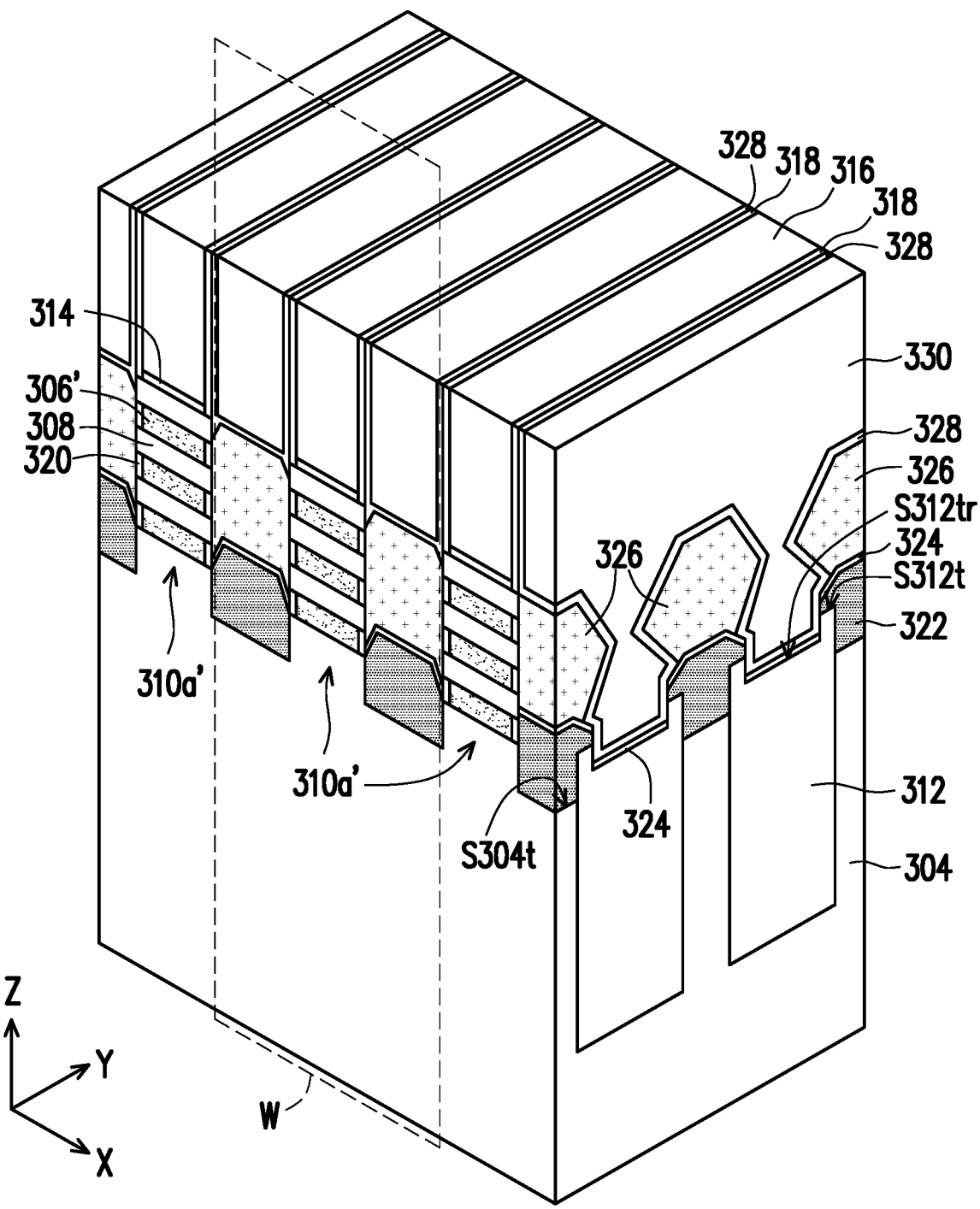
Figure 12B:
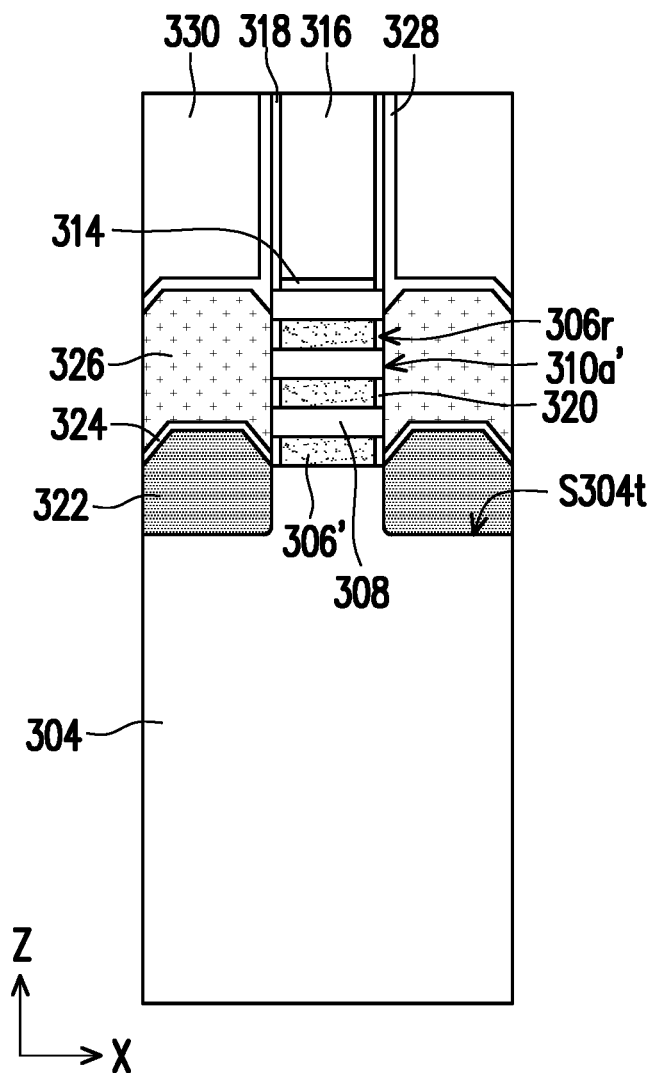

Referring to FIG. 12A and FIG. 12B, in some embodiments, a dielectric layer 328 is globally formed on the structure depicted in FIG. 11. The dielectric layer 328 may be completely disposed on the epitaxial structures, the sacrificial gate structures, the gate spacers 318, and the isolation structures 312 exposed therefrom, as shown in FIG. 12A and FIG. 12B. The dielectric layer 328 includes, for example, a suitable material such as silicon nitride, silicon oxynitride, silicon nitride with oxygen or carbon elements, the like or combinations thereof. In some embodiments, the dielectric layer 328 is deposited by using processes such as CVD (e.g., high density plasma (HDP) CVD or sub-atmospheric CVD (SACVD)), ALD, molecular layer deposition (MLD), or other suitable methods. The dielectric layer 328 functions as a protection layer that effectively blocks water or moisture from penetrating into the elements underlying thereto or damages from the subsequent process(es) such as an etching process. The dielectric layer 328 may be referred to as a protection layer, an etch stop layer or a contact etch stop (CES) layer. A thickness of the dielectric layer 328 measured along the direction Z may be in a range of about 1 nm to about 6 nm. Although other value of the thickness of the dielectric layer 328 is possible depending on product and process requirements.

Thereafter, an interlayer dielectric (ILD) layer 330 is formed over the dielectric layer 328, in some embodiments. For example, the ILD layer 330 is disposed at opposing sides (along the Y-direction) of each sacrificial gate structures to overlay the epitaxial structures and the isolation structures 312 exposed therefrom, with the dielectric layer 328 disposed therebetween. The ILD layer 330 may be formed of a dielectric material such as silicon oxide, silicon oxide, silicon nitride, silicon oxynitride, silicon carbonitride, silicon carbide oxynitride, spin-on glass (SOG), tetraethylorthosilicate (TEOS) oxide, phosphosilicate glass (PSG), borosilicate glass (BSG), boron-doped phosphosilicate Glass (BPSG), fluoride-doped silicate glass (FSG), undoped silicate glass (USG), carbon doped silicon oxide (e.g., SiCOH), polyimide, and/or a combination thereof. In some alternative embodiments, the ILD layer 3300 may include low-K dielectric materials. It should be noted that the low-k dielectric materials are generally dielectric materials having a dielectric constant lower than 3.9. Examples of low-K dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the ILD layer 330 may include one or more dielectric materials. In some embodiments, the ILD layer 330 is formed to a suitable thickness by CVD such as flowable chemical vapor deposition (FCVD), HDP CVD, SACVD, spin-on, sputtering, or other suitable methods.

In some embodiments, a material layer of the dielectric layer 328 may be conformally formed over the epitaxial structures and the isolation structures 312, the sacrificial gate structures, and the gate spacers 318. Next, a material layer of the ILD layer 330 may be formed over the dielectric layer 328 and fills the second trenches 310T2. Subsequently, a planarization process (e.g., a grinding process, a chemical mechanical polishing (CMP) process, an etching process, or combinations thereof) may be performed to remove excess materials of the dielectric layer 328 and the ILD layer 330. In some embodiments, the planarization process may also remove the capping structures 1004 to expose illustrated top surfaces of the dummy gate electrodes 316 of the sacrificial gate structures. After the planarization process, the illustrated top surfaces of the ILD layer 330 and the dielectric layer 328 may be substantially leveled with (e.g., coplanar to) illustrated top surfaces of the sacrificial gate structures (e.g., the illustrated top surfaces of the dummy gate electrodes 316) and illustrated top surfaces of the gate spacers 318, within process variations.

In certain cases, parts of top portions of the sacrificial gate structures may also be removed during the planarization process. After the planarization process, a cleaning step may be optionally performed, for example to clean and remove the residue generated from the planarization process.

Figure 13A:
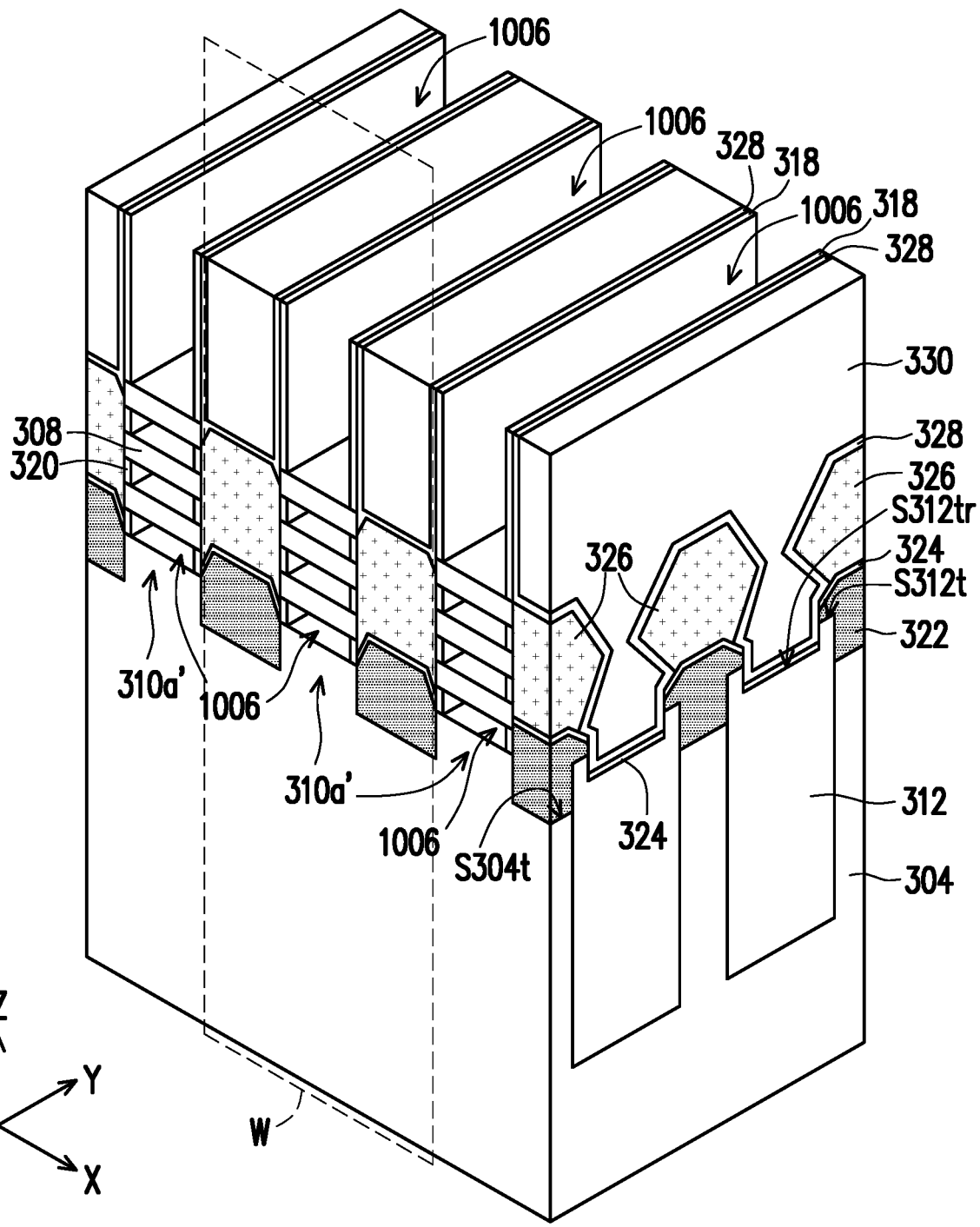
Figure 13B:
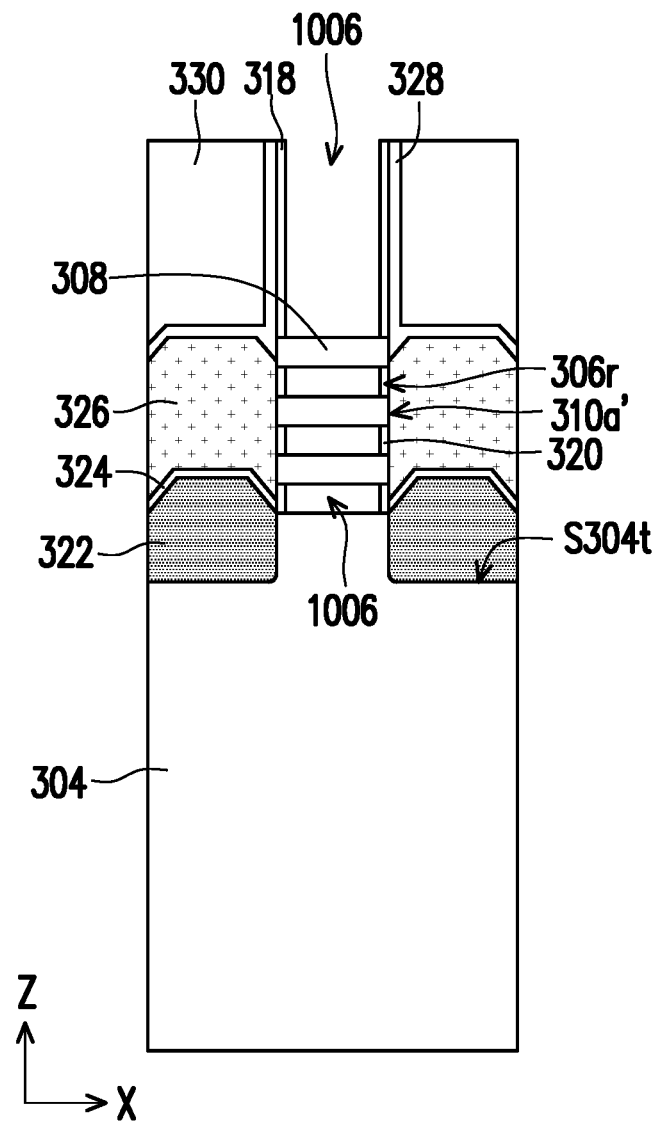

Referring to FIG. 13A and FIG. 13B, in some embodiments, after the sacrificial gate structures are accessibly revealed, the dummy gate electrodes 316 and the dummy gate dielectric layers 314 of the sacrificial gate structures are removed to form first recesses between a respective pair of the gate spacers 318, and the first semiconductor layer 306' are also removed to second recesses between a respective pair of the inner spacers 320. The removal process may include an etching process (such as a dry etching, a wet etching, or a combination thereof) or any other suitable process. In some embodiments, a method for removing the first semiconductor layer 306' may include an isotropic etching process. By properly selecting etchants for the etching process and/or properly selecting the materials of the first semiconductor layer 306' and the second semiconductor layers 308, the first semiconductor layer 306' can be etched without removing the second semiconductor layers 308 and other components in the current structure. In the case, the isotropic etching process is a selective etching process, while leaving the second semiconductor layers 308 substantially intact. During the removal process, the ILD layer 330 and the dielectric layer 328 may protect the epitaxial structures and the isolation structures 312. In some embodiments the first recesses and the second recesses are spatially communicated to each other to form cavities 1006. That is, the second semiconductor layers 308 of the fin structures 310a' are released. The respective, illustrated bottom surface and illustrated top surface of each of the second semiconductor layers 308 may be exposed (e.g., accessibly revealed) by the cavities 1006, as shown in FIGS. 13A and 13B. In addition, inner sidewalls of the inner spacers 320 previously covered by the first semiconductor layer 306' are currently exposed in the cavities 1006.

Figure 14A:
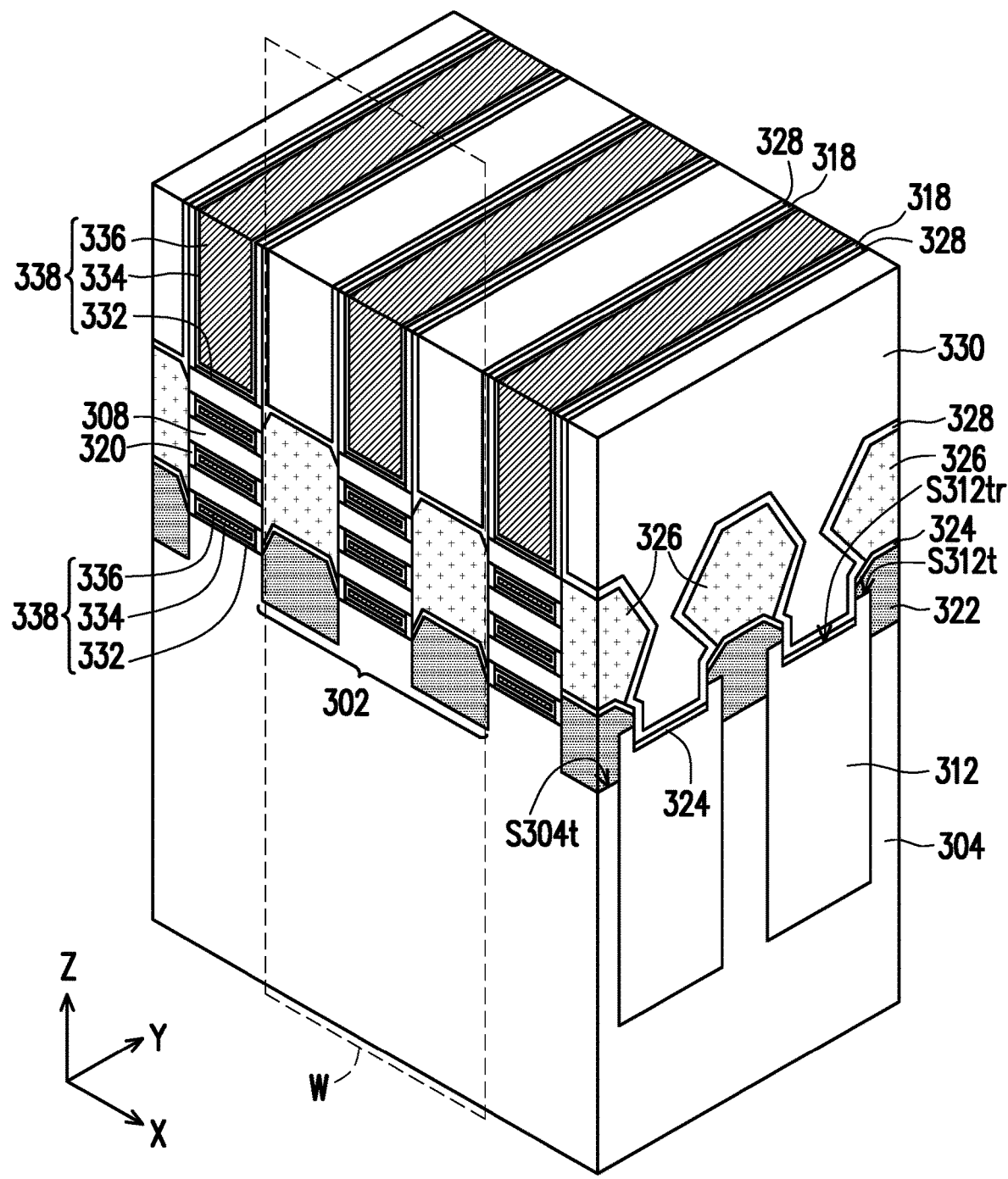
Figure 14B:
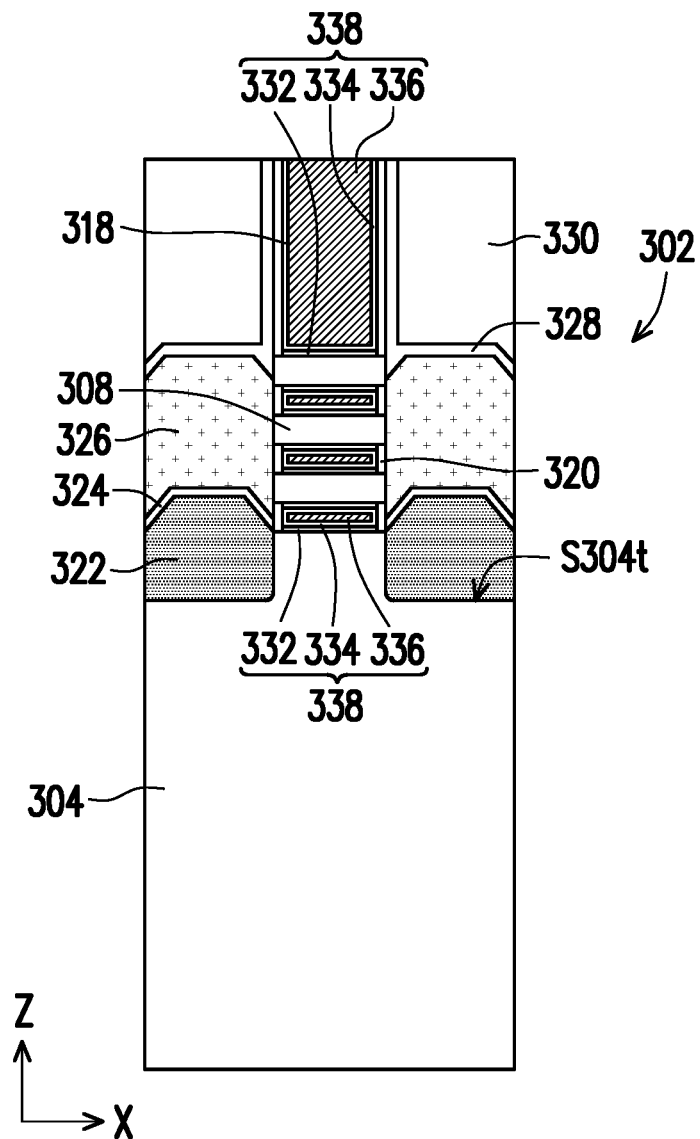

Referring to FIG. 14A and FIG. 14B, in some embodiments, interfacial (IL) layers 332, gate dielectric layers 334, and gate electrodes 336 are formed in the cavities 1006 defined between adjacent gate spacers 318 and the inner spacers 320. One interfacial layer 332, one gate dielectric layer 334, and one gate electrode 336 disposed in one cavity 1006 may be collectively referred to as a gate structure 338 of the semiconductor device 10. That is, the previously shown sacrificial gate structures may be regarded as being replaced by the gate structures 338. Up to here, a plurality of transistors 302 included in the semiconductor device 10 is manufactured. The transistors 302 respectively include one of the gate structures 338, the second semiconductor layers 308 in this gate structure 338, and a pair of source/drain structures at opposite sides of this gate structure 338. In addition, the transistors 302 respectively include may further includes the inner spacers 320 in this gate structure 338 and a pair of gate spacer 318 at the opposite sides of this gate structure 338. The number and configurations of the transistors 302 formed in the semiconductor device should not be limited by the embodiments or drawings of this disclosure. It is understood that the number and configurations of the transistors 302 may have different material or configurations depending on product designs.

As shown in FIG. 14A and FIG. 14B, the interfacial layers 332 are lining on the exposed, illustrated top and illustrated bottom surfaces of the second semiconductor layers 308 and the illustrated top surface of the semiconductor substrate 304 underlying the second semiconductor layers 308, for example. In the case, the gate dielectric layers 334 are lining on exposed surfaces of the interfacial layers 332, the inner spacers 320 and the gate spacers 318, and the gate electrodes 336 fill the remainder space in these cavities 1006. The interfacial layers 332 may include a dielectric material such as silicon oxide layer or silicon oxynitride. In some embodiments, the interfacial layers 332 may be formed by a deposition process such as ALD, CVD, and/or other suitable deposition methods. The interfacial layers 332 may be adapted to provide a good interface between the semiconductor surface (i.e., the second semiconductor layers 308) and a gate insulator (i.e., the gate dielectric layers 334) and to suppress the mobility degradation of the channel carrier of the transistors 302. A material of the gate dielectric layer 334 may include a high-k dielectric material. In some embodiments, low-k dielectric materials are generally dielectric materials having a dielectric constant greater than about 4, greater than about 12, greater than about 16, or even greater than about 20. Examples of the high-k dielectric material may include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 334 may be one-layer structure or a multi-layer structure of different sublayers. The gate dielectric layer 334 may be referred to as a high-k dielectric layer. A method for forming the gate dielectric layers 334 may include a deposition process, such as a CVD process or an ALD process. A material of the gate electrodes 336 may include polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. A method for forming the gate electrodes 336 may include a deposition process (e.g., a CVD process or an ALD process), a plating process (e.g., an electrical plating process or an electroless plating process) or a combination thereof. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In some embodiments, one or more work function layer (not shown) is formed between each gate dielectric layer 334 and the overlying gate electrode 336. A material of the work function layer may include p-type work function metals or n-type work function metals. For example, the p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. For example, the n-type work function metals include Ti, Ag, TaAl, TaAlC, TiAlN, TaC, TaCN, TaSiN, Mn, Zr, other suitable n-type work function materials, or combinations thereof. In some embodiments, the method of forming the work function layer includes performing at least one suitable deposition technique, such as CVD (e.g., PECVD), ALD (e.g., remote plasma atomic layer deposition (RPALD), plasma enhanced atomic layer deposition (PEALD), molecular beam deposition (MBD), or the like. The work function layer may serve the purpose of adjusting threshold voltage (Vt) of the transistors 302.

Figure 15A:
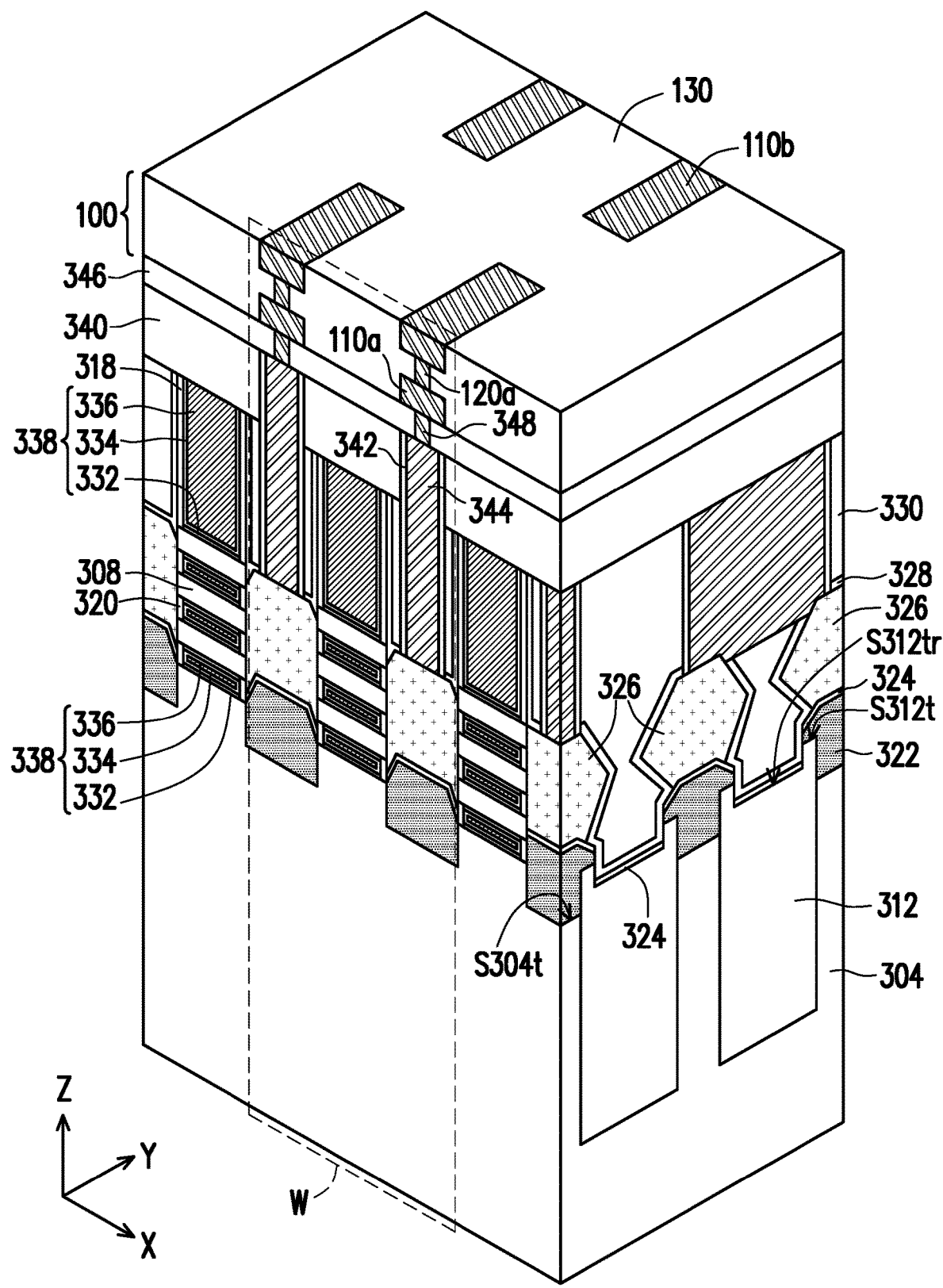
Figure 15B:
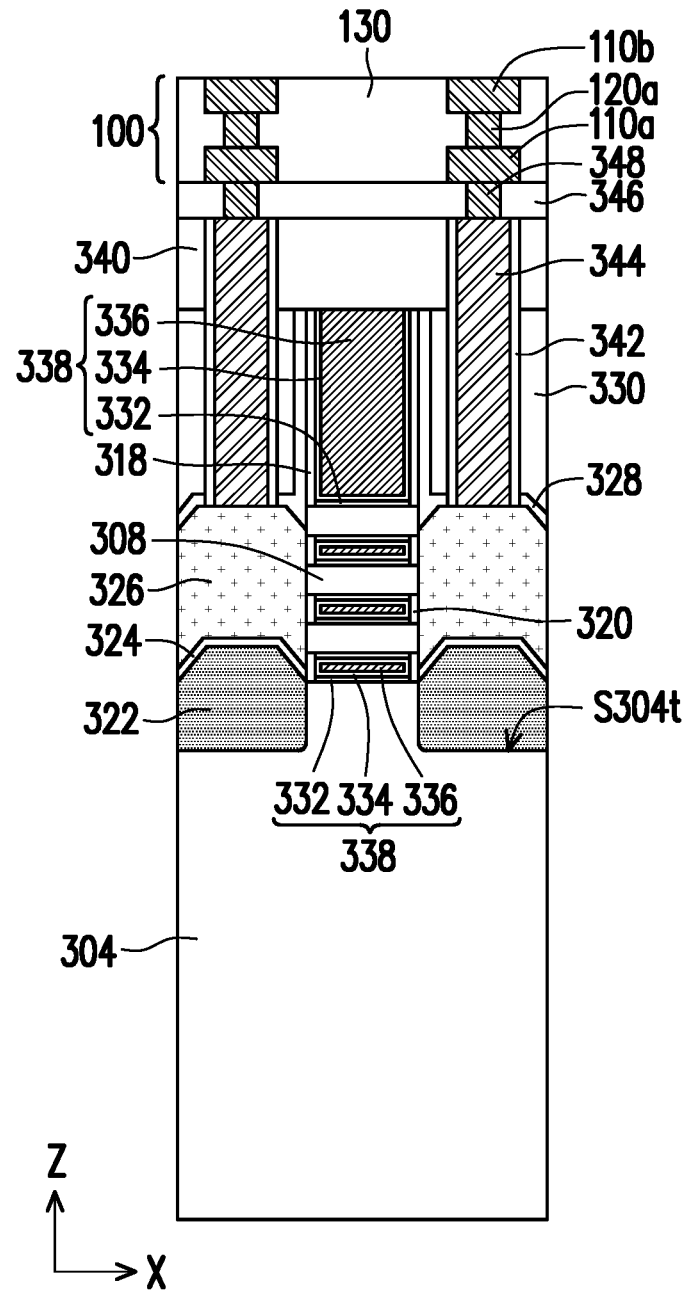

Referring to FIG. 15A and FIG. 15B, in some embodiments, an ILD layer 340 is formed over the transistor 302 and extends onto the illustrated top surfaces of the ILD layer 330, the dielectric layer 328 and the gate spacers 318. The formation and material of the ILD layer 340 is similar to or substantially identical to the formation and material of the ILD layer 330 as described in FIG. 12A and FIG. 12B, and thus are not repeated herein for brevity. Thereafter, a plurality of though openings (not labeled) may be formed in the ILD layer 340 and further extend into the ILD layer 330 and the dielectric layer 328 to expose (e.g., accessibly reveal) portions of the source/drain regions 326, as shown in FIGS. 15A and 15B. The through openings may be formed by patterning the ILD layer 340, the ILD layer 330 and the dielectric layer 328 with lithography and etching processes. The etching process may include a dry etching, a wet etching, or a combination thereof.

In some embodiments, after forming the through openings in the ILD layer 340, the ILD layer 330 and the dielectric layer 328, a plurality of contact plugs 344 are formed in the through openings to couple with the source/drain regions 326. The contact plugs 344 may be referred to as metal contacts or metallic contacts to the source/drain regions 326. For example, the contact plugs 344 electrically coupled to the source/drain regions 326 are referred to as source/drain contacts. In some embodiments, the contact plugs 344 may include ruthenium (Ru), cobalt (Co), copper (Cu), titanium (Ti), titanium nitride (TiN), tantalum (Ta), tantalum nitride (TaN), molybdenum (Mo), nickel (Ni), a combination of thereof, or the like. The contact plugs 344 may be formed by, for example, plating such as electroplating or electroless plating, CVD such as PECVD, ALD, and PVD, a combination thereof, or the like. Seed layers (not shown) may be optionally formed before forming the contact plugs 344 to line sidewalls and illustrated bottoms of the through openings. That is, for example, each of the seed layers covers an illustrated bottom surface and sidewalls of a respective one of the contact plugs 344. In some embodiments, each of the seed layers is a metal layer, which may be a single layer or a composite layer comprising a plurality of sub-layers formed of different materials. The seed layers are formed using, for example, PVD or the like. In one embodiment, the seed layers may be omitted.

Barrier layer or adhesive layers 342 may be optionally formed before forming the contact plugs 344. In some embodiments, the barrier layer or adhesive layers 342 may be optionally formed between the contact plugs 344 and the ILD layer 340, between the contact plugs 344 and the ILD layer 330, and between the contact plugs 344 and the dielectric layer 328. Owing to the additional barrier layer or adhesive layers 342, it is able to ensure the adhesion between the contact plugs 344 and the ILD layer 340, between the contact plugs 344 and the ILD layer 330, and between the contact plugs 344 and the dielectric layer 328. As shown in FIG. 15A and FIG. 15B, the barrier layer or adhesive layers 342 line on the sidewalls of the contact plugs 344, where the contact plugs 344 respectively stand on the source/drain regions 326, for example. The additional barrier layer or adhesive layers 342 may include Ti, TiN, Ta, TaN, a combination thereof, a multilayer thereof, or the like, and may be formed using CVD, ALD, PVD, a combination thereof, or the like. In an alternative embodiment of which the seed layer is included, the additional barrier layer or adhesive layer 342 is interposed between the seed layer and the ILD layer 340, between the seed layer and the ILD layer 330 and between the seed layer and the dielectric layer 328, where the seed layer is interposed between the contact plugs 344 and the additional barrier layer or adhesive layer 342. In the embodiments of the seed layer is presented, owing to the additional barrier layer or adhesive layer 342, it is able to prevent the seed layer and/or the contact plugs 344 from diffusing to the underlying layers and/or the surrounding layers. In one embodiment, the additional barrier layer or adhesive layer 342 may be omitted. As shown in FIG. 15A, sidewalls of the contact plugs 344 may be substantially vertical sidewalls. The disclosure is not limited thereto, alternatively, the sidewalls of the contact plugs 344 may be slant sidewalls or step-shaped sidewalls.

Continued on FIG. 15A and FIG. 15B, a plurality of conductive vias 348 are formed over the transistor 302 and the contact plugs 344, and a dielectric layer 346 are formed to laterally cover the conductive vias 348. As shown in FIG. 15A and FIG. 15B, illustrated top surface of the conductive vias 348 may be accessibly revealed by the dielectric layer 346 for electrical connection with later-formed elements, such as conductive features in a later-formed interconnect or interconnection structure. The dielectric layer 346 may be referred to as an ILD layer, while the conductive vias 348 may be referred to as contact vias or metallic vias. For example, some of the conductive vias 348 are electrically connected to the contact plugs 344 connected to the source/drain regions 326, and some of the conductive vias 348 are electrically connected to the gate electrodes 336 of the gate structure 338. The conductive vias 348 electrically connected to the contact plugs 344 connected to the source/drain regions 326 may be referred to as source/drain contacts, and the conductive vias 348 electrically connected to the gate electrodes 336 of the gate structure 338 may be referred to as gate contacts.

In some embodiments, a material of the dielectric layer 346 includes polyimide, epoxy resin, acrylic resin, phenol resin, BCB, polybenzoxazole (PBO), or any other suitable polymer-based dielectric material. The dielectric layer 346, for example, may be formed by suitable fabrication techniques such as spin-on coating, CVD, PECVD, or the like. In some embodiments, the conductive vias 348 may include copper (Cu), copper alloys, nickel (Ni), aluminum (Al), manganese (Mn), magnesium (Mg), silver (Ag), gold (Au), tungsten (W), a combination of thereof, or the like. Seed layers (not shown) may be optionally formed before forming the conductive vias 348 to line an illustrated bottom surface and sidewalls of a respective one of the conductive vias 348 or to line an illustrated bottom surface of a respective one of the conductive vias 348. In some embodiments, each of the seed layers is a metal layer, which may be a single layer or a composite layer comprising a plurality of sub-layers formed of different materials. The seed layers are formed using, for example, PVD or the like. In one embodiment, the seed layers may be omitted. The conductive vias 348 may be formed by, for example, plating such as electroplating or electroless plating, CVD such as PECVD, ALD, and PVD, a combination thereof, or the like. In the disclosure, the transistors 302, the contact plugs 344 and the conductive vias 348 are formed in front-end-of-line (FEOL) process.

Thereafter, an interconnection structure 100 may be formed over the conductive vias 348 and the dielectric layer 346. For example, the interconnection structure 100 may include a stack 130 of dielectric layers and interconnections (110a, 120a, and 110b) formed in the stack 130 of dielectric layers. The interconnections (110a, 120a, and 110b) are electrically connected to the transistors 302 through the conductive vias 348 and the dielectric layer 346. As shown in FIG. 15A and FIG. 15B, the interconnections includes conductive layers 110a, 110b and conductive vias 120a alternately stacked upon one another (along the direction Z), for example. The conductive layers 110a, 110b are connected and electrically coupled to each other through the conductive 120a, and the conductive layer 110a is connected and electrically coupled to the conductive vias 348, so to provide routing function to the transistors 302. The formation and material of each of the conductive layers 110a, 110b and the conductive vias 120a are similar to or substantially identical to the formation and material of the conductive vias 348, the formation and material of the dielectric layers included in the stack 130 are similar to or substantially identical to the formation and material of the dielectric layer 346, and thus are not repeated herein for brevity. In the disclosure, the interconnection structure 100 is formed in back-end-of-line (BEOL) process. The interconnection structure 100 may be referred to as a front-side interconnect, a front-side interconnection, or a front-side interconnection structure to provide routing functions to the transistors 302 and/or other devices formed underneath thereto. For illustrative purpose, only two build-up layers (e.g., a first build-up layer including the conductive layer 110a, conductive vias 120a and a portion of the stack 130a laterally covering the conductive layer 110a and conductive vias 120a, and a second build-up layer including the conductive layer 110b and a portion of the stack 130a laterally covering the conductive layer 110b) are shown in the interconnection structure 100, however the disclosure is not limited to the embodiments and/or drawings. The interconnection structure 100 may incudes one or more than one first build-up layer and one or more than one second build-up layer alternatively stacked along the direction Z.

Figure 16:
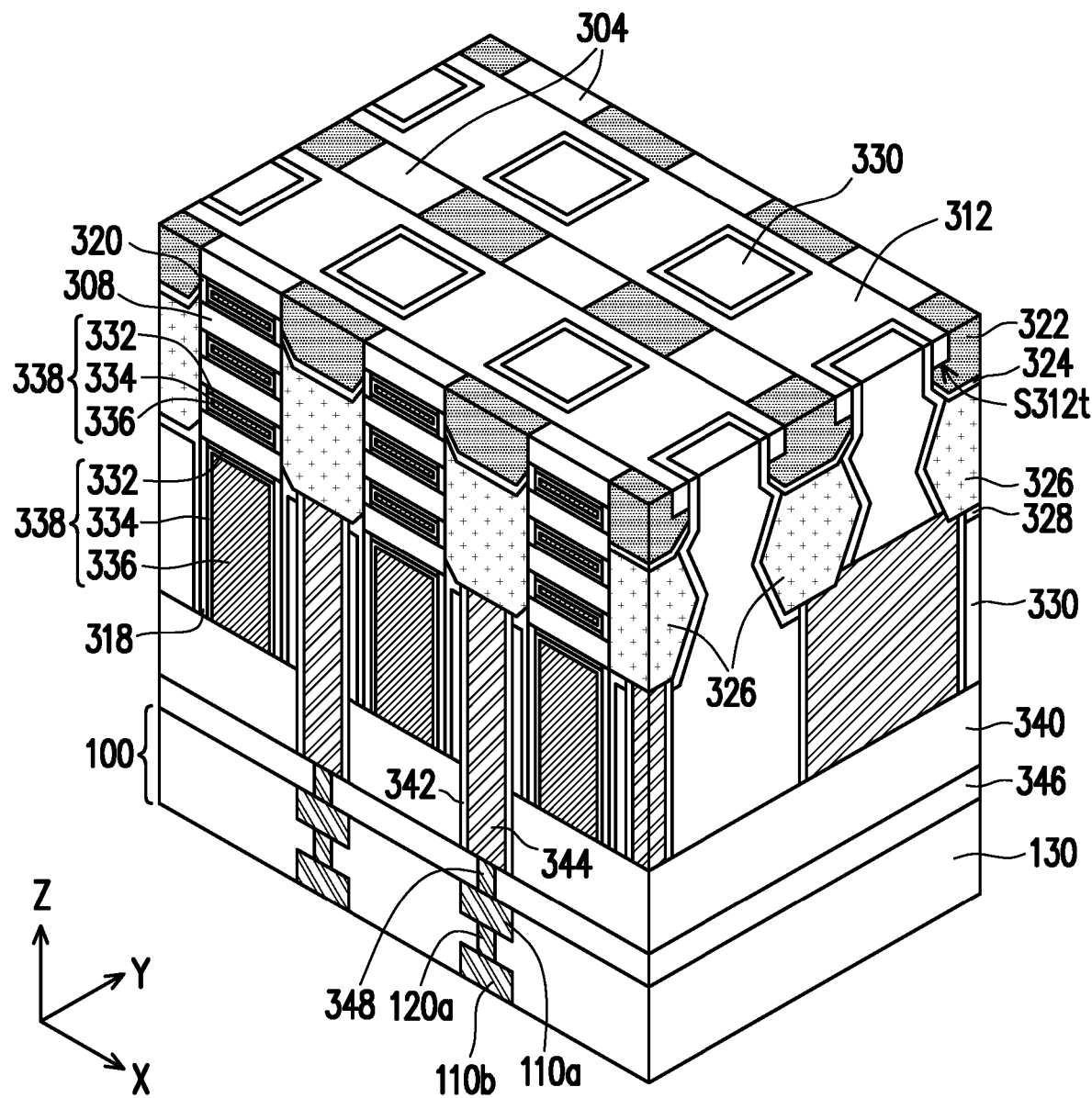

Referring to FIG. 16, in some embodiments, the structure depicted in FIG. 15A and FIG. 15B are flipped (turned upside down) and secured by a holding device (not shown), where portions of the semiconductor substrate 304, the isolation structures 312, the first layers 322 and the dielectric layer 324 are removed. The removal process may be performed by a planarization process such as a grinding process, a CMP process, an etching process, or combinations thereof. Such removal process may be referred to a thinning process. After the planarization process, a cleaning step may be optionally performed, for example to clean and remove the residue generated from the planarization process. As shown in FIG. 16, an illustrated top surface of the current structure is a flat surface includes a surface of the semiconductor substrate 304, surfaces of the isolation structures 312, surfaces of the first layers 322, surfaces of the dielectric layer 328, surface of the ILD layer 330, for example. In addition, illustrated top surface of the current structure depicted in FIG. 16 is opposite to an outermost surface (e.g., an exposed surface) of the interconnection structure 100 along the direction Z.

Figure 17:
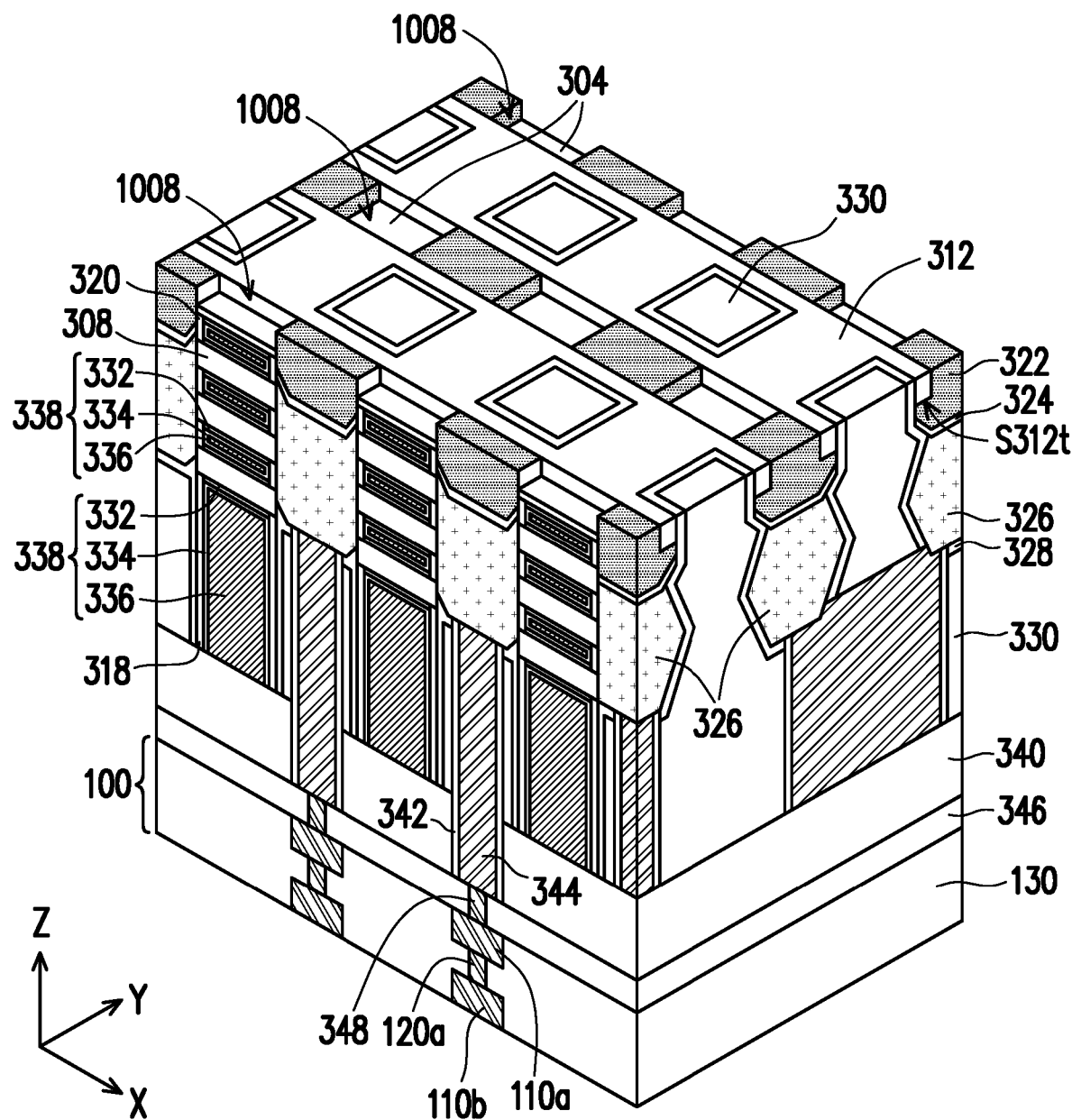

Referring to FIG. 17, in some embodiments, the semiconductor substrate 304 exposed from the illustrated top surface of the current structure are at least partially removed to form a plurality of openings 1008 exposing an illustrated top surface of the remaining semiconductor substrate 304, sidewalls of the first layers 322, and sidewalls of the isolation structure 312. A method for partially removing the semiconductor substrate 304 may include an etching process, such as an isotropic etching process. By properly selecting etchants for the etching process and/or by properly selecting the materials of the semiconductor substrate 304, the isolation structures 312, the first layers 322, the dielectric layer 328 and the ILD layer 330, where the semiconductor substrate 304 can be etched without consuming the isolation structures 312, the first layers 322, the dielectric layer 328 and the ILD layer 330 and other components in the current structure.

Figure 18:
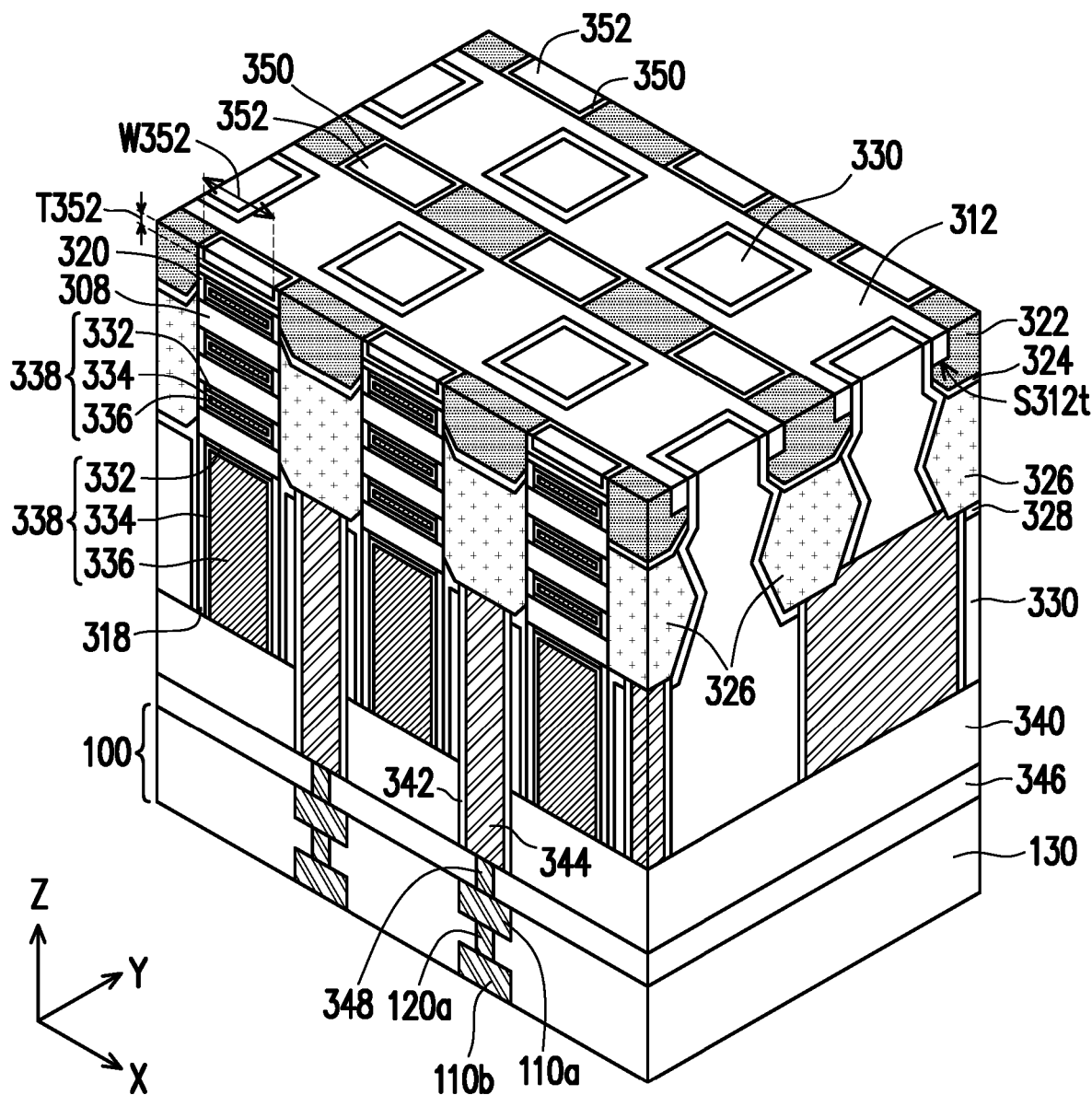

Referring to FIG. 18, in some embodiments, dielectric layers 350 are formed to line sidewalls and illustrated bottoms of the openings 1008, and the dielectric regions 352 are formed to fill the remainder space in these openings 1008. One dielectric layer 350 and one dielectric region 352 disposed in a respective one opening 1008 may be referred to as a self-aligned dielectric (SAD). A material of the insulating material for forming the dielectric layers 350 may include silicon nitride, silicon carbide nitride, or other suitable dielectric materials without oxygen elements, or combinations thereof. A thickness (T350 in FIG. 18 and FIG. 27B) of the dielectric layers 350 measured along the direction Z may be in a range of about 0.3 nm to about 3 nm. Although other value of the thickness of the dielectric layers 350 is possible depending on product and process requirements. A material of the insulating material for forming the dielectric regions 352 may include SiO, SiOC, AlO, AlON, ZrO, HfO, TiO, ZrAlO, ZnO, SiOCN, SiCN, or other suitable dielectric materials or combinations thereof. A thickness (T352 in FIG. 18 and FIG. 27B) of the dielectric regions 352 measured along the direction Z may be in a range of about 5 nm to about 30 nm. A width (W352 in FIG. 18 and FIG. 27B) of the dielectric regions 352 measured along the direction Z may be in a range of about 5 nm to about 30 nm. Although other values of the thickness and width of the dielectric regions 352 are possible depending on product and process requirements. In some embodiments, the insulating material layer of dielectric layers 350 is formed by using a deposition process (e.g., a CVD process or an ALD process), the insulating material of dielectric regions 352 is formed by using a deposition process (e.g., a CVD process or an ALD process), and the portions of these material layers are removed by using a planarization process such as a grinding process, a CMP process, an etching process, or combinations thereof to form the dielectric layers 350 and the dielectric regions 352 in the openings 1080.

Figure 19:
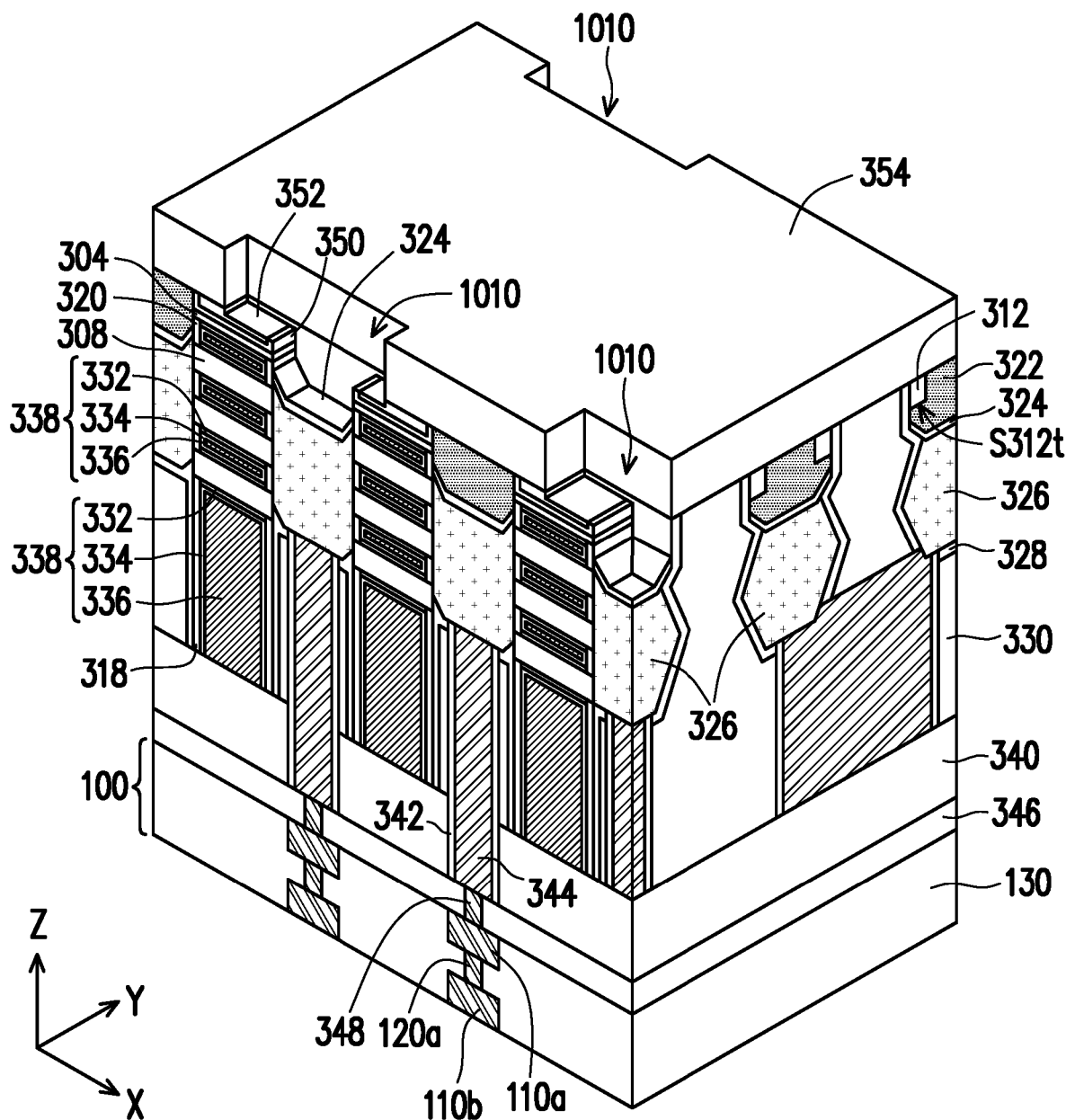

Referring to FIG. 19, in some embodiments, a hard mask layer 354 is formed on the structure depicted in FIG. 18, where the hard mask layer 345 includes a plurality of openings 1010 exposing portions of the structure depicted in FIG. 18. In some embodiments, the hard mask layer 354 is disposed on the illustrated top surface of the current structure and extends along the X-Y plane. In some embodiments, the hard mask layer 354 includes silicon oxynitride, silicon carbon nitride, or high-K dielectrics. High-K dielectrics includes metal oxides. It should be noted that the high-K dielectric materials are generally dielectric materials having a dielectric constant greater than 4. Examples of metal oxides used for high-K dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The hard mask layer 354 may be formed using a suitable process such as ALD, CVD, PVD, thermal oxidation, UV-ozone oxidation, or combinations thereof.

Thereafter, the first layers 322 exposed by the openings 1010 formed in hard mask layer 354 are removed, in some embodiments, as shown in FIG. 19. The removal process may be performed by properly selecting etchants for the etching process and/or properly selecting the materials of the first layers 322 and the hard mask layer 354, where the first layers 322 can be etched without removing the hard mask layer 354 and other components in the current structure. In the case, the isotropic etching process is a selective etching process, while leaving the hard mask layer 354 substantially intact. After the removal process, a cleaning step may be optionally performed, for example to clean and remove the residue generated from the planarization process. In certain cases, parts of top portions of the self-aligned dielectrics (SADs), which are also exposed by the openings 1010 formed in hard mask layer 354, may also be removed during the removal process. A loss amount (L1 in FIG. 27B) of the self-aligned dielectrics (SADs) including the dielectric regions 352 and the dielectric layers 350 measured along the direction Z may be in a range of about 0.1 nm to about 10 nm. Although other value of the loss amount (L1 in FIG. 27B) of the self-aligned dielectrics (SADs) including the dielectric regions 352 and the dielectric layers 350 is possible depending on product and process requirements. As shown in FIG. 19, after the removal process, the dielectric layer 324, sidewalls of the semiconductor substrate 304, and sidewalls of some of the inner spacer 320 are exposed by the openings 1010 formed in hard mask layer 354, for example.

Figure 20:
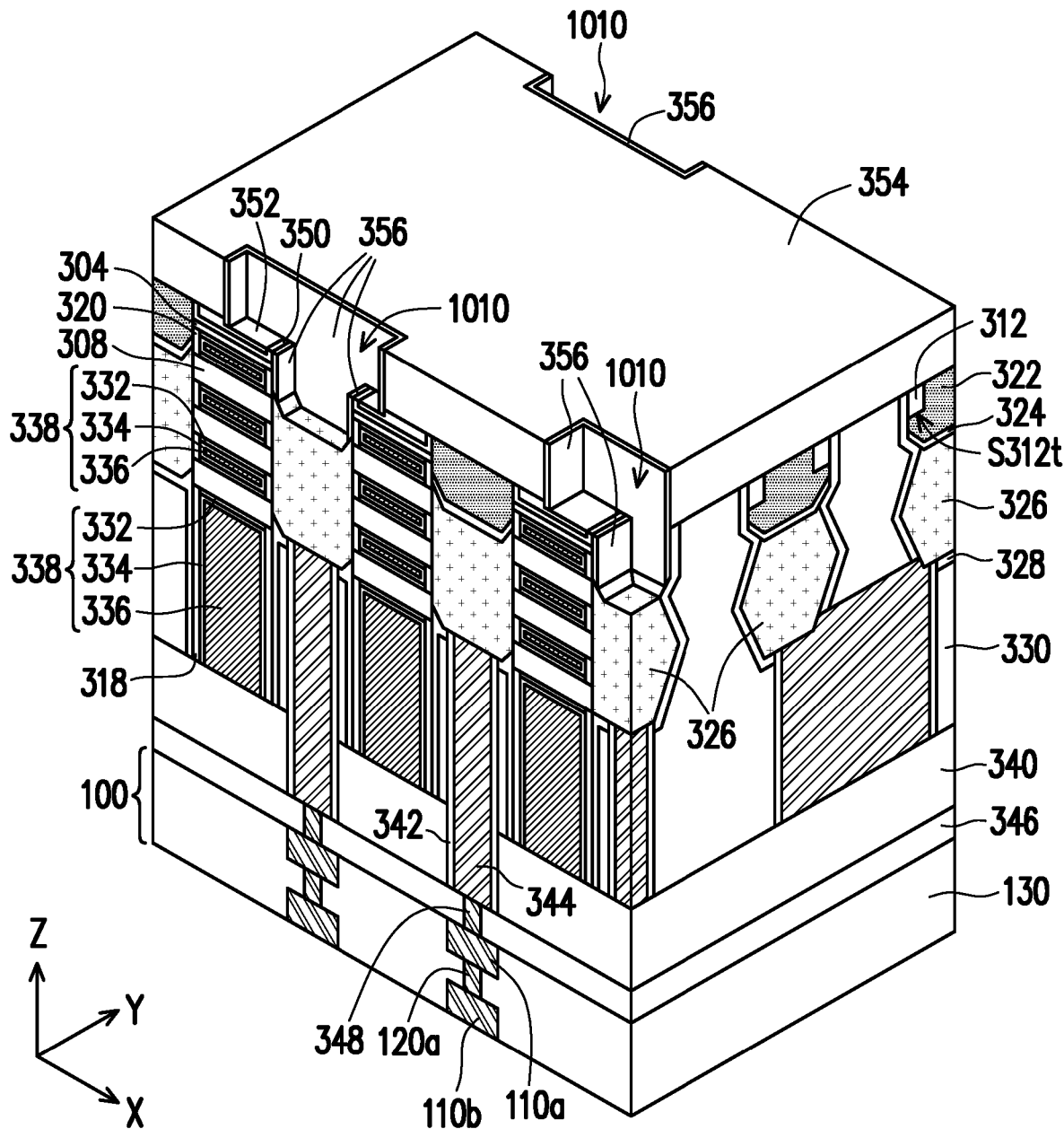

Referring to FIG. 20, in some embodiments, liner layers 356 are formed on sidewalls of the openings 1010, the exposed sidewalls of the semiconductor substrate 304, and the exposed sidewalls of some of the inner spacer 320. That is, the liner layers 356 are vertical liners to only line the sidewalls of the openings 1010, the exposed sidewalls of the semiconductor substrate 304, and the exposed sidewalls of some of the inner spacer 320. A material of the liner layers 356 may include SiO, AlO, AlON, ZrO, HfO, TiO, ZrAlO, ZnO, SiN, SiOCN, SiCN, or other suitable dielectric materials or combinations thereof, and a method for forming the liner layers 356 may include a deposition process (such as a CVD process, an ALD process or the like) and a patterning process (such as an etching process or the like). A thickness (T356 in FIG. 27B) of the liner layers 356 measured along the direction Z may be in a range of about 1 nm to about 10 nm. Although other value of the thickness of the liner layers 356 is possible depending on product and process requirements. The liner layers 356 may be formed by, but not limited to, initially forming a material layer of the liner layers 356 globally covering the structure shown in FIG. 19, and then performing an anisotropic etching process to remove a portion of the material layer extending along the X-Y plane, and thus the remaining material layer (extending along the direction Z) forms the liner layers 356 disposed at the sidewalls of the openings 1010, the exposed sidewalls of the semiconductor substrate 304, and the exposed sidewalls of some of the inner spacer 320. During the etching, the dielectric layer 324 is also removed to expose (accessibly reveal) the source/drain regions 326, as shown in FIG. 20, for example. As shown in FIG. the self-aligned dielectrics (SADs) exposed (e.g., accessibly revealed) by the openings 1010 formed in the hard mask layer 354 have illustrated top surfaces being exposed by the hard mask layer 354 and the liner layers 356 and have sidewalls exposed by the hard mask layer 354 and covered by the liner layers 356, for example.

Figure 21:
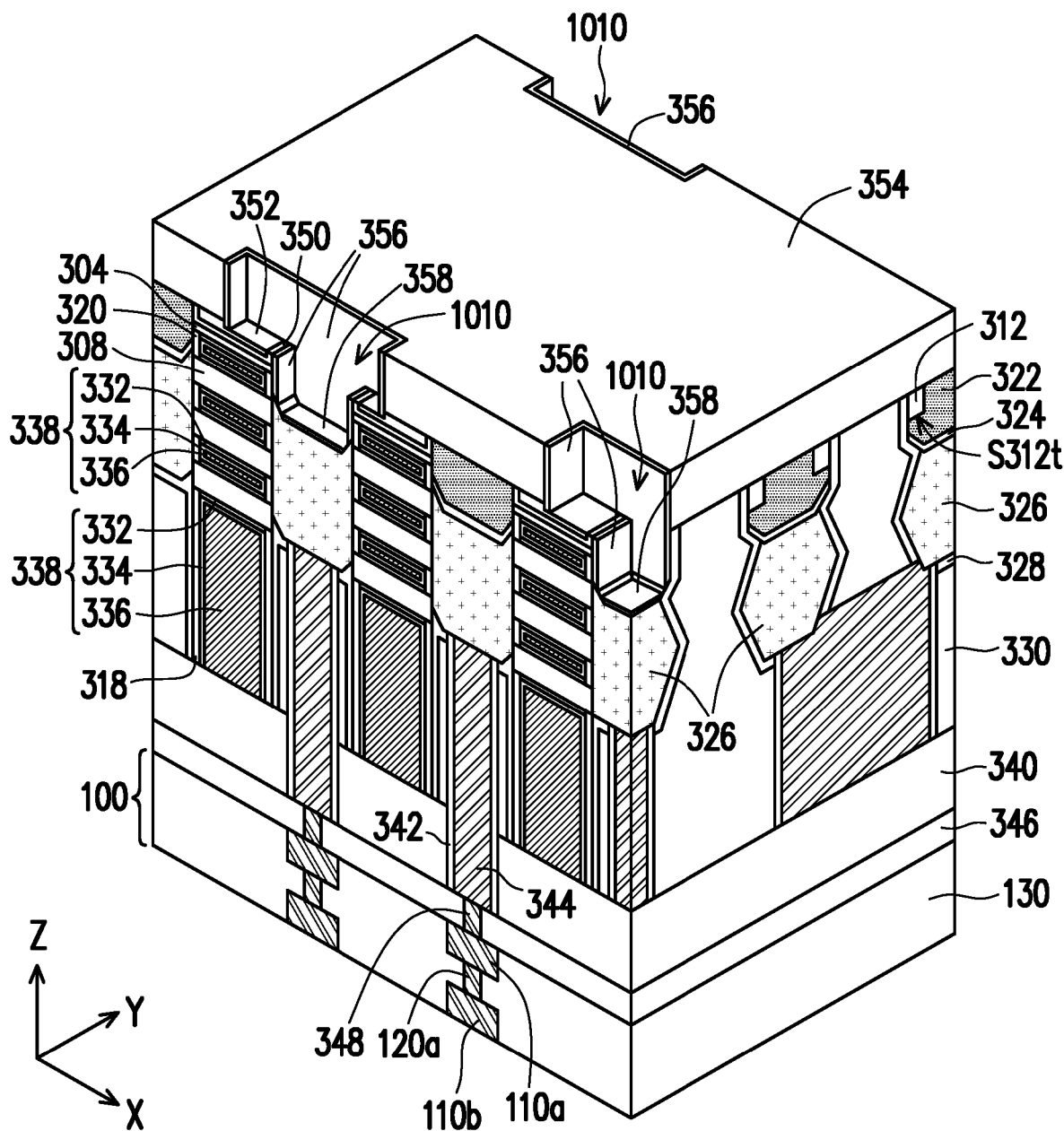

Referring to FIG. 21, in some embodiments, a plurality of silicide layers 358 are formed over the source/drain regions 326 exposed by the liner layers 356 and the hard mask layer 354. In some embodiments, each of the silicide layers 358 are conformally disposed on an exposed surface of a respective one of the source/drain regions 326. In some embodiments, the silicide layers 358 serves the function of providing better electrical conduction between the previously formed elements (e.g., the exposed source/drain regions 326) and later-formed elements (e.g., metal contacts) due to a lower electrical resistance between the silicide layers 358 and the later-formed elements. A material of the silicide layers 358 may include TiSi, MoSi, NiSi, CoSi, WSi, RuSi, or other suitable dielectric materials or combinations thereof, and a method for forming the liner layers 356 may include a deposition process (such as a CVD process, an ALD process or the like) or other suitable process. A thickness (T358 in FIG. 27B) of the silicide layers 358 measured along the direction Z may be in a range of about 2 nm to about 10 nm. Although other value of the thickness of the liner layers 356 is possible depending on product and process requirements.

Figure 22:
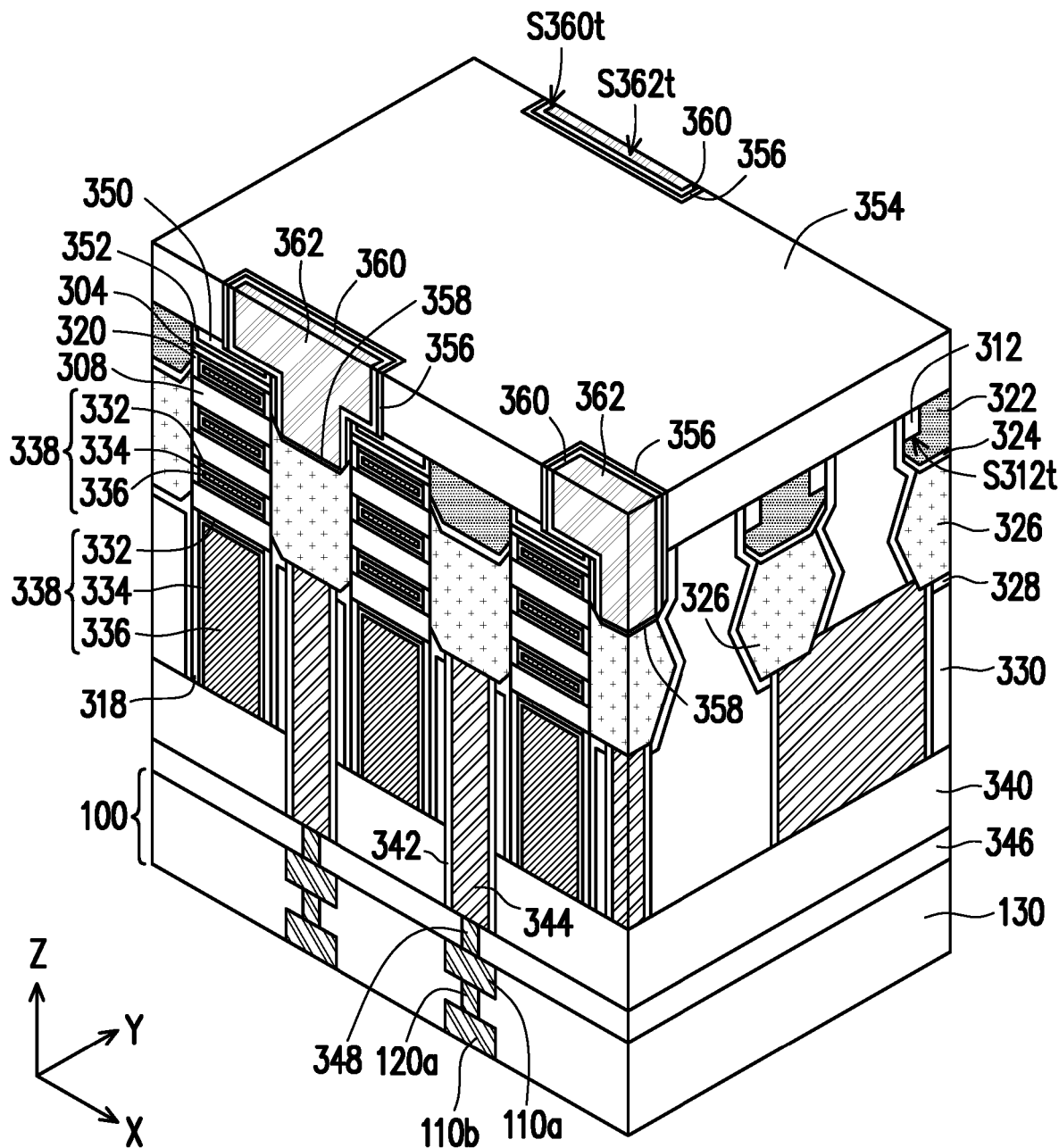

Referring to FIG. 22, in some embodiments, a plurality of contact plugs 362 are formed in the openings 1010 formed in the hard mask layer 354 and further extend downward (along the direction Z) to be coupled with the source/drain regions 326 through the silicide layers 358. In some embodiments, the contact plugs 362 may include copper (Cu), tungsten (W), ruthenium (Ru), cobalt (Co), titanium (Ti), titanium nitride (TiN), tantalum (Ta), tantalum nitride (TaN), molybdenum (Mo), a combination of thereof, or the like. The contact plugs 362 may be formed by, for example, plating such as electroplating or electroless plating, CVD such as PECVD, ALD, and PVD, a combination thereof, or the like. A thickness (T362 in FIG. 27B) of the contact plugs 362 measured along the direction Z may be in a range of about 10 nm to about 50 nm. Although other value of the thickness of the contact plugs 362 is possible depending on product and process requirements. The material of the contact plugs 362 may be the same as or different from the material of the contact plugs 344.

As shown in FIG. 22, for example, the contact plugs 362 have a step-shape sidewall profile, where each of the contact plugs 362 has a bottom portion and a top portion connected to and disposed on the bottom portion, and the bottom portion is disposed at a location closer to the source/drain regions 326 than the top portion is (along the direction Z). In some embodiments, as measured along the direction X or Y, a width W1 of the top portion of each of the contact plugs 362 is greater than a width W2 of the bottom portion of each of the contact plugs 362. However, the disclosure is not limited thereto; alternatively, the width W1 of the top portion of each of the contact plugs 362 may substantially equal to the width W2 of the bottom portion of each of the contact plugs 362. The width (W2 in FIG. 27B) of the bottom portions of the contact plugs 362 measured along the direction X or Y may be in a range of about 5 nm to about 30 nm. Although other value of the width of the bottom portions of the contact plugs 362 is possible depending on product and process requirements.

Seed layers (not shown) may be optionally formed before forming the contact plugs 362 to line exposed sidewalls of the liner layers 356, the exposed surfaces of the self-aligned dielectrics (SADs), and exposed surfaces of the silicide layers 358. That is, for example, each of the seed layers covers an illustrated bottom surface and sidewalls of a respective one of the contact plugs 362. In some embodiments, each of the seed layers is a metal layer, which may be a single layer or a composite layer comprising a plurality of sub-layers formed of different materials. The seed layers are formed using, for example, PVD or the like. In one embodiment, the seed layers may be omitted.

Barrier layer or adhesive layers 360 may be optionally formed before forming the contact plugs 362. In some embodiments, the barrier layer or adhesive layers 360 may be optionally formed between the contact plugs 362 and the liner layers 356, between the contact plugs 362 and the self-aligned dielectrics (SADs), and between the contact plugs 362 and the silicide layers 358. Owing to the additional barrier layer or adhesive layers 360, it is able to ensure the adhesion between the contact plugs 362 and the liner layers 356, between the contact plugs 362 and the self-aligned dielectrics (SADs), and between the contact plugs 362 and the silicide layers 358. As shown in FIG. 22, the barrier layer or adhesive layers 360 line on the sidewalls of the contact plugs 362, where the contact plugs 362 respectively stand on the source/drain regions 326, for example. The additional barrier layer or adhesive layers 360 may include Ti, TiN, Ta, TaN, a combination thereof, a multilayer thereof, or the like, and may be formed using CVD, ALD, PVD, a combination thereof, or the like. A thickness (T360 in FIG. 27B) of the barrier layer or adhesive layers 360 measured along the direction Z may be in a range of about 0.3 nm to about 3 nm. Although other value of the thickness of the liner layers 356 is possible depending on product and process requirements. Alternatively, the barrier layer or adhesive layers 360 may be optional and can be omitted.

In an alternative embodiment of which the seed layer is included, the additional barrier layer or adhesive layer 360 is interposed between the seed layer and the liner layers 356, between the seed layer and the self-aligned dielectrics (SADs) and between the seed layer and the silicide layers 358, where the seed layer is interposed between the contact plugs 362 and the additional barrier layer or adhesive layer 360. In the embodiments of the seed layer is presented, owing to the additional barrier layer or adhesive layer 360, it is able to prevent the seed layer and/or the contact plugs 362 from diffusing to the underlying layers and/or the surrounding layers. In one embodiment, the additional barrier layer or adhesive layer 360 may be omitted. As shown in FIG. 22, the illustrated surface of the current structure is a flat surface including an illustrated top surface S354 of the hard mask layer 354, illustrated top surfaces S360 of the barrier layer or adhesive layer 360, and illustrated top surfaces S362 of the contact plugs 362, for example.

Figure 23:
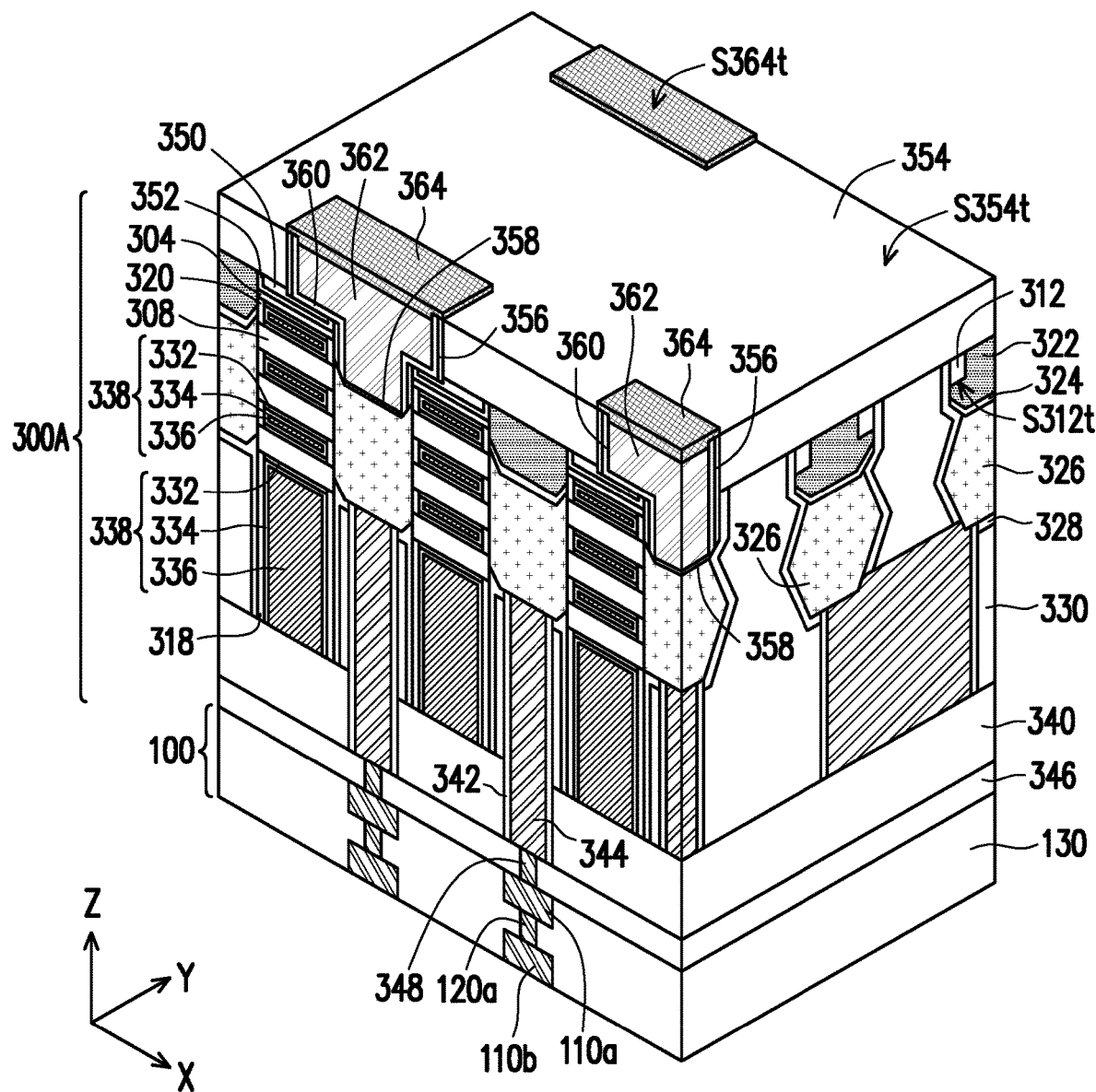

Referring to FIG. 23, in some embodiments, capping patterns 364 are formed on the illustrated top surface S362 of the contact plugs 362. In some embodiments, the contact plugs 362 are completed covered by the capping patterns 364. A thickness (T364 in FIG. 27B) of the capping patterns 364 measured along the direction Z may be in a range of about nm to about 4 nm. Although other value of the thickness of the capping patterns 364 is possible depending on product and process requirements. In certain case, the capping patterns 364 may further extend onto the liner layers 356 or extend onto the liner layers 356 and the hard mask layer 354. An extended length (L2 in FIG. 27B) of the capping patterns 364 measured along the direction X or Y may be in a range of about 0.2 nm to about 3 nm. Although other value of the extended length of the capping patterns 364 is possible depending on product and process requirements. However, the disclosure is not limited thereto. In alternative embodiments, the extended length L2 of the capping patterns 364 measured along the direction X or Y may be zero. In other words, the capping patterns 364 do not further extend onto the liner layers 356 or extend onto the liner layers 356 and the hard mask layer 354, see a device structure 300A' of a semiconductor device 10' depicted in FIG. 28A and FIG. 28B.

In some embodiments, the capping patterns 364 may include $W_xN_y$ (x, y>1), $Ru_xN_y$ (x, y>1), $Co_xN_y$ (x, y>1), $Mo_xN_y$ (x, y>1), TiN, $Ta_xN_y$ (x, y>1), a combination of thereof, or the like. The capping patterns 364 may be formed by, for example, a nitridation treatment by thermal process or a nitridation treatment by implantation process.

In some embodiments, the nitridation treatment by thermal process is performed at a pressure in a range from about 0.05 Torr to about 10 Torr, at a temperature in a range from about 400° C. to about 500° C., at a RF power in a range from about 30 watts (W) to about 100 watts, with a gas flow including from about 5 standard cubic centimeters per minute (sccm) to about 1000 sccm of $NH_3$ (serving as a precursor), a gas flow including from about 5 sccm to about 1000 sccm of $NH_3$ (serving as a precursor) and from about 5 sccm to about 1000 sccm of $H_2$ as a carrier gas, or a gas flow including from about 5 sccm to about 1000 sccm of $N_2$ (serving as a precursor) and from about 5 sccm to about 1000 sccm of $H_2$ as a carrier gas. However, the disclosure is not limited thereto. For example, the carrier gas includes Ar or the like.

In alternative embodiments, the nitridation treatment by implantation process is performed at an ion bean energy less than or substantially equal to about 1 keV and tilt angle substantially equal to about 0 degree, with an implantation dose greater than about $1 \times 10^{15}$ atom/cm 2 of $N_2$ (serving as a dopant species).

During the formation of the capping patterns 364, portions of the contact plugs 362 with the capping patterns 364 disposed thereon are consumed. For example, a consumption amount (L3 in FIG. 27B) of the capping patterns 364 measured along the direction Z may be in a range of about 0.2 nm to about 3 nm. Although other value of the consumption amount of the capping patterns 364 is possible depending on product and process requirements. In alternative embodiments, there is no contact plugs 362 being consumed during the formation of capping patterns 364; that is, the consumption amount L3 measured along the direction Z is zero. As shown in FIG. 23, the illustrated top surface of the current structure is a non-planar surface including illustrated top surfaces of the capping patterns 364 and the illustrate top surface S354 of the hard mask layer 354, where the illustrated top surfaces of the capping patterns 364 are above the illustrate top surface S354 of the hard mask layer 354, for example. The capping patterns 364 may be referred to as a nitride capping layer, nitride patterns, or nitride capping patterns. Up to here, a device structure 300A is manufacture, where the device structure 300A is disposed over and electrically coupled to the interconnection structure 100.

Figure 24:
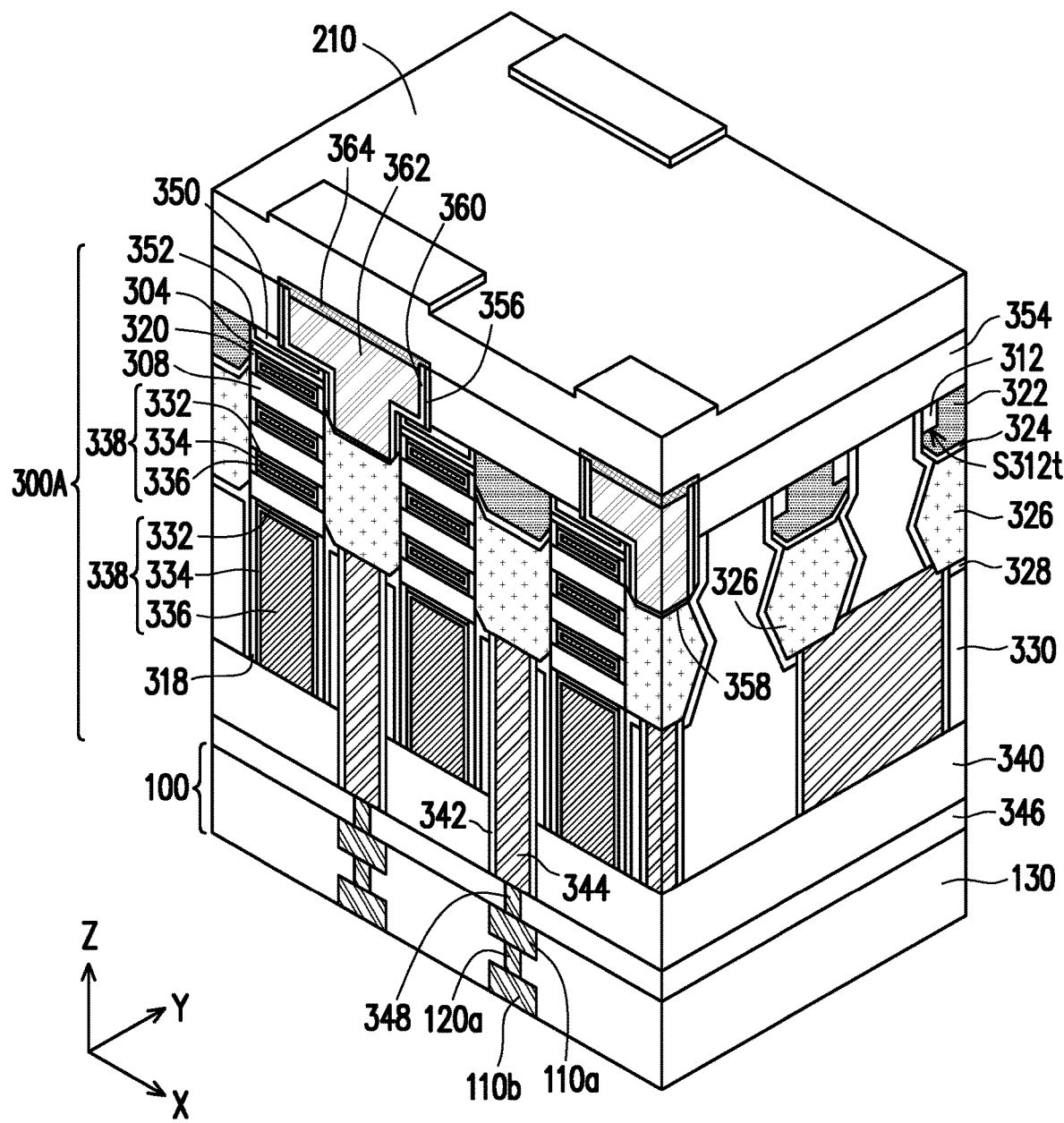

Referring to FIG. 24, in some embodiments, a hard mask layer 210 is disposed over the illustrated top surface of device structure 300A to cover up the hard mask layer 354 and the capping patterns 364. A material of the hard mask layer 210 may include SiO, SiOC, AlO, AlON, ZrO, HfO, TiO, ZrAlO, ZnO, SiOCN, SiCN, or other suitable dielectric materials or combinations thereof. A thickness (T210 in FIG. 27B) of the hard mask layer 210 measured along the direction Z may be in a range of about 5 nm to about 100 nm. Although other value of the thickness of the hard mask layer 210 is possible depending on product and process requirements. In some embodiments, the hard mask layer 210 is formed by using a deposition process, such as CVD.

Figure 25:
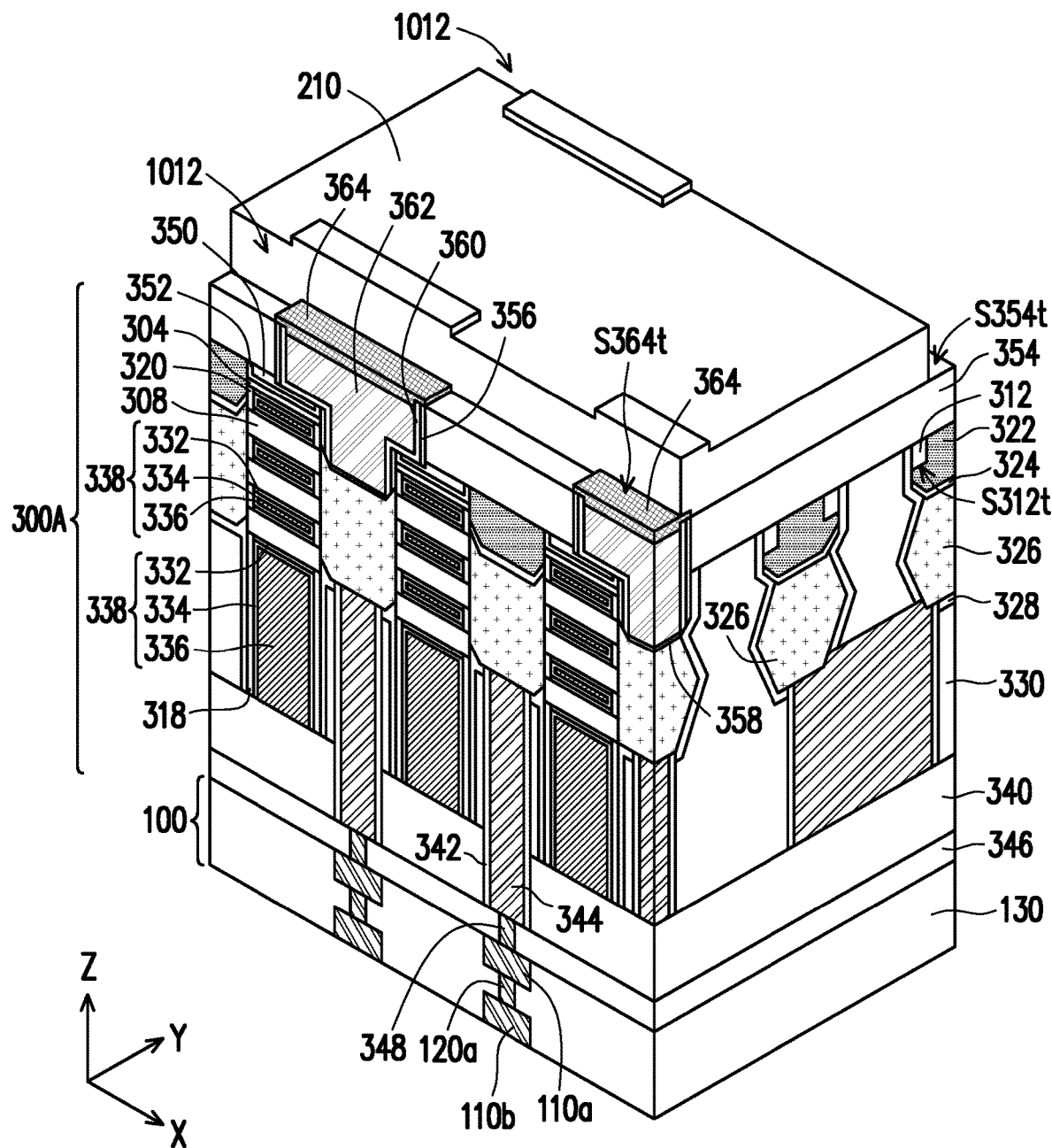

Referring to FIG. 25, in some embodiments, the hard mask layer 210 is patterned to form a plurality of openings 1012 exposing portions of the device structure 300A. For example, the illustrated top surface surfaces S364 of the capping patterns 364 and the illustrated top surface S354t of the hard mask layer 354 are partially exposed by the openings 1012. The patterning may include lithography and etching process. The etching process may include a dry etching, a wet etching, a combination thereof. After the etching process, a cleaning step may be optionally performed, for example to clean and remove the residue generated from the etching process.

Figure 26:
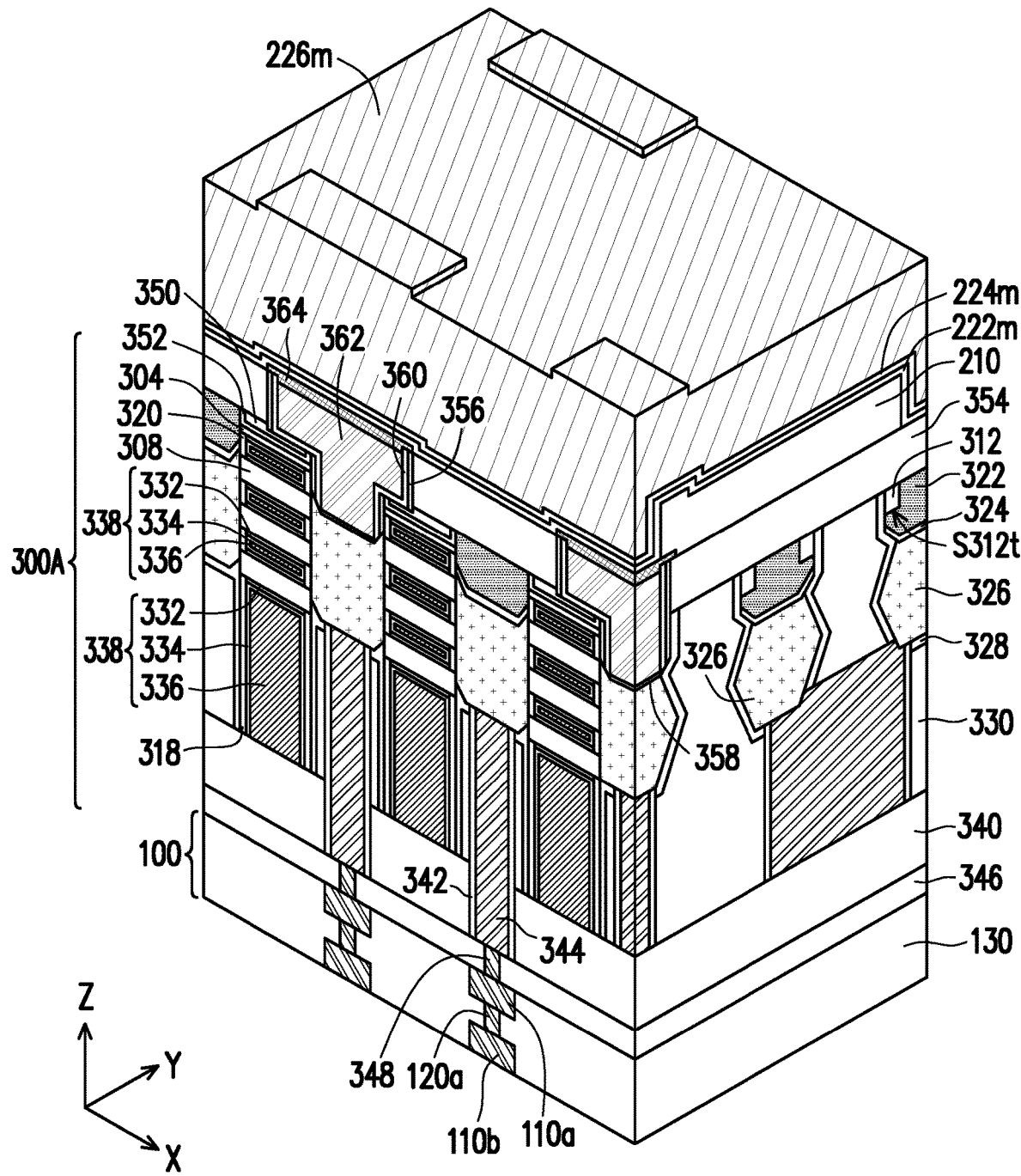

Referring to FIG. 26, in some embodiments, a first barrier material 222m, a second barrier material 224m, and a conductive material 226m are sequentially formed over the structure depicted in FIG. 25. A material of the first barrier material 222m may include TiN, TaN, or other suitable dielectric materials or combinations thereof, and may be formed by using a deposition process, such as CVD or ALD. A material of the second barrier material 224m may include Co, Ru, W, Mo, or other suitable dielectric materials or combinations thereof, and may be formed by using a deposition process, such as CVD or ALD. A material of the conductive material 226m may include Cu, Co, Ru, W, Mo, or other suitable dielectric materials or combinations thereof, and may be formed by using a deposition process, such as CVD or PVD. For example, as shown in FIG. 26, sidewalls and bottom surfaces of the openings formed in the hard mask layer 210 are lined by the first barrier material 222m. That is, the illustrated top surface surfaces S364 of the capping patterns 364 and the illustrated top surface S354t of the hard mask layer 354 exposed by the openings 1012 formed in the hard mask layer 210 are covered by the first barrier material 222m.

Referring to FIG. 27A and FIG. 27B, in some embodiments, a planarization process is performed to remove portions of the first barrier material 222m, the second barrier material 224m and the conductive material 226m above the openings 1012 to form first barrier layers 222a, second barrier layers 224a, and conductive contacts 226a in the openings 1012 formed in the hard mask layer 210. One first barrier layer 222a, one second barrier layer 224a and one conductive contact 226a disposed in a respective one opening 1012 may together be referred to as a conductive feature, and the hard mask layer 210 may be referred to as a dielectric layer laterally covering the conductive features. A thickness (T222a in FIG. 27B) of the first barrier layers 222a measured along the direction Z may be in a range of about 0.5 nm to about 10 nm. Although other value of the thickness of the first barrier layers 222a is possible depending on product and process requirements. A thickness (T224a in FIG. 27B) of the second barrier layers 224a measured along the direction Z may be in a range of about 0.5 nm to about 10 nm. Although other value of the thickness of the second barrier layers 224a is possible depending on product and process requirements. Up to here, an interconnection structure 200 is manufactured.

In some embodiments, the conductive features collectively are considered as a conductive layer 220a, where the conductive layer 220a and the hard mask layer 210 may serve as a build-up layer of the interconnection structure 200 for providing interconnections between the transistors 302 and/or other devices or providing electrical connection with external devices or later-formed feature to the transistors 302 and/or other devices. In the disclosure, the interconnection structure 200 is also formed in BEOL process. The interconnection structure 200 may be referred to as a back-side interconnect, a back-side interconnection, or a back-side interconnection structure to provide routing functions to the transistors 302 and/or other devices formed underneath thereto. For illustrative purpose, only one build-up layer is shown in the interconnection structure 200, however the disclosure is not limited to the embodiments and/or drawings. For example, the processes described in FIG. 24 through FIG. 27A and FIG. 27B can be repeated multiple times to obtain multiple build-up layers for the interconnection structure 200.

Up to here, the semiconductor device 10 is manufactured, where the semiconductor device 10 includes the interconnection structure 100, the interconnection structure 200, and the device structure 300A, and the interconnection structure 100 is disposed on the front side of the device structure 300A and the interconnection structure 200 is disposed on the back side of the device structure 300A. In some embodiments, the interconnection structure 100 is electrically coupled to the transistor 302 and other devices formed in the device structure 300A for providing routing functions thereto, and the interconnection structure 200 is electrically coupled to the transistor 302 and other devices formed in the device structure 300A for providing routing functions thereto. Owing to the capping patterns 364 disposed between the contact plugs 362 of the device structure 300A and the conductive layer 220a of the interconnection structure 200, the metal diffusion between the contact plugs 362 of the device structure 300A and the conductive layer 220a of the interconnection structure 200 (e.g., a miscible phenomenon between Ru and Co or between Mo and W) can be greatly mitigate or greatly suppress, thereby improving the reliability of the semiconductor device Due to the metal diffusion between the contact plugs 362 of the device structure 300A and the conductive layer 220a of the interconnection structure 200 can be prevented by the capping patterns 364, a great, various selection in the material of forming the contact plugs 362 is promised.

Figure 31:
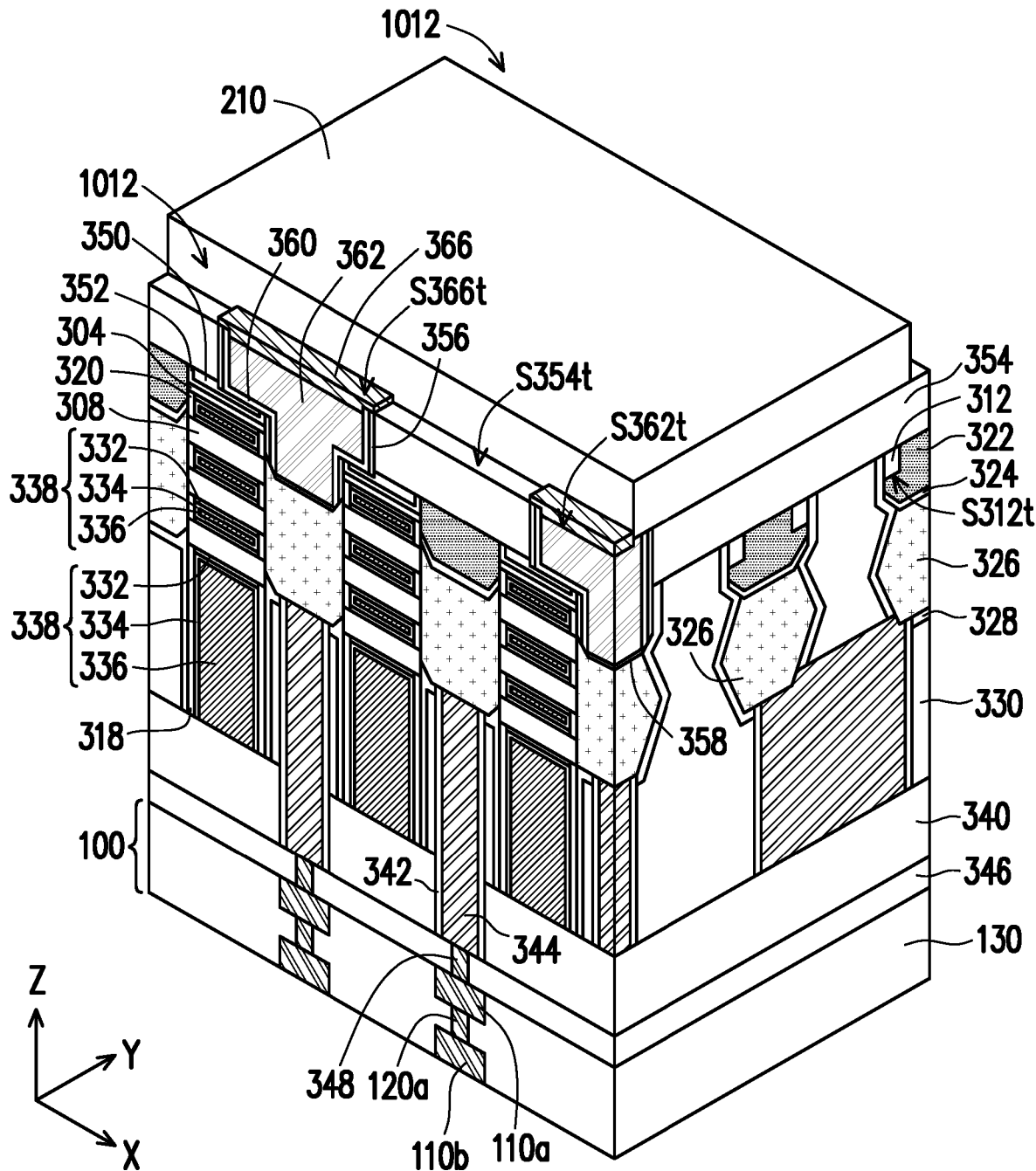
Figure 32:
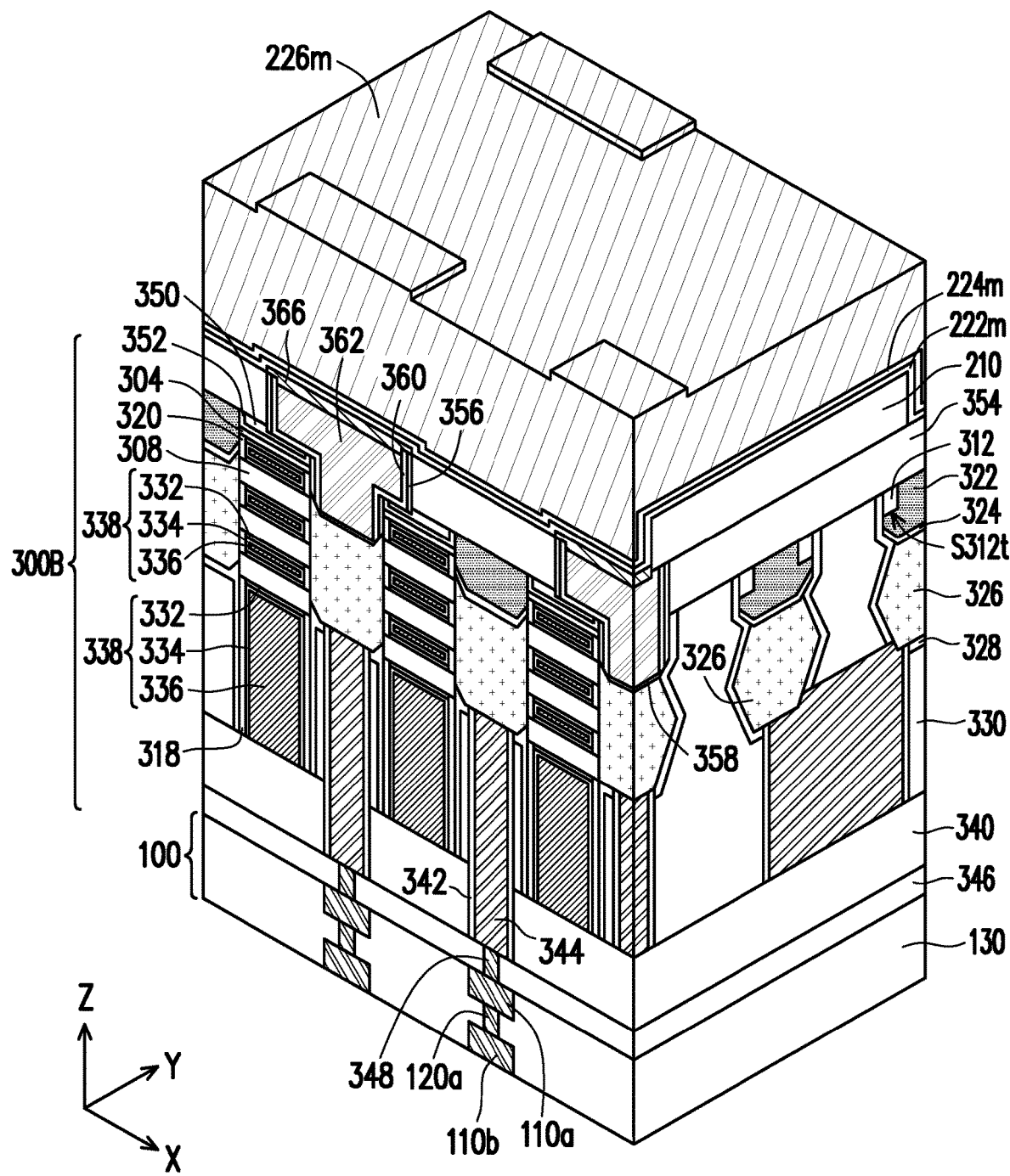
Figure 33A:
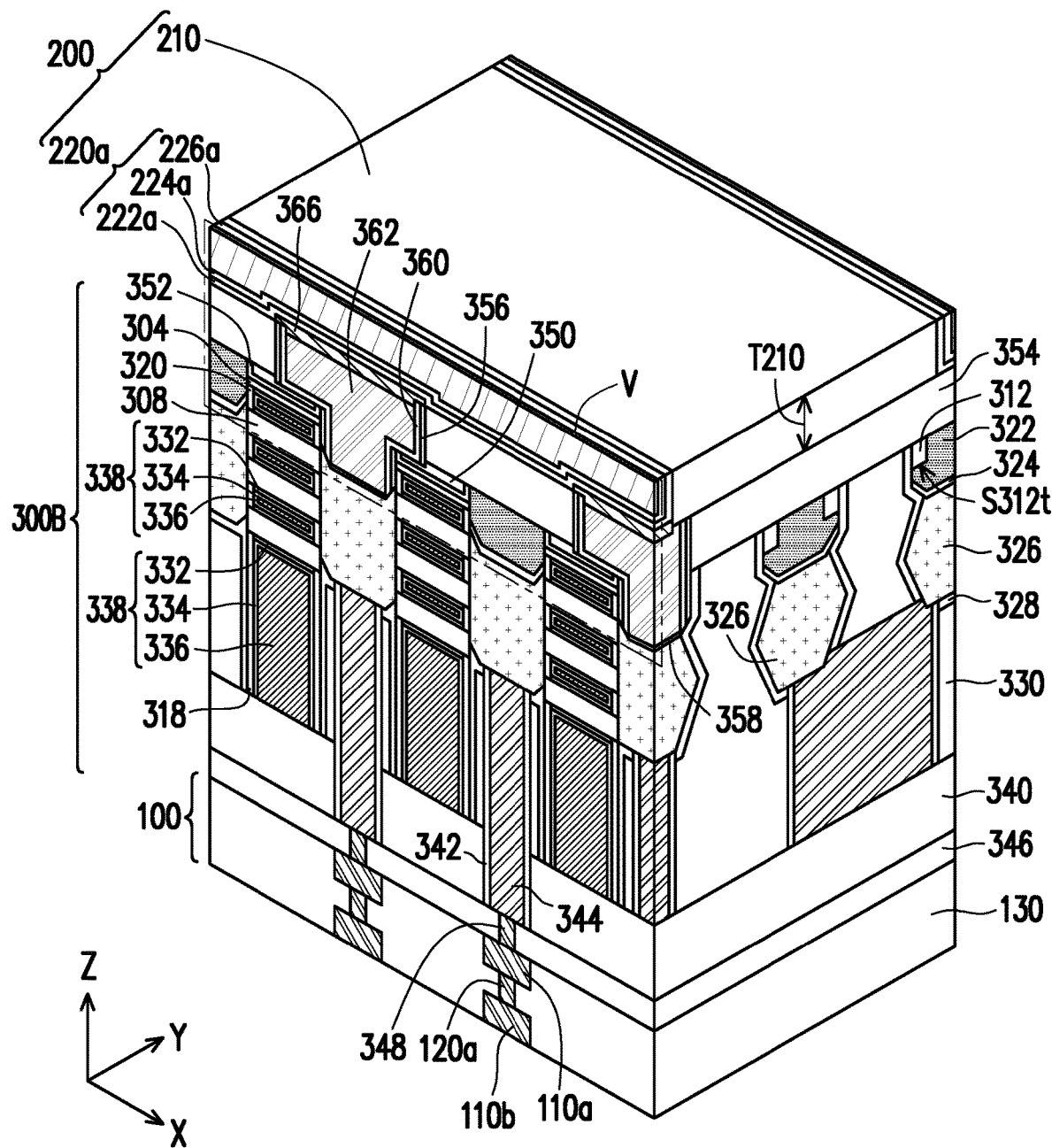
Figure 33B:
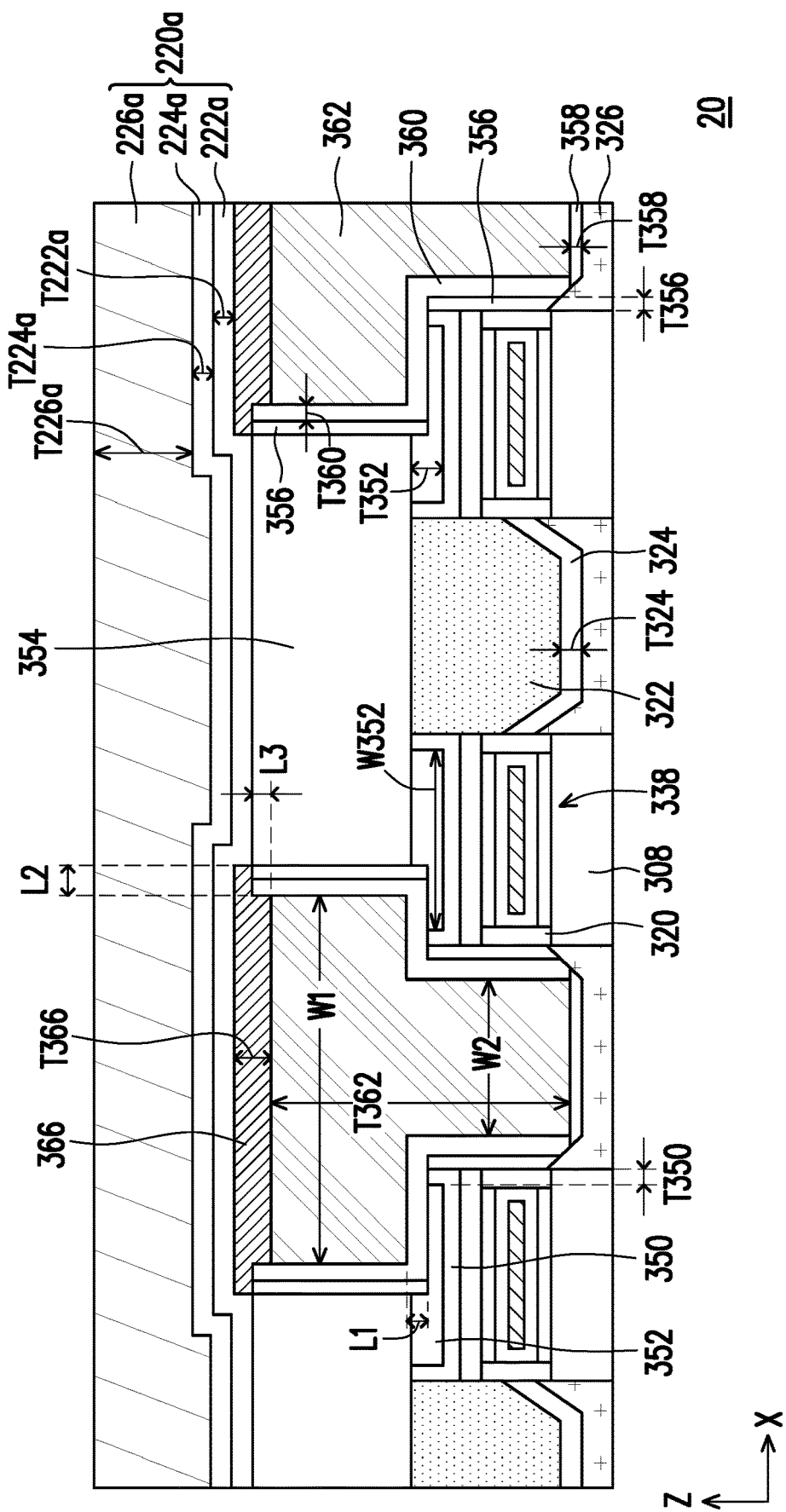
FIG. 33B is a schematic, enlarged cross-sectional view of a portion of the semiconductor device outlined in a dashed box V as shown in FIG. 33A.
Figure 34A:
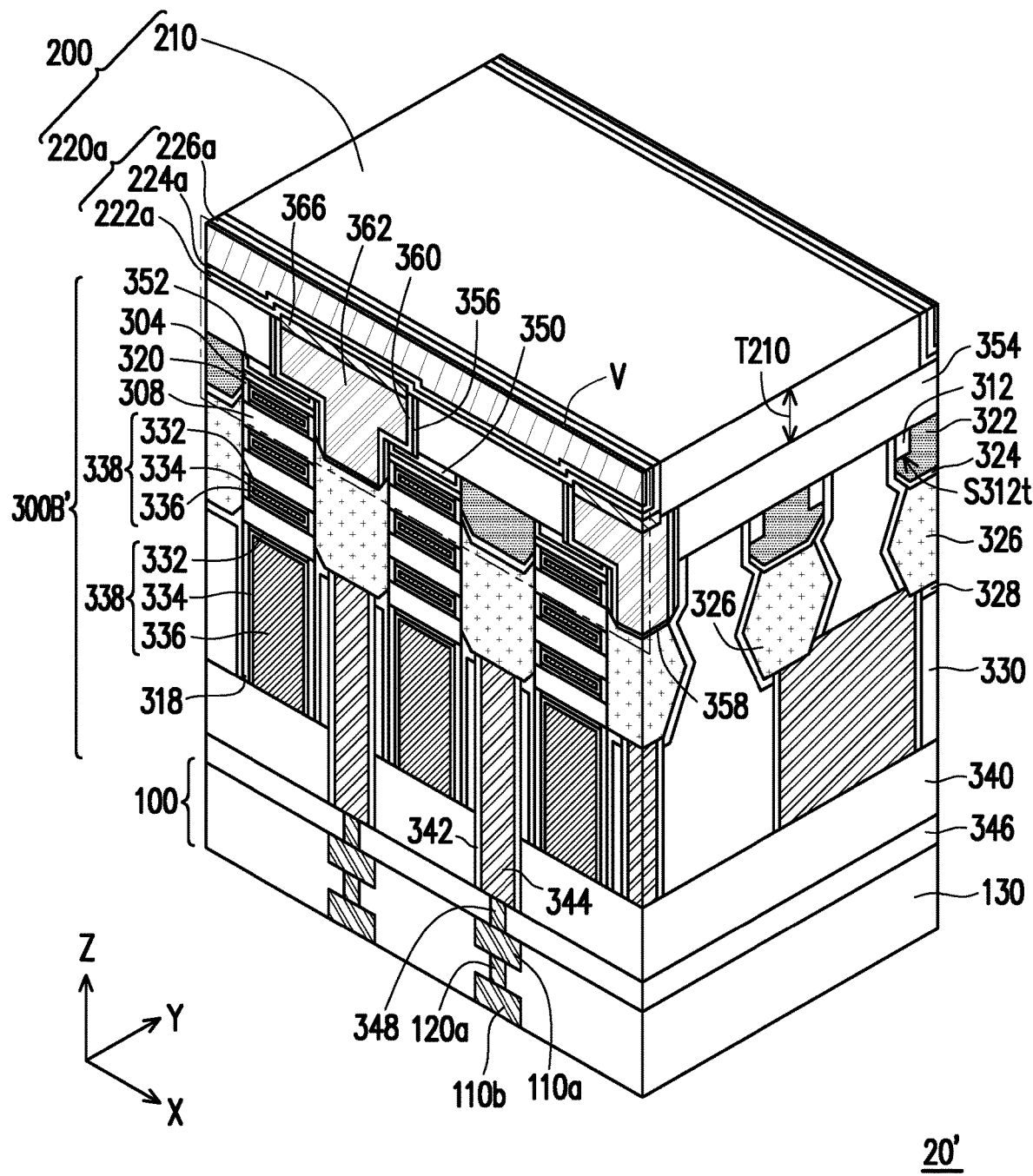
FIG. 34A is a schematic three-dimensional view of a semiconductor device in accordance with some embodiments of the disclosure.
Figure 34B:
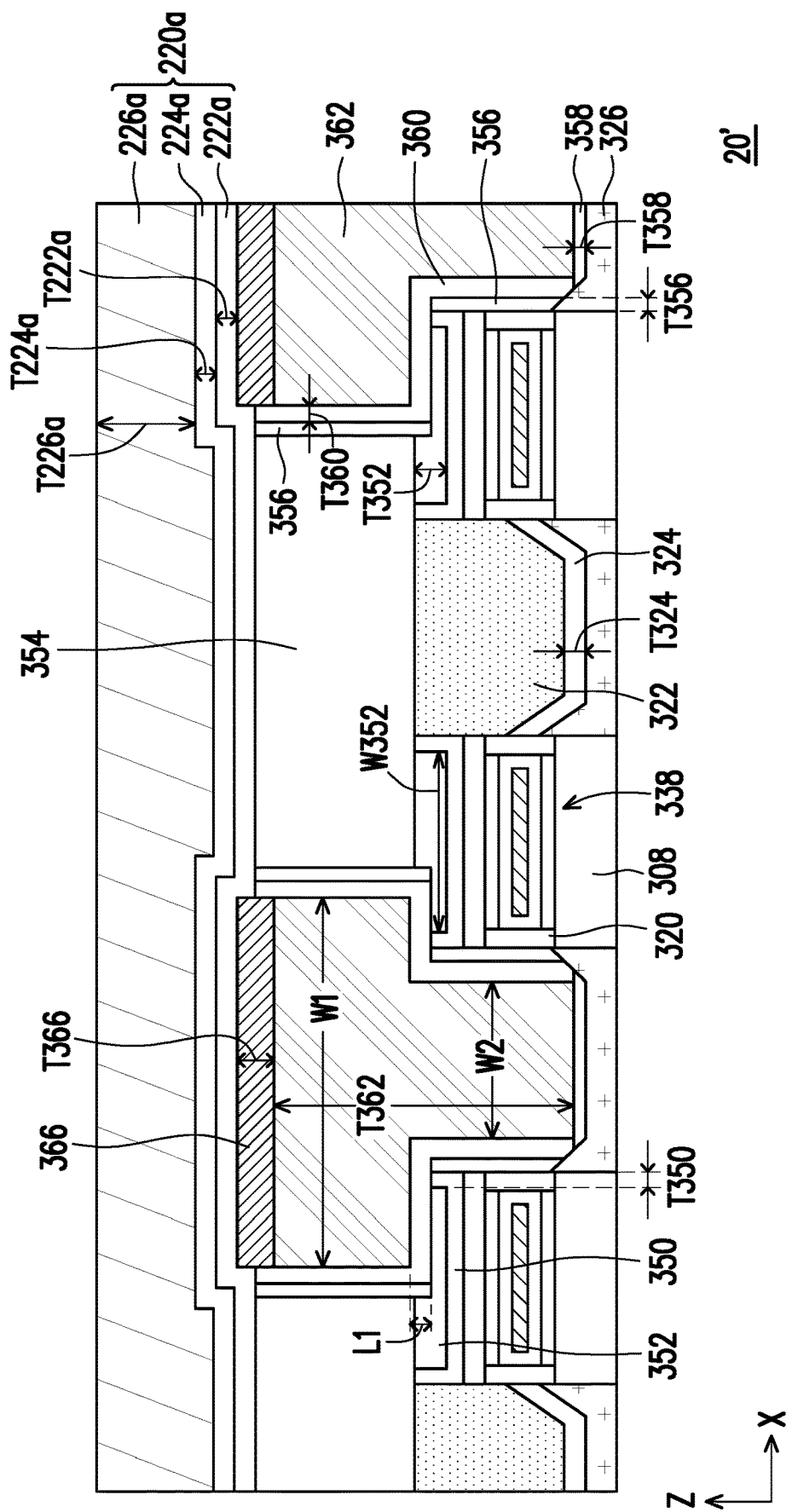
FIG. 34B is a schematic, enlarged cross-sectional view of a portion of the semiconductor device outlined in a dashed box V as shown in FIG. 34A.

FIGS. 29-32 and 33A are schematic three-dimensional views of various stages in a manufacturing method of a semiconductor device 20 in accordance with alternative embodiments of the disclosure. FIG. 33B is a schematic, enlarged cross-sectional view of a portion of the semiconductor device 20 outlined in a dashed box V as shown in FIG. 33A. FIG. 34A is a schematic three-dimensional view of a semiconductor device 20' in accordance with some embodiments of the disclosure. FIG. 34B is a schematic, enlarged cross-sectional view of a portion of the semiconductor device 20' outlined in a dashed box V as shown in FIG. 34A. The elements similar to or substantially the same as the elements described previously will use the same reference numbers, and certain details or descriptions (e.g., the materials, formation processes, positioning configurations, electrical connections, etc.) of the same elements would not be repeated herein.

Figure 29:
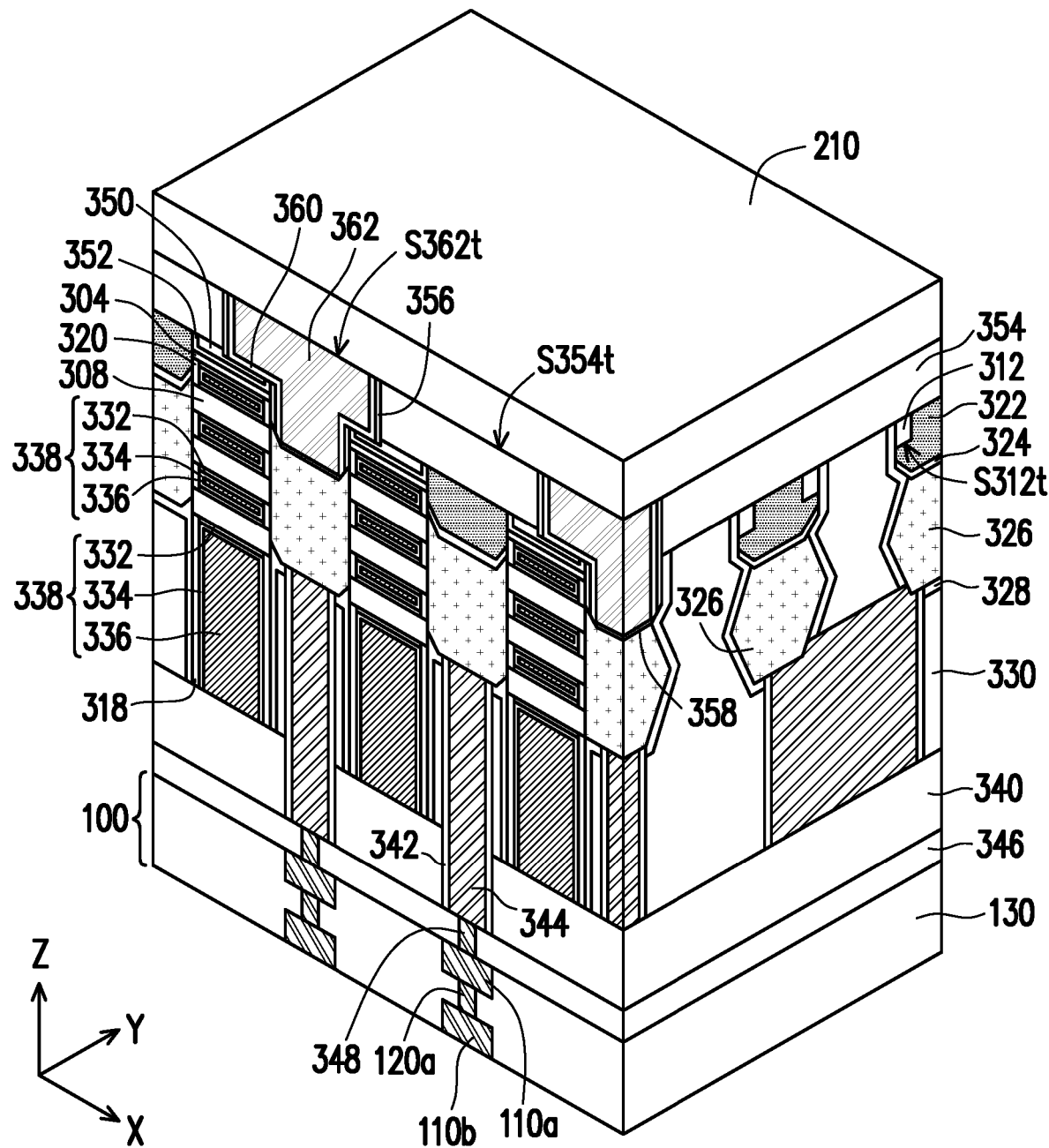
FIGS. 29-32 and 33A are schematic three-dimensional views of various stages in a manufacturing method of a semiconductor device in accordance with alternative embodiments of the disclosure.

Referring to FIG. 29, in some embodiments, a hard mask layer 210 is formed on the hard mask layer 354, the dielectric layer 360 and the contact plugs 362, following the process as described in FIG. 22. The formation and material of the hard mask layer 210 has been previously described in FIG. 24, and thus are not repeated herein. For example, an illustrated top surface of the current structure is a flat surface, as shown in FIG. 29.

Figure 30:
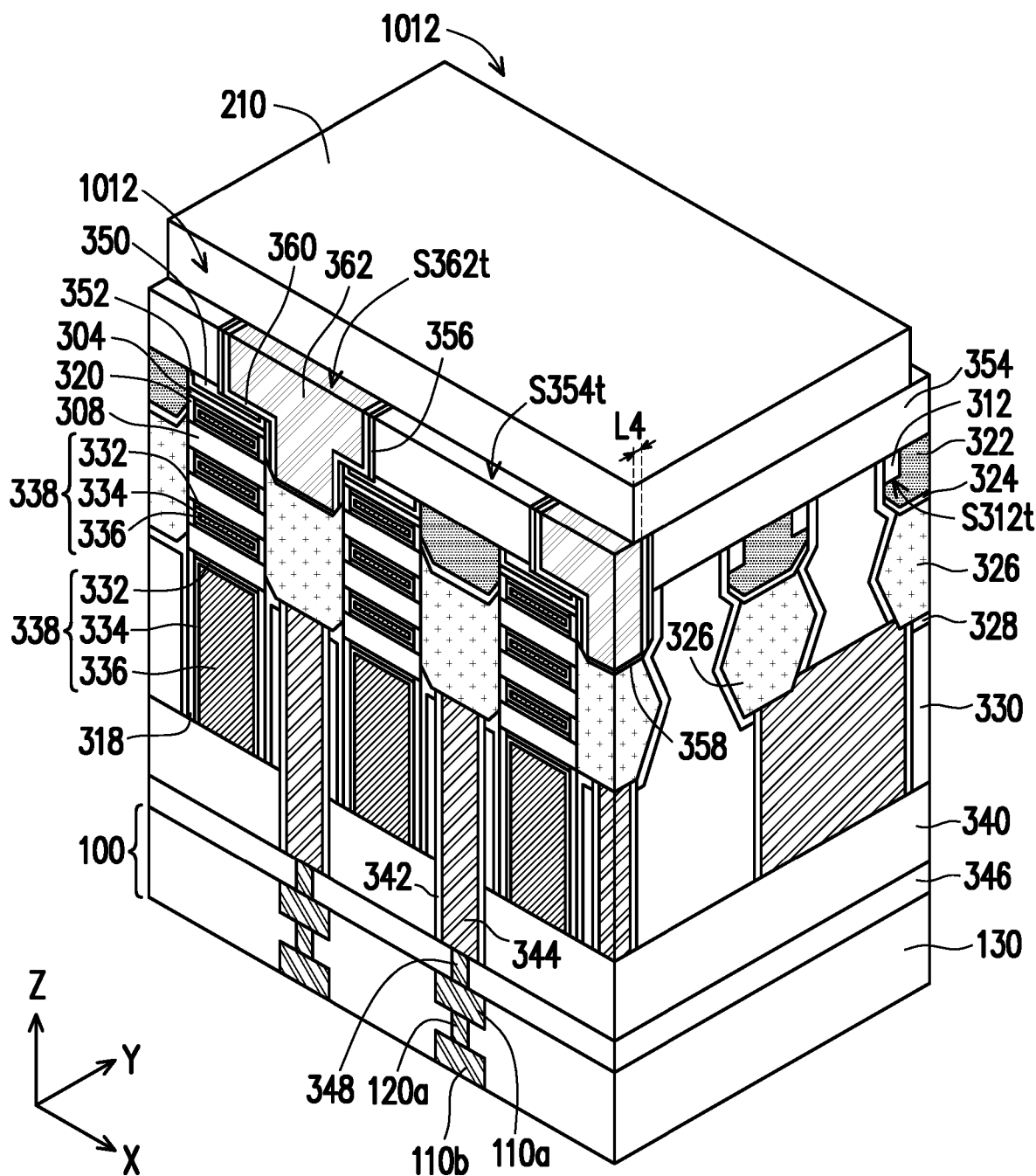

Referring to FIG. 30, in some embodiments, the hard mask layer 210 is patterned to form a plurality of openings 1012 exposing portions of the contact plugs 362 and portions of the hard mask layer 354. For example, the illustrated top surface surfaces S362 of the contact plugs 362 and the illustrated top surface S354t of the hard mask layer 354 are partially exposed by the openings 1012. The patterning may include lithography and etching process. The etching process may include a dry etching, a wet etching, a combination thereof. After the etching process, a cleaning step may be optionally performed, for example to clean and remove the residue generated from the etching process. A length (L4 in FIG. 30 and FIG. 33A) of the portion of the contact plugs 362 (covered by the hard mask layer 210) measured along the direction X may be in a range of about 2 nm to about 10 nm. Although other value of the length (L4 in FIG. 30 and FIG. 33A) of the portion of the contact plugs 362 being covered by the hard mask layer 210 is possible depending on product and process requirements.

Referring to FIG. 31, in some embodiments, capping patterns 366 are formed on the illustrated top surface S362 of the contact plugs 362 partially exposed by the openings 1012 formed in the hard mask layer 210. In some embodiments, the contact plugs 362 are partially covered by the capping patterns 366. The formation and material of the capping patterns 366 are similar to or substantially identical to the formation and material of the capping patterns 366 as described in FIG. 23, and thus are not repeated herein. A thickness (T366 in FIG. 33B) of the capping patterns 366 measured along the direction Z may be in a range of about 0.5 nm to about 4 nm. Although other value of the thickness of the capping patterns 366 is possible depending on product and process requirements. In certain case, the capping patterns 366 may further extend onto the liner layers 356 or extend onto the liner layers 356 and the hard mask layer 354. An extended length (L2 in FIG. 33B) of the capping patterns 366 measured along the direction X or Y may be in a range of about 0.2 nm to about 3 nm. Although other value of the extended length of the capping patterns 366 is possible depending on product and process requirements.

During the formation of the capping patterns 366, portions of the contact plugs 362 with the capping patterns 366 disposed thereon are consumed. For example, a consumption amount (L3 in FIG. 33B) of the capping patterns 366 measured along the direction Z may be in a range of about 0.2 nm to about 3 nm. Although other value of the consumption amount of the capping patterns 366 is possible depending on product and process requirements. In alternative embodiments, there is no contact plugs 362 being consumed during the formation of capping patterns 366; that is, the consumption amount L3 measured along the direction Z is zero. As shown in FIG. 31, the illustrated top surfaces of the capping patterns 366 are above the illustrate top surface S354 of the hard mask layer 354, for example. The capping patterns 366 may be referred to as a nitride capping layer, nitride patterns, or nitride capping patterns. Up to here, a device structure 300B is manufacture, where the device structure 300B is disposed over and electrically coupled to the interconnection structure 100.

However, the disclosure is not limited thereto. In alternative embodiments, the extended length L2 of the capping patterns 366 measured along the direction X or Y may be zero. In other words, the capping patterns 366 do not further extend onto the liner layers 356 or extend onto the liner layers 356 and the hard mask layer 354, see a device structure 300B' of a semiconductor device 20' depicted in FIG. 34A and FIG. 34B.

Referring to FIG. 32, in some embodiments, a first barrier material 222m, a second barrier material 224m, and a conductive material 226m are sequentially formed over the structure depicted in FIG. 31. The formation and material of each of the first barrier material 222m, the second barrier material 224m, and the conductive material 226m have been previously described in FIG. 26, and thus are not repeated herein.

Referring to FIG. 33A and FIG. 33B, in some embodiments, a planarization process is performed to remove portions of the first barrier material 222m, the second barrier material 224m and the conductive material 226m above the openings 1012 to form first barrier layers 222a, second barrier layers 224a, and conductive contacts 226a in the openings 1012 formed in the hard mask layer 210. Up to here, an interconnection structure 200 is manufactured. The details of the interconnection structure 200 including the hard mask layer 210 and a conductive layer 220a (including the first barrier layers 222a, the second barrier layers 224a, and the conductive contacts 226a) laterally covered by the hard mask layer 210 has been described in FIG. 27A and FIG. 27B, and thus are not repeated herein, for brevity.

After the formation of the interconnection structure 200, the semiconductor device 20 is manufactured, where the semiconductor device 20 includes the interconnection structure 100, the interconnection structure 200, and the device structure 300B, and the interconnection structure 100 is disposed on the front side of the device structure 300B and the interconnection structure 200 is disposed on the back side of the device structure 300B. In some embodiments, the interconnection structure 100 is electrically coupled to the transistor 302 and other devices formed in the device structure 300B for providing routing functions thereto, and the interconnection structure 200 is electrically coupled to the transistor 302 and other devices formed in the device structure 300B for providing routing functions thereto. Owing to the capping patterns 366 disposed between the contact plugs 362 of the device structure 300B and the conductive layer 220a of the interconnection structure 200, the metal diffusion between the contact plugs 362 of the device structure 300B and the conductive layer 220a of the interconnection structure 200 (e.g., a miscible phenomenon between Ru and Co or between Mo and W) can be greatly mitigate or greatly suppress, thereby improving the reliability of the semiconductor device 20. Due to the metal diffusion between the contact plugs 362 of the device structure 300B and the conductive layer 220a of the interconnection structure 200 can be prevented by the capping patterns 366, a great, various selection in the material of forming the contact plugs 362 is promised.

In accordance with some embodiments, a semiconductor device includes two source/drain features, a gate structure, a first contact plug, a second contact plug, a conductive line, and a nitride capping layer. The two source/drain features are laterally arranged to each other. The one or more channel layers connects the two source/drain features. The gate structure engages the one or more channel layers and interposes the two source/drain features. The first contact plug extends from above a first source/drain feature of the two source/drain features to the first source/drain feature. The second contact plug extends from below a second source/drain feature of the two source/drain features to the second source/drain feature. The conductive line is disposed underneath the second contact plug and electrically coupled to the second contact plug. The nitride capping layer is disposed between the second contact plug and the conductive line.

In accordance with some embodiments, a semiconductor device includes a device structure, a first interconnection structure, and a second interconnection structure. The device structure has a front side and a rear side opposite to the front side, where the device structure includes at least one transistor, a first contact connected to the at least one transistor and exposed by the front side, a second contact connected to the at least one transistor and exposed by the rear side, and a capping layer disposed on the rear side and covering the second contact exposed by the rear side. The first interconnection structure is disposed on the front side of the device structure and includes a first conductive feature electrically coupled to the at least one transistor through the first contact. The second interconnection structure is disposed on the rear side of the device structure and includes a second conductive feature electrically coupled to the at least one transistor through the second contact, where the capping layer is interposed between the second contact and the second conductive feature.

In accordance with some embodiments, a method of method of manufacturing a semiconductor device includes the following steps: providing a device structure with a front side and a rear side opposite to the front side, the device structure comprising at least one transistor, a first contact connected to the at least one transistor and exposed by the front side, a second contact connected to the at least one transistor and exposed by the rear side, and a capping layer disposed on the rear side and covering the second contact exposed by the rear side; disposing a first interconnection structure on the front side of the device structure, the first interconnection structure comprising a first conductive feature electrically coupled to the at least one transistor through the first contact; and disposing a second interconnection structure on the rear side of the device structure, the second interconnection structure comprising a second conductive feature electrically coupled to the at least one transistor through the second contact, where the capping layer is interposed between the second contact and the second conductive feature.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
   two source/drain features, laterally arranged to each other;
   one or more channel layers, connecting the two source/drain features;
   a gate structure, engaging the one or more channel layers and interposing the two source/drain features;
   a first contact plug, extending from above a first source/drain feature of the two source/drain features to the first source/drain feature;
   a second contact plug, extending from below a second source/drain feature of the two source/drain features to the second source/drain feature;
   a conductive line, disposed underneath the second contact plug and electrically coupled to the second contact plug; and
   a nitride capping layer, disposed between the second contact plug and the conductive line, wherein sidewalls of the conductive line are free of the nitride capping layer.

2. The semiconductor device of claim 1, wherein each of the source/drain features comprises a first source/drain region and a second source/drain region disposed on the first source/drain region, wherein the first source/drain region is overlapped with the second contact plug in a direction perpendicular to a stacking direction of the first source/drain region and the second source/drain region, wherein the one or more channel layers and the gate structure are overlapped in the stacking direction.

3. The semiconductor device of claim 1, wherein the second contact plug has a first portion and a second portion disposed on and connected to the first portion, and a first lateral size of the first portion is less than a second lateral size of the second portion, wherein the first portion is between the second portion and the second source/drain feature.

4. The semiconductor device of claim 1, wherein a surface of the second contact plug disposed with the conductive line is partially exposed by the nitride capping layer.

5. The semiconductor device of claim 1, wherein a surface of the second contact plug disposed with the conductive line is entirely covered by the nitride capping layer.

6. The semiconductor device of claim 1, wherein a material of the nitride capping layer comprises tungsten nitride, ruthenium nitride, cobalt nitride, molybdenum nitride, titanium nitride, tantalum nitride, or a combination of thereof.

7. The semiconductor device of claim 1, further comprising:
   a dielectric layer, laterally covering the second contact plug, wherein the nitride capping layer further extends onto a surface of the dielectric layer.

8. The semiconductor device of claim 1, wherein the nitride capping layer further extends into a portion of the second contact plug by a non-zero distance.

9. A semiconductor device, comprising:
   a device structure, having a front side and a rear side opposite to the front side, wherein the device structure comprises at least one transistor, a first contact connected to the at least one transistor and exposed by the front side, a second contact connected to the at least one transistor and exposed by the rear side, and a capping layer disposed on the rear side and covering the second contact exposed by the rear side;
   a first interconnection structure, disposed on the front side of the device structure and comprising a first conductive feature electrically coupled to the at least one transistor through the first contact; and
   a second interconnection structure, disposed on the rear side of the device structure and comprising a second conductive feature electrically coupled to the at least one transistor through the second contact, wherein the capping layer is interposed between the second contact and the second conductive feature, and sidewalls of the second conductive feature are free of the capping layer.

10. The semiconductor device of claim 9, wherein the at least one transistor comprises a finFET transistor, a GAA transistor, or a nanowire transistor.

11. The semiconductor device of claim 9, wherein a surface of the second contact disposed with the second conductive feature is partially exposed by the capping layer.

12. The semiconductor device of claim 9, wherein a surface of the second contact disposed with the second conductive feature is entirely covered by the capping layer.

13. The semiconductor device of claim 9, wherein a material of the capping layer comprises tungsten nitride, ruthenium nitride, cobalt nitride, molybdenum nitride, titanium nitride, tantalum nitride, or a combination of thereof.

14. The semiconductor device of claim 9, wherein a size of the capping layer is greater than a size of the second contact along a direction perpendicular to a stacking direction of the device structure, the first interconnection structure, and the second interconnection structure.

15. A method of manufacturing a semiconductor device, comprising:
- providing a device structure with a front side and a rear side opposite to the front side, the device structure comprising at least one transistor, a first contact connected to the at least one transistor and exposed by the front side, a second contact connected to the at least one transistor and exposed by the rear side, and a capping layer disposed on the rear side and covering the second contact exposed by the rear side;
- disposing a first interconnection structure on the front side of the device structure, the first interconnection structure comprising a first conductive feature electrically coupled to the at least one transistor through the first contact; and
- disposing a second interconnection structure on the rear side of the device structure, the second interconnection structure comprising a second conductive feature electrically coupled to the at least one transistor through the second contact, wherein the capping layer is interposed between the second contact and the second conductive feature, and sidewalls of the second conductive feature are free of the capping layer.

16. The method of claim 15, wherein the capping layer is formed by a nitridation treatment, wherein:
- the nitridation treatment is performed by a thermal process, or
- the nitridation treatment is performed by an implantation process.

17. The method of claim 15, wherein the capping layer is formed by tungsten nitride, ruthenium nitride, cobalt nitride, molybdenum nitride, titanium nitride, tantalum nitride, or a combination of thereof.

18. The method of claim 15, wherein the capping layer is formed to have a size greater than a size of the second contact in a direction perpendicular to a stacking direction of the first interconnection structure, the device structure, and the second interconnection structure.

19. The method of claim 15, wherein the capping layer is formed to completely cover the second contact by the rear side.

20. The method of claim 15, wherein the capping layer is formed to partially expose the second contact exposed by the rear side.

* * * * *